United States Patent
Chen et al.

(10) Patent No.: US 12,178,130 B2
(45) Date of Patent: Dec. 24, 2024

(54) FLEXIBLE THERMOELECTRIC DEVICES

(71) Applicant: The Regents of the University of California, Oakland, CA (US)

(72) Inventors: Renkun Chen, San Diego, CA (US); Sahngki Hong, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 17/295,851

(22) PCT Filed: Nov. 20, 2019

(86) PCT No.: PCT/US2019/062475
§ 371 (c)(1),
(2) Date: May 20, 2021

(87) PCT Pub. No.: WO2020/106883
PCT Pub. Date: May 28, 2020

(65) Prior Publication Data
US 2022/0013704 A1    Jan. 13, 2022

Related U.S. Application Data

(60) Provisional application No. 62/770,123, filed on Nov. 20, 2018.

(51) Int. Cl.
*H10N 10/17* (2023.01)
*A41D 31/04* (2019.01)
(Continued)

(52) U.S. Cl.
CPC ............ *H10N 10/17* (2023.02); *A41D 31/04* (2019.02); *H10N 10/01* (2023.02); *H10N 10/13* (2023.02)

(58) Field of Classification Search
None
See application file for complete search history.

(56) References Cited

U.S. PATENT DOCUMENTS

| | | | | |
|---|---|---|---|---|
| 5,318,743 A | * | 6/1994 | Tokiai | C22C 1/04 419/33 |
| 6,097,088 A | * | 8/2000 | Sakuragi | C30B 11/00 257/467 |

(Continued)

FOREIGN PATENT DOCUMENTS

WO    2017143305 A1    8/2017

OTHER PUBLICATIONS

ISA, International Search Report and Written Opinion for PCT Application No. PCT/US2019/062475. Mail Date: Feb. 6, 2020. 14 pages.

(Continued)

*Primary Examiner* — Daniel P Malley, Jr.
(74) *Attorney, Agent, or Firm* — Perkins Coie LLP

(57) ABSTRACT

Thermoelectric devices (TE) devices may be used to power wearable electronics, such as watches and sensors by harvesting heat from the body. These TE devices may fully power or partially power the wearable devices to extend a usage time, or to recharge a battery. In other example embodiments, TE devices can be used to provide heating and/or cooling. The TE devices can be integrated into garments such as clothes, vests, and armbands for outdoor and indoor environments. For outdoor environments, applications include, but are not limited to, sports such as golfing, bicycling, running, walking, training, soccer, hiking, and other outdoor activities related to occupations, such as construction, fire-fighting, military operations, law enforcement, farming, underground mining, and so on. In other example embodiments, TE devices can be used to provide (Continued)

thermal camouflaging for people and objects so as to not be seen by thermal imaging devices.

22 Claims, 62 Drawing Sheets

(51) Int. Cl.
*H10N 10/01* (2023.01)
*H10N 10/13* (2023.01)

(56) References Cited

U.S. PATENT DOCUMENTS

| | | | |
|---|---|---|---|
| 6,739,138 B2 | 5/2004 | Saunders et al. | |
| 2013/0192654 A1* | 8/2013 | Shin | H10N 10/10 977/773 |
| 2014/0373888 A1 | 12/2014 | Boukai et al. | |
| 2016/0351771 A1 | 12/2016 | Schneider et al. | |
| 2018/0049914 A1 | 2/2018 | Stewart | |
| 2018/0233648 A1 | 8/2018 | Cho et al. | |
| 2019/0148617 A1* | 5/2019 | Yi | H01L 23/373 136/205 |
| 2019/0326500 A1* | 10/2019 | Kasichainula | H01L 35/08 |
| 2020/0136005 A1* | 4/2020 | Sun | H01L 35/32 |
| 2020/0279988 A1* | 9/2020 | Furukawa | H01L 35/08 |

OTHER PUBLICATIONS

Bahk, J.-H., et al. Flexible thermoelectric materials and device optimization for wearable energy harvesting. J. Mater. Chem. C 3, 10362-10374 (2015).
Bryant, T. et al. Medium Term Energy Efficiency Market Report 2015. (International Energy Agency, 3 Paris, 2015). 250 pages.
Canlin Ou, A. L. S., et al. Enhanced thermoelectric properties of flexible aerosol-jet printed carbon nanotube-based nanocomposites. APL Mater. 6, 096101 (2018). 9 pages.
Chen, A., et al. Dispenser-printed planar thick-film thermoelectric energy generators. J. Micromech. Microeng. 21, 104006 (2011). 9 pages.
Choi, J. et al. Flexible and Robust Thermoelectric Generators Based on All-Carbon Nanotube Yarn without Metal Electrodes. ACS Nano 11, 7608-7614 (2017).
Chu, S. et al. Opportunities and challenges for a sustainable energy future. Nature 488, 294-303 (2012).
Conti, J. J. Annual energy outlook 2015 with projections to 2040. (U.S. Energy Information Administration, Washington, 2015). 154 pages.
De Dear, R. J., et al. Developing an adaptive model of thermal comfort and preference. ASHRAE transactions 104, 19 pages (1998).
Du, Y. et al. Thermoelectric fabrics: toward power generating clothing. Sci. Rep. 5, 6411 (2015). 6 pages.
Dun, C. et al. Flexible thermoelectric fabrics based on self-assembled tellurium nanorods with a large power factor. Phys. Chem. Chem. Phys. 17, 8591-8595 (2015).
Eom, Y., et al. Flexible thermoelectric power generation system based on rigid inorganic bulk materials. Appl. Energy 206, 649-656 (2017).
Farrington, R. et al. Impact of Vehicle Air-Conditioning on Fuel Economy, Tailpipe Emissions, and Electric Vehicle Range. NREL/CP-540-28960 (2000). 12 pages.
Goldstein, E. A., et al. Sub-ambient non-evaporative fluid cooling with the sky. Nat. Energy 2, 17143 (2017). 7 pages.
Henning, H.-M. Solar assisted air conditioning of buildings—an overview. Appl. Therm. Eng. 27, 1734-1749 (2007).
Hsu, P. C. et al. A dual-mode textile for human body radiative heating and cooling. Sci. Adv. 3, e1700895 (2017). 9 pages.
Hsu, P. C. et al. Personal Thermal Management by Metallic Nanowire-Coated Textile. Nano Lett. 15, 365-371 (2015).

Hsu, P. C. et al. Radiative human body cooling by nanoporous polyethylene textile. Science 353, 1019-1023 (2016).
Hyland, M., et al. Wearable thermoelectric generators for human body heat harvesting. Appl. Energy 182, 518-524 (2016).
Im, H. et al. Flexible thermocells for utilization of body heat. Nano Res. 7, 443-452 (2014).
Isaac, M. et al. Modeling global residential sector energy demand for heating and air conditioning in the context of climate change. Energ Policy 37, 507-521 (2009).
Ito, M., et al. From materials to device design of a thermoelectric fabric for wearable energy harvesters. J. Mater. Chem. A 5, 12068-12072 (2017).
Jeong, S. H. et al. Stretchable thermoelectric generators metallized with liquid alloy. ACS Appl. Mater. Interfaces 9, 15791-15797 (2017).
Jo, S., et al. Flexible thermoelectric generator for human body heat energy harvesting. Electronics Letters, Aug. 2012; vol. 48, No. 16. 3 pages.
Kambly, K. R. et al. Estimating the HVAC energy consumption of plug-in electric vehicles. J. Power Sources 259, 117-124 (2014).
Kelso, J. D. 2011 Buildings Energy Data Book. (U.S. Department of Energy, Washington, 2012). 286 pages.
Kim, M. K., et al. Wearable thermoelectric generator for harvesting human body heat energy. Smart Mater. Struct. 23 (2014). 8 pages.
Kim, S. J. et al. High-Performance Flexible Thermoelectric Power Generator Using Laser Multiscanning Lift-Off Process. ACS Nano 10, 10851-10857 (2016).
Kim, C. S. et al. Self-Powered Wearable Electrocardiograma ing a Wearable Thermoelectric Power Generator. ACS Energy Lett. 3, 501-507 (2018).
Kim, S. J., et al. A wearable thermoelectric generator fabricated on a glass fabric. Energy Environ. Sci. 7, 1959-1965 (2014).
Li, T. et al. Thermoelectric properties and performance of flexible reduced graphene oxide films up to 3,000 K. Nat. Energy 3, 148-156 (2018).
Liu, H., et al. Design of a wearable thermoelectric generator for harvesting human body energy. Wearable Sensors and Robots, 55-66 (2017).
Liu, J., et al. Giant magnetocaloric effect driven by structural transitions. Nat. Mater. 11, 620-626 (2012).
Lu, Z., et al. Silk fabric-based wearable thermoelectric generator for energy harvesting from the human body. Appl. Energy 164, 57-63 (2016).
Ma, R. J. et al. Highly efficient electrocaloric cooling with electrostatic actuation. Science 357, 1130-1134 (2017).
Martin, L. W. et al. Thin-film ferroelectric materials and their applications. Nat. Rev. Mater. 2, 16087 (2017).
Mokhtari Yazdi, M. et al. Personal cooling garments: a review. J. Text. I. 105, 1231-27 1250 (2014).
Moya, X., et al. Caloric materials near ferroic phase transitions. Nat. Mater. 13, 439-450 (2014).
Oh, J. Y. et al. Chemically exfoliated transition metal dichalcogenide nanosheet-based wearable thermoelectric generators. Energy Environ. Sci. 9, 1696-1705 (2016).
Park, H. et al. Mat-like flexible thermoelectric system based on rigid inorganic bulk materials. J. Phys. D: Appl. Phys. 50, 494006 (2017).
Park, S. H. et al. High-performance shape-engineerable thermoelectric painting. Nat. Commun. 7, 13403 (2016).
Pérez-Lombard, L., et al. A review on buildings energy consumption information. Energ. Buildings 40, 394-398 (2008).
Shi, Y., et al. Design and Fabrication of Wearable Thermoelectric Generator Device for Heat Harvesting. J. Robot. Autom. 3, 373-378 (2018).
Shin, S. et al. High-Performance Screen-Printed Thermoelectric Films on Fabrics. Sci. Rep. 7, 7317 (2017). 9 pages.
Snyder, G. J. et al. Complex thermoelectric materials. Nat. Mater. 7, 105-114 (2008).
Suarez, F. et al. Flexible thermoelectric generator using bulk legs and liquid metal interconnects for wearable electronics. Appl. Energy 202, 736-745 (2017).
Suarez, F., et al. Designing thermoelectric generators for self-powered wearable electronics. Energy Environ. Sci. 9, 2099-2113 (2016).

(56) References Cited

OTHER PUBLICATIONS

Suemori, K., et al. Flexible and lightweight thermoelectric generators composed of carbon nanotube-polystyrene composites printed on film substrate. Appl. Phys. Lett. 103, 153902 (2013). 5 pages.

Tegus, O., et al. Transition-metal-based magnetic refrigerants for room-temperature applications. Nature 415, 150-152 (2002).

Wan, C. et al. Ultrahigh thermoelectric power factor in flexible hybrid inorganic-organic superlattice. Nat. Commun. 8, 1024 (2017).

Wang, L. et al. Exceptional thermoelectric properties of flexible organic-inorganic hybrids with monodispersed and periodic nanophase. Nat. Commun. 9, 3817 (2018).

We, J. H., et al. Hybrid composite of screen-printed inorganic thermoelectric film and organic conducting polymer for flexible thermoelectric power generator. Energy 73, 506-512 (2014).

Wu, Q. et al. A novel design for a wearable thermoelectric generator based on 3D fabric structure. Smart Mater. Struct. 26, 045037 (2017).

Zhang, T. et al. High-performance, flexible, and ultralong crystalline 1 thermoelectric fibers. Nano Energy 41, 35-42 (2017).

Zhang, H. et al. $Bi_{1-x}Sb_x$ Alloy Nanocrystals: Colloidal Synthesis, Charge Transport, and Thermoelectric Properties. ACS Nano 7, 10296-10306 (2013).

Zhao, D. et al. A review of thermoelectric cooling: materials, modeling and applications. Appl. Therm. Eng. 66, 15-24 (2014).

Zhou, W. et al. High-performance and compact-designed flexible thermoelectric modules enabled by a reticulate carbon nanotube architecture. Nat. Commun. 8, 14886 (2017).

\* cited by examiner

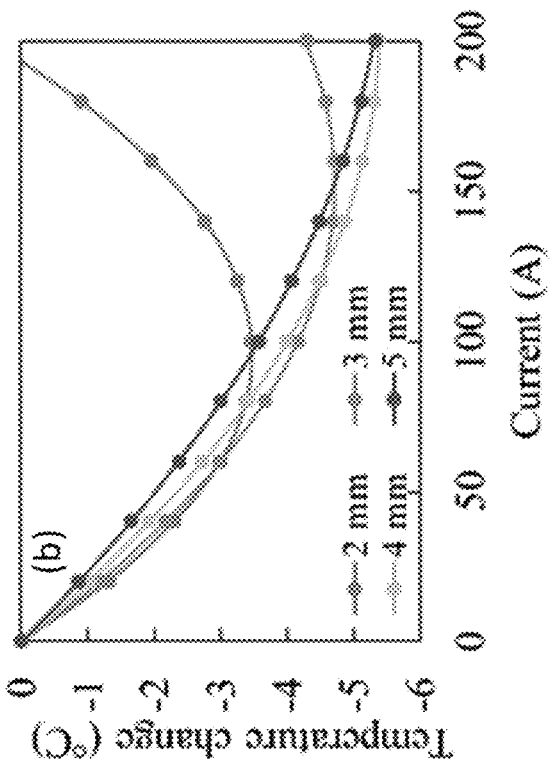
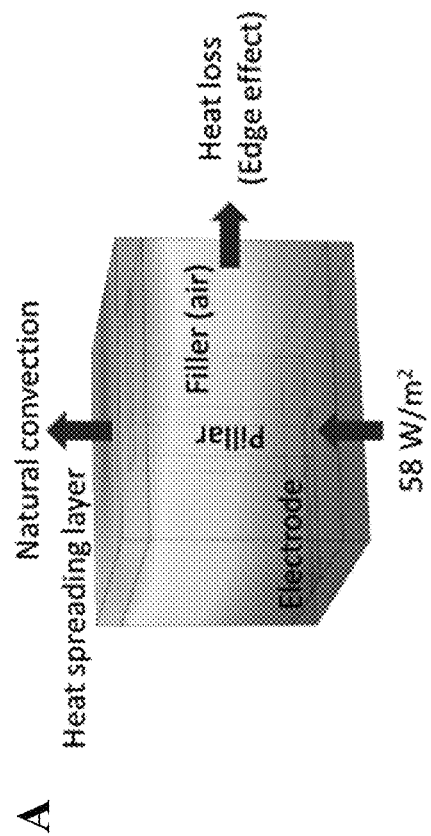
FIG. 5A-B

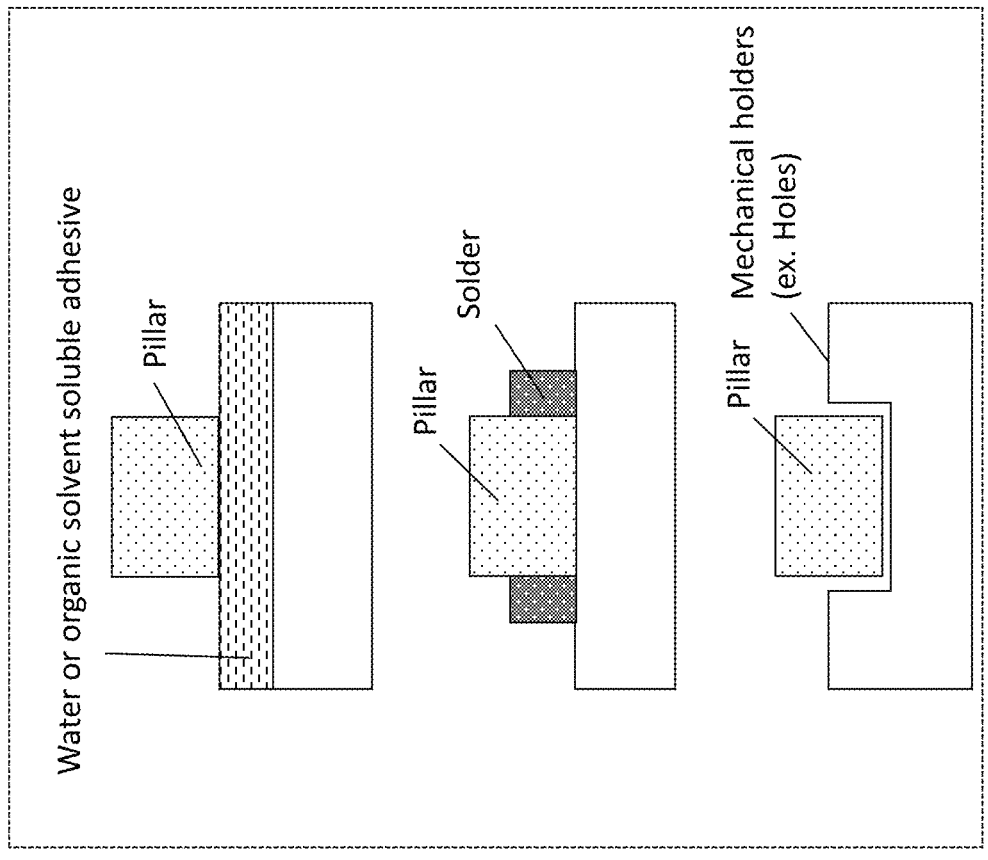
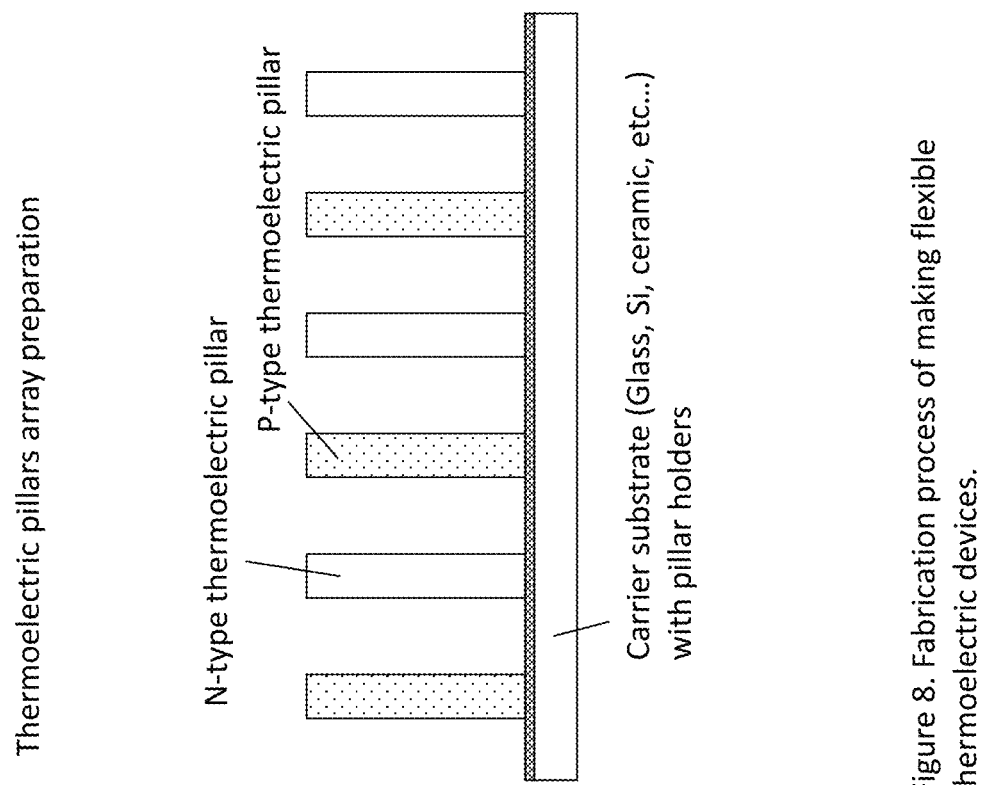
Figure 8. Fabrication process of making flexible thermoelectric devices.
FIG. 9A

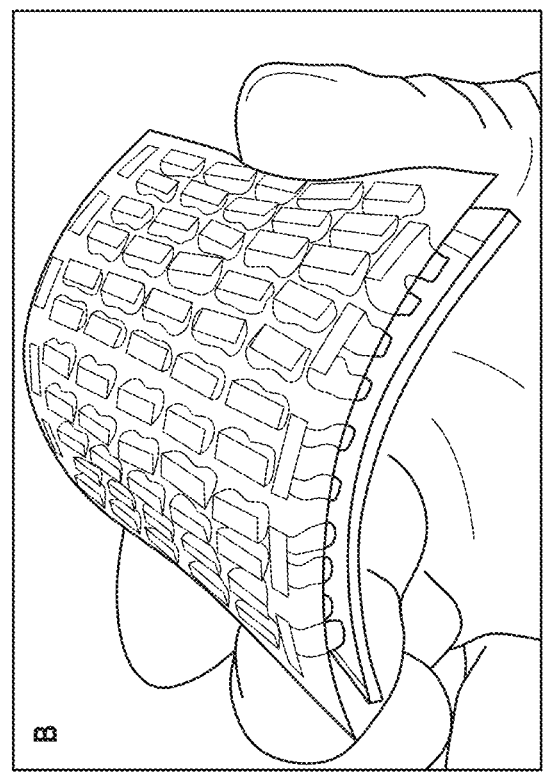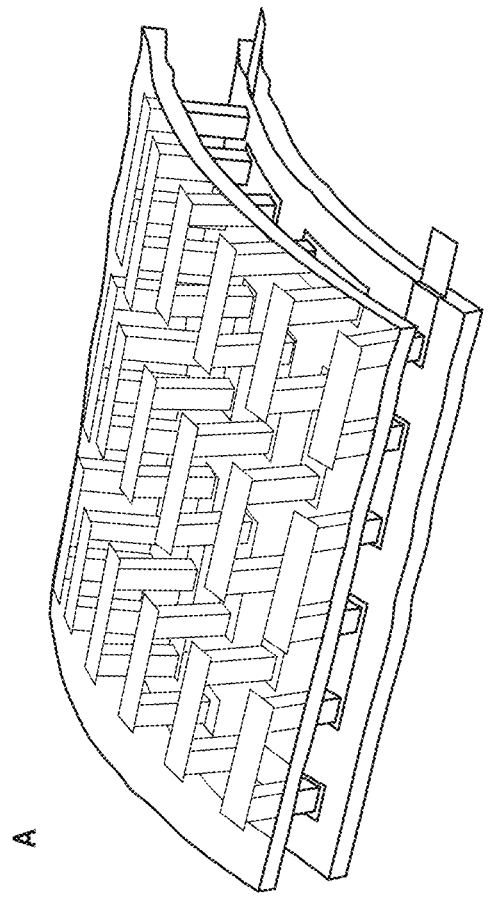
*FIG. 12A-B*

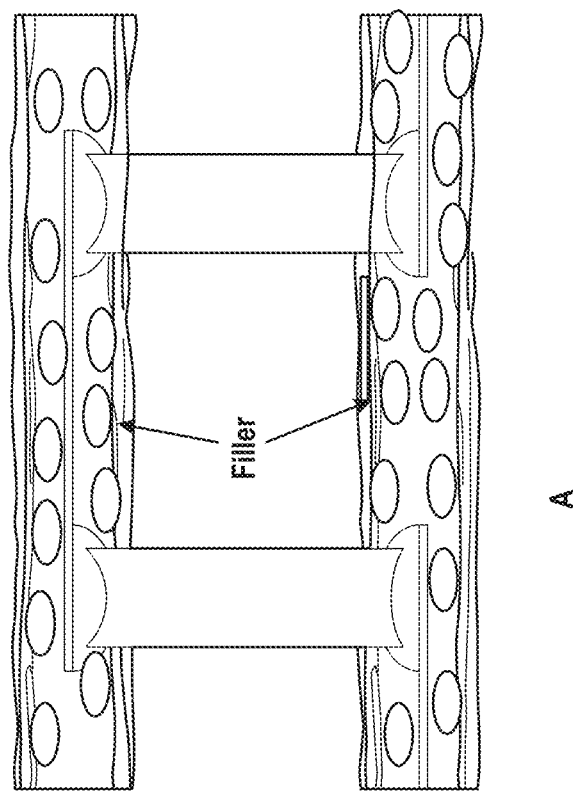
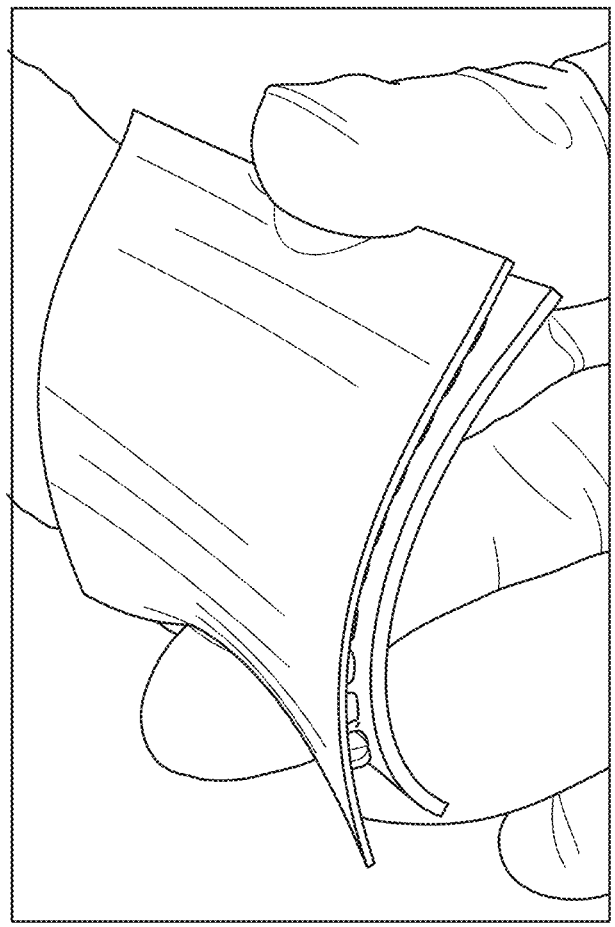
*FIG. 134-B*

FIG. 15A-B

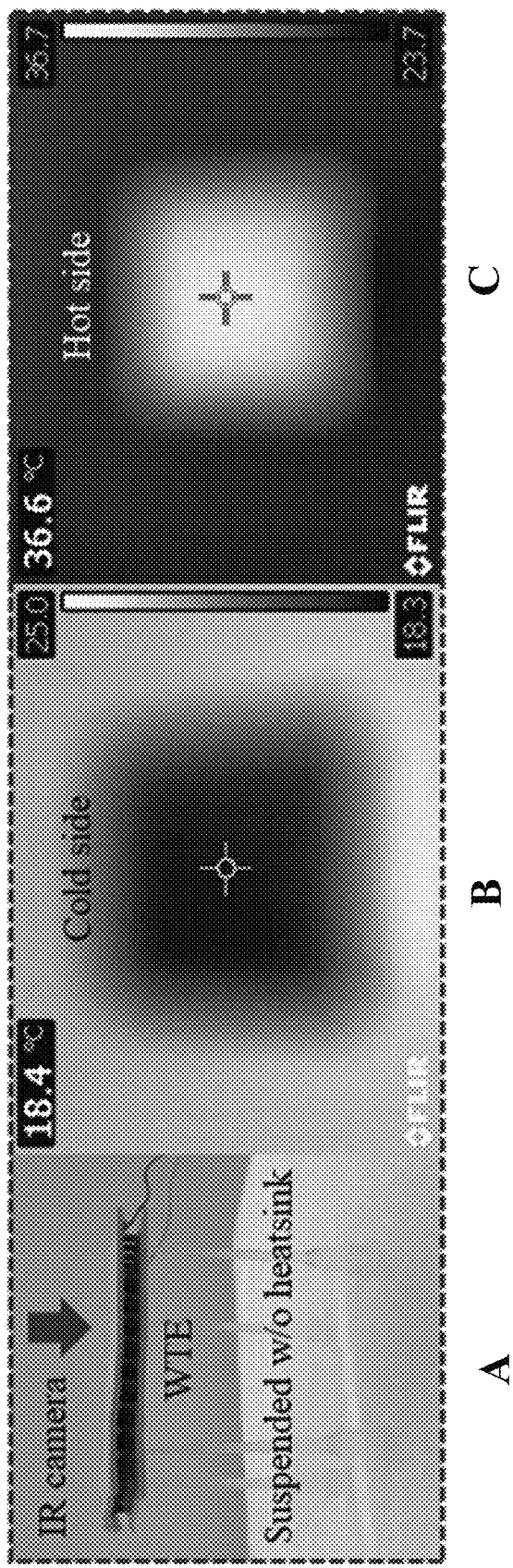
FIG. 18A-C

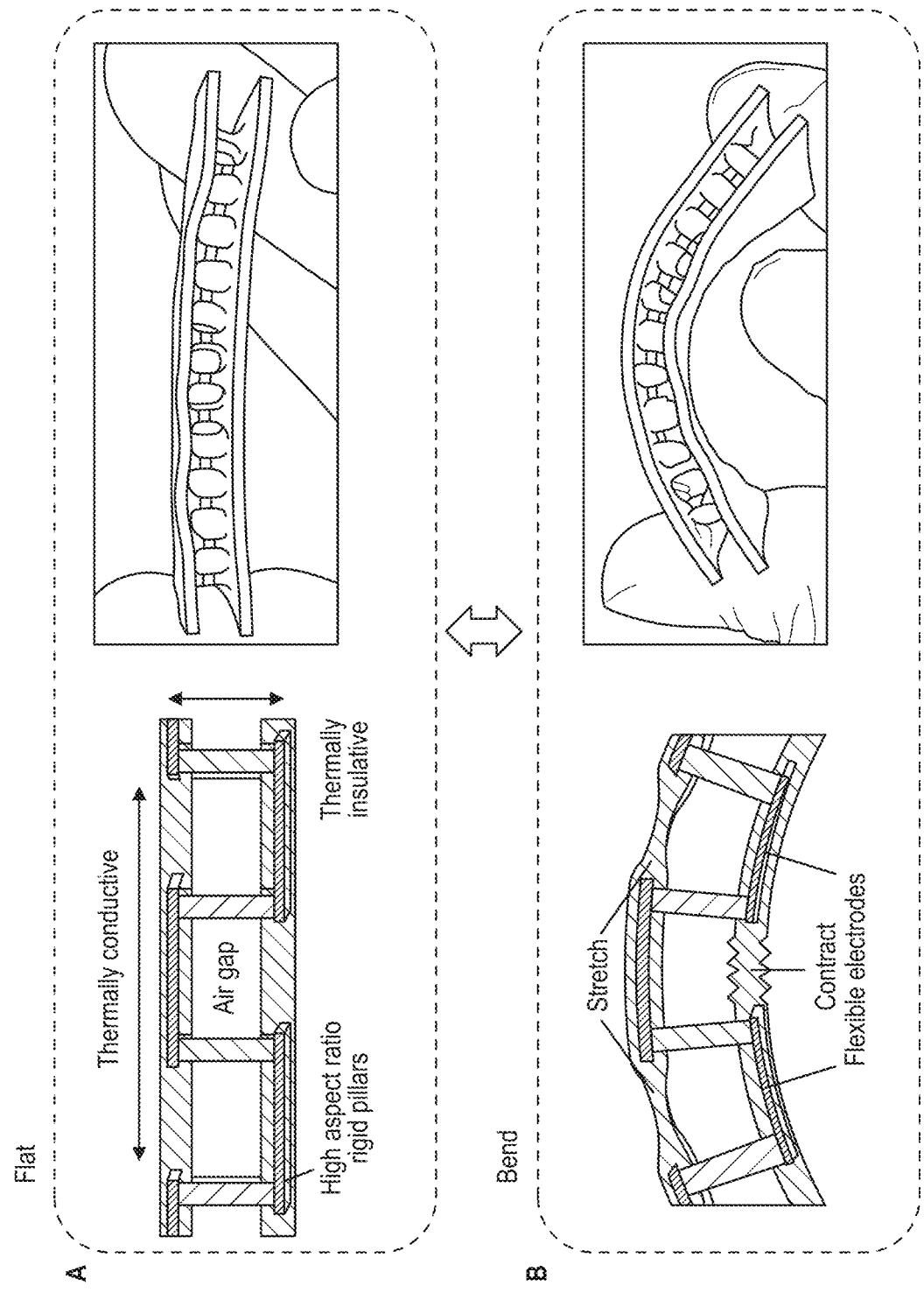
FIG. 19A-B

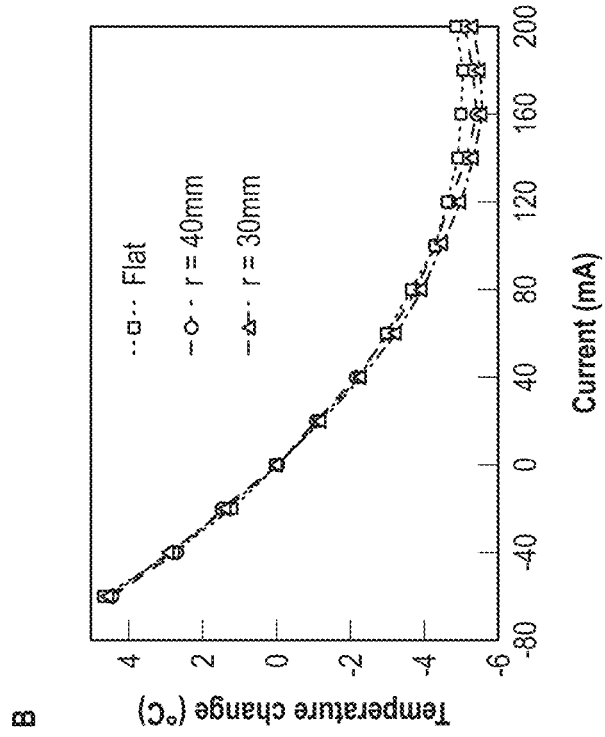
FIG. 20A-B

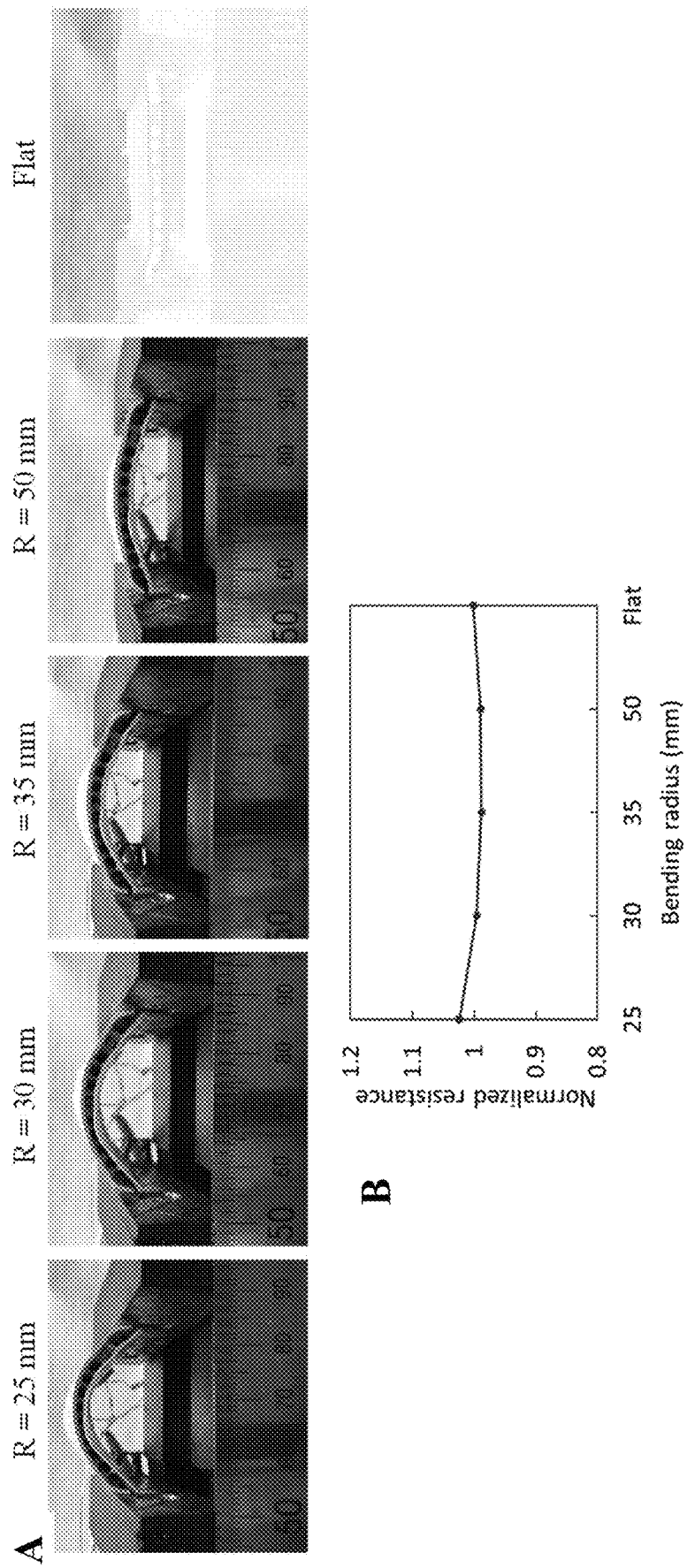
FIG. 21A-B

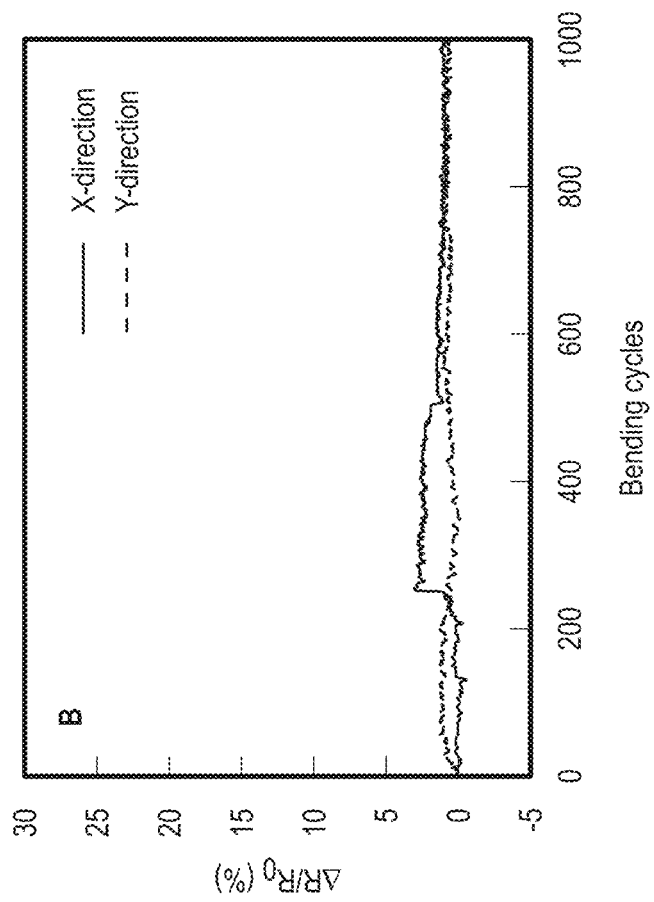
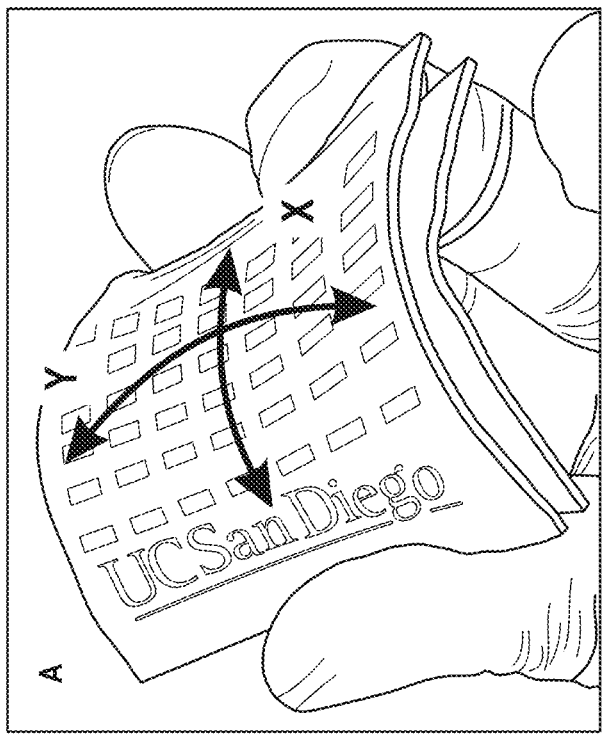
*FIG. 22A-B*

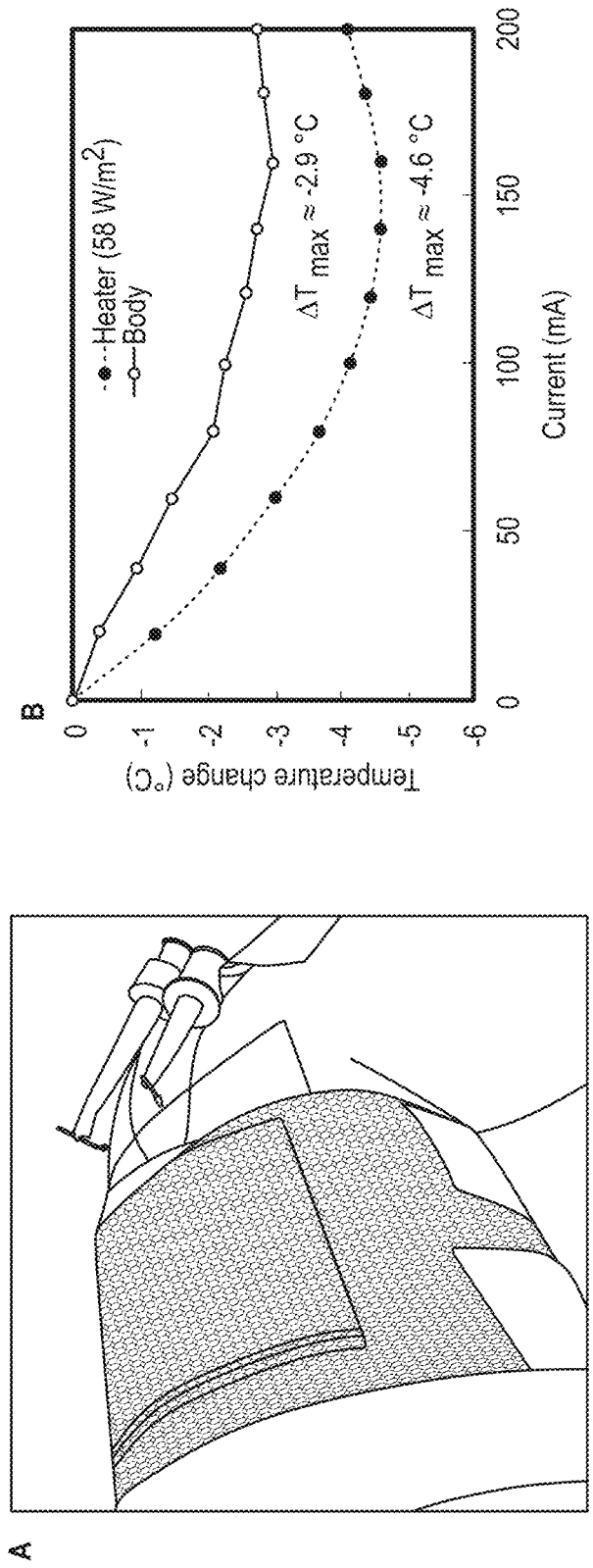
FIG. 25A-B

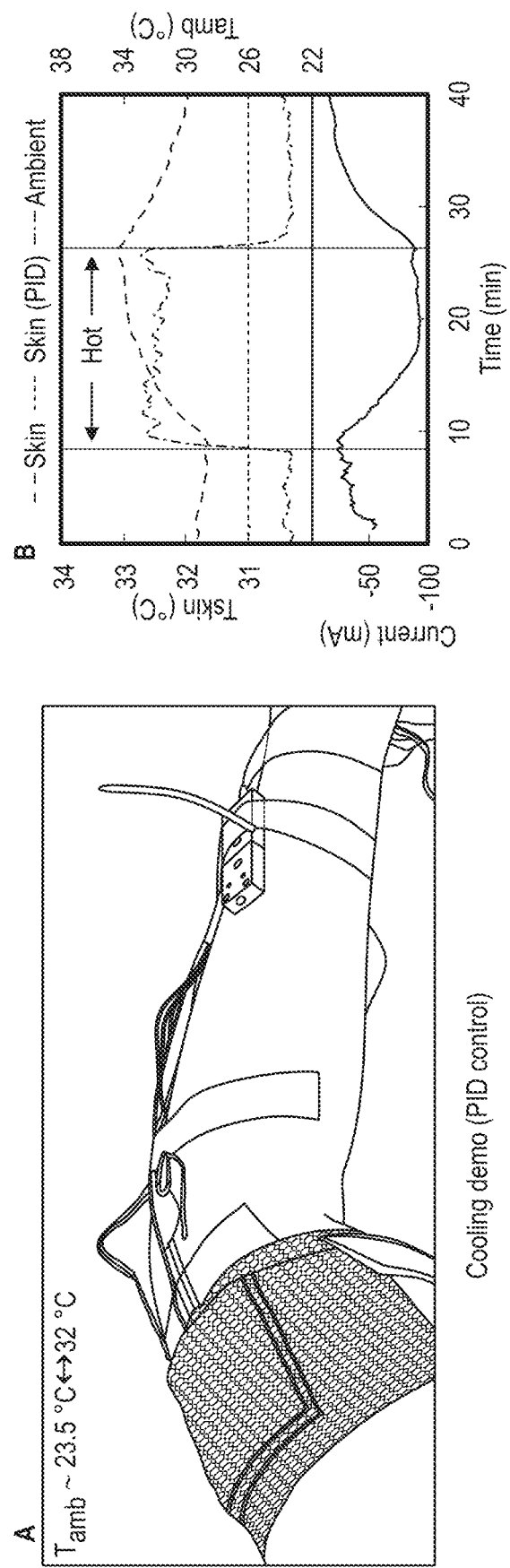
FIG. 26A-B

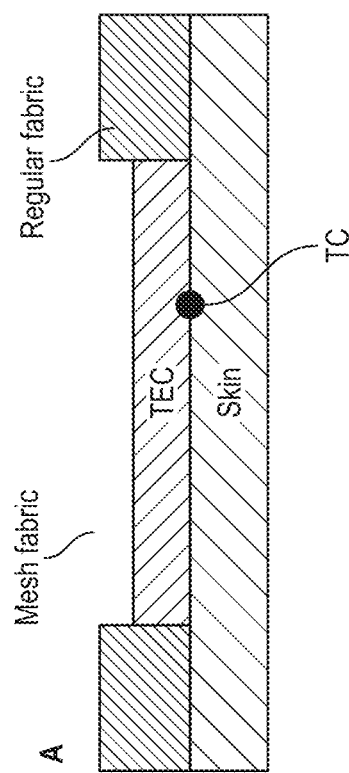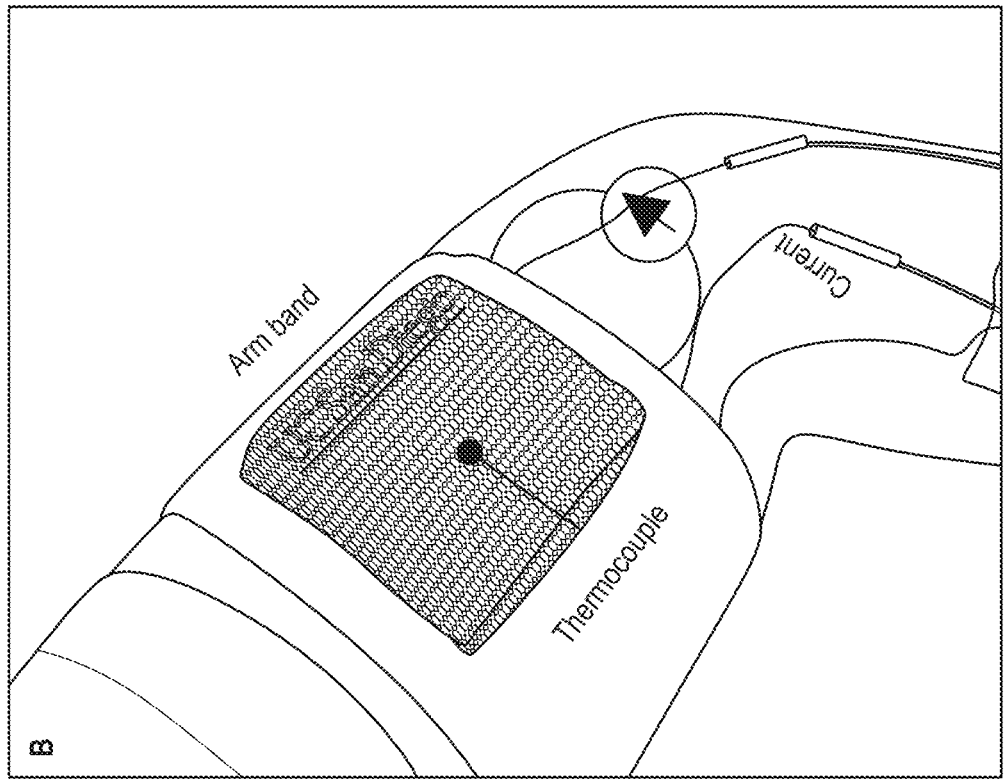
FIG. 27A-B

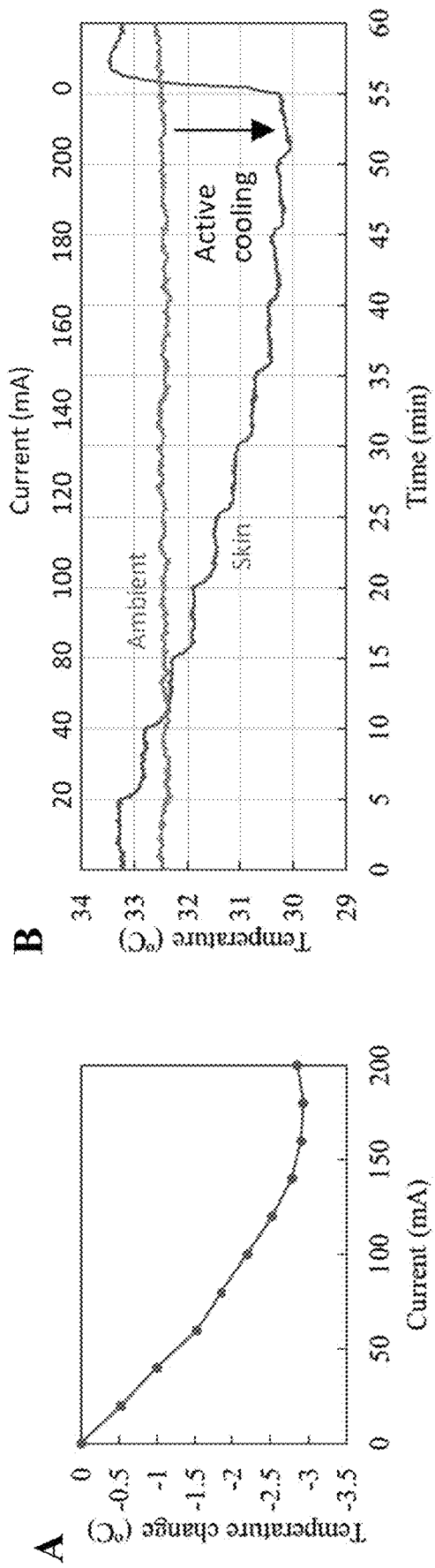
FIG. 28A-B

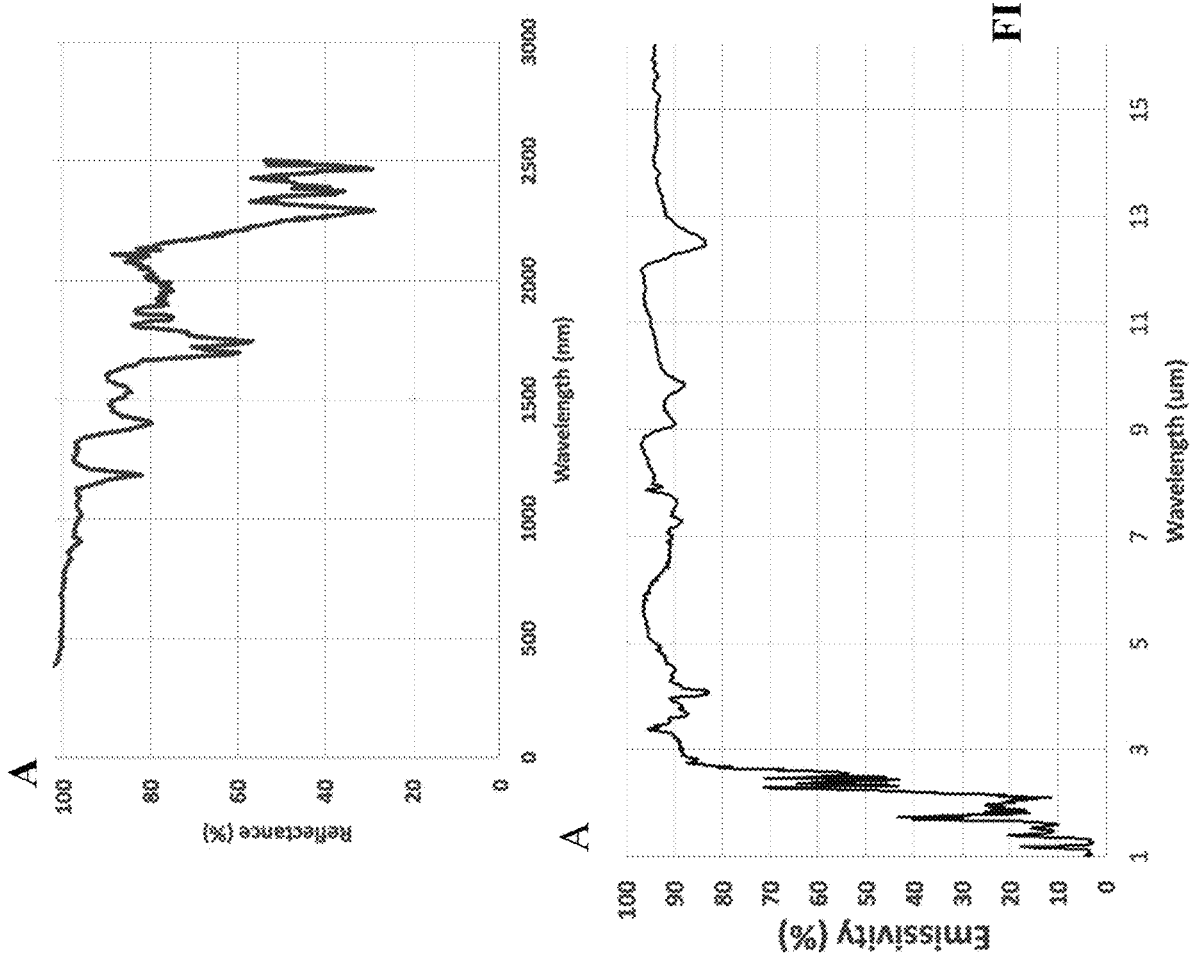
FIG. 39A-B

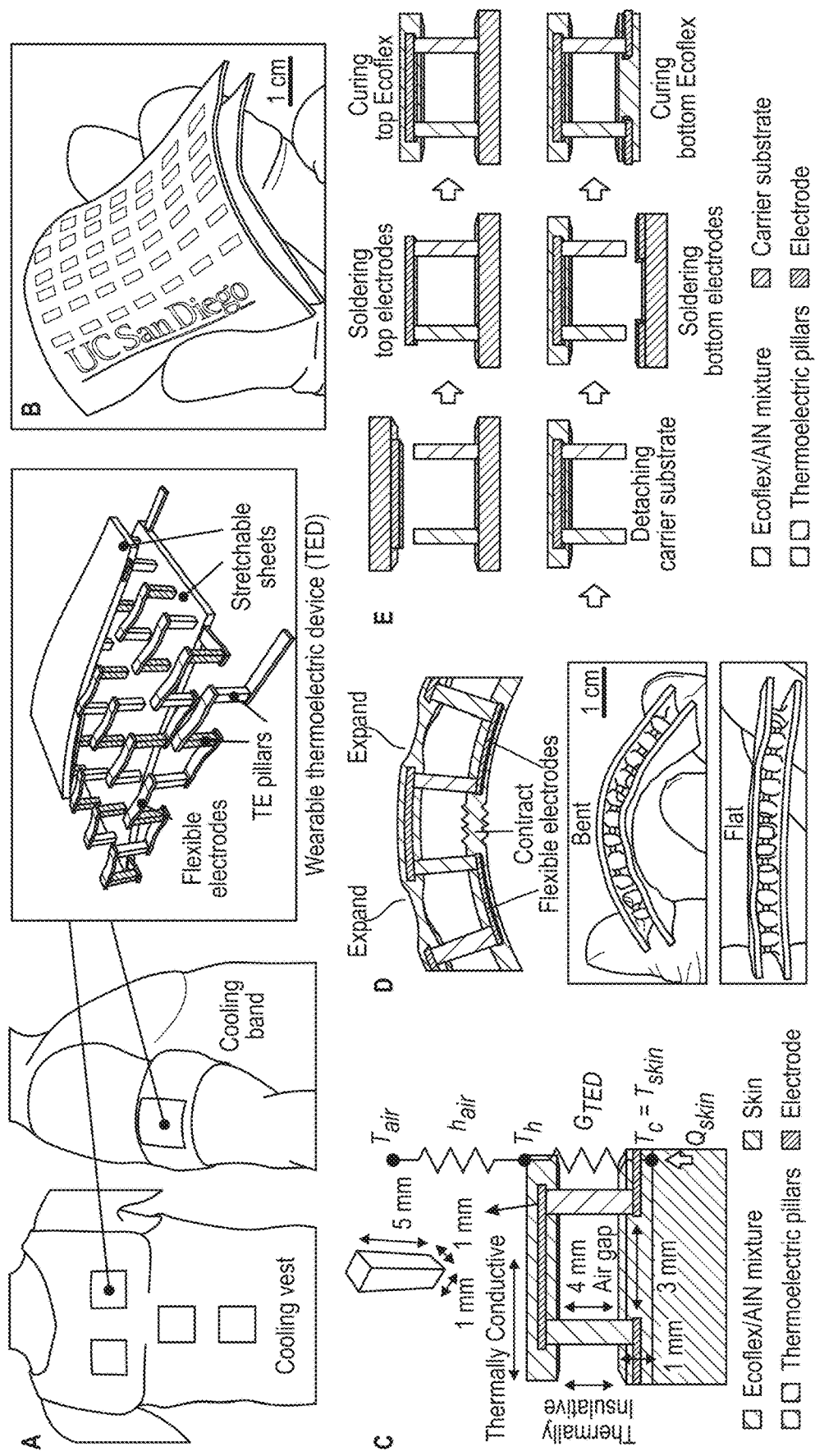
FIG. 40A-E

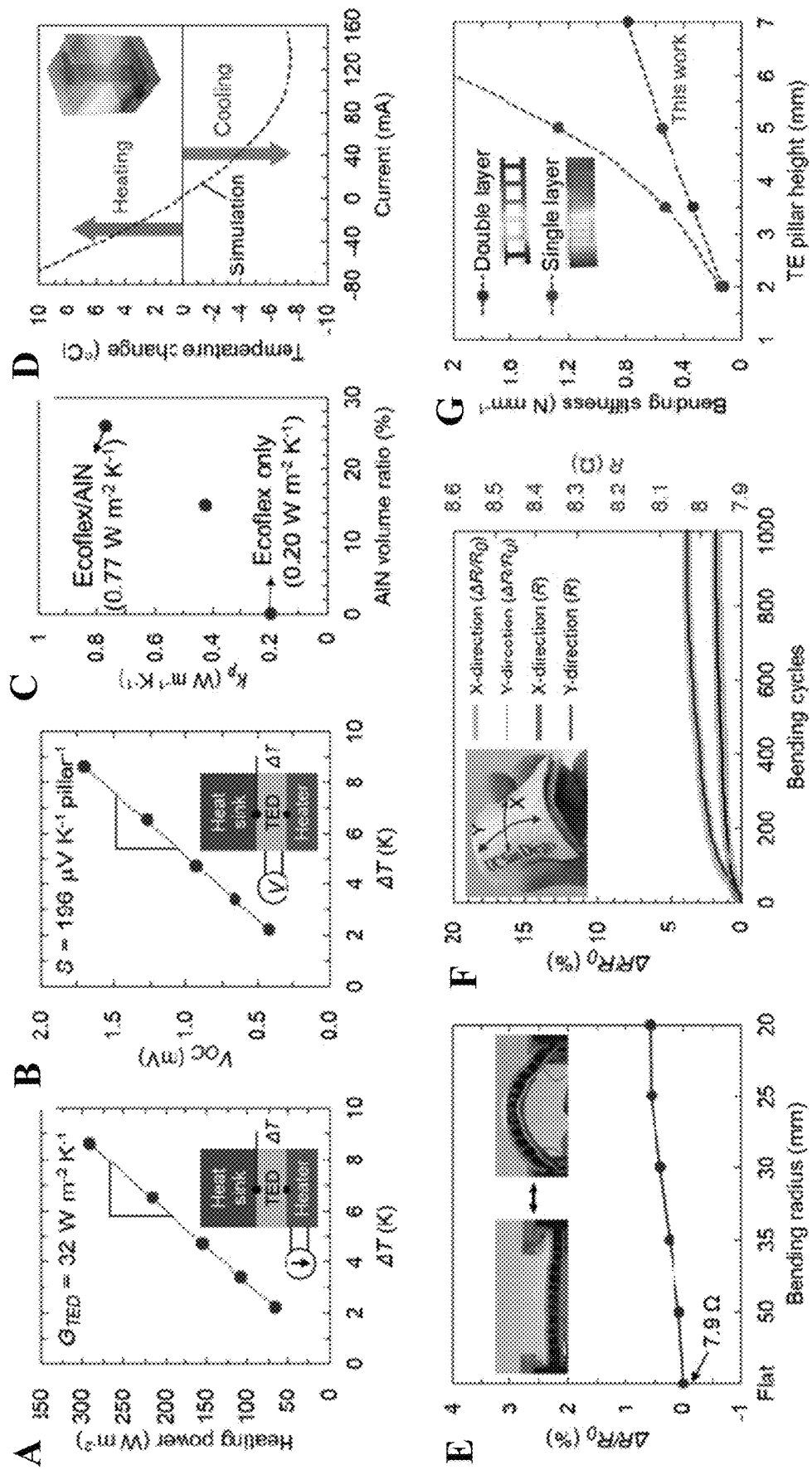
FIG. 41A-G

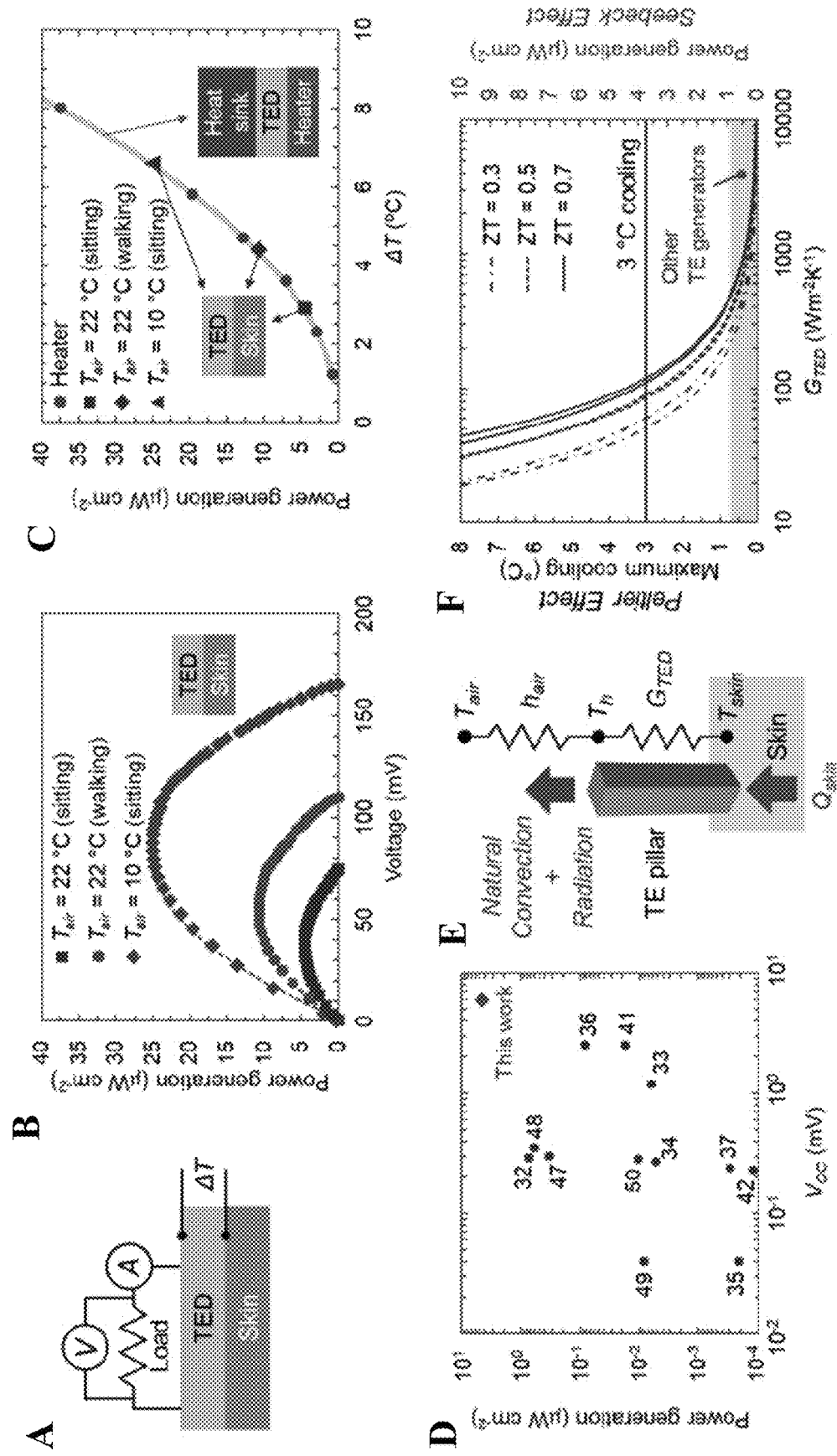
FIG. 42A-F

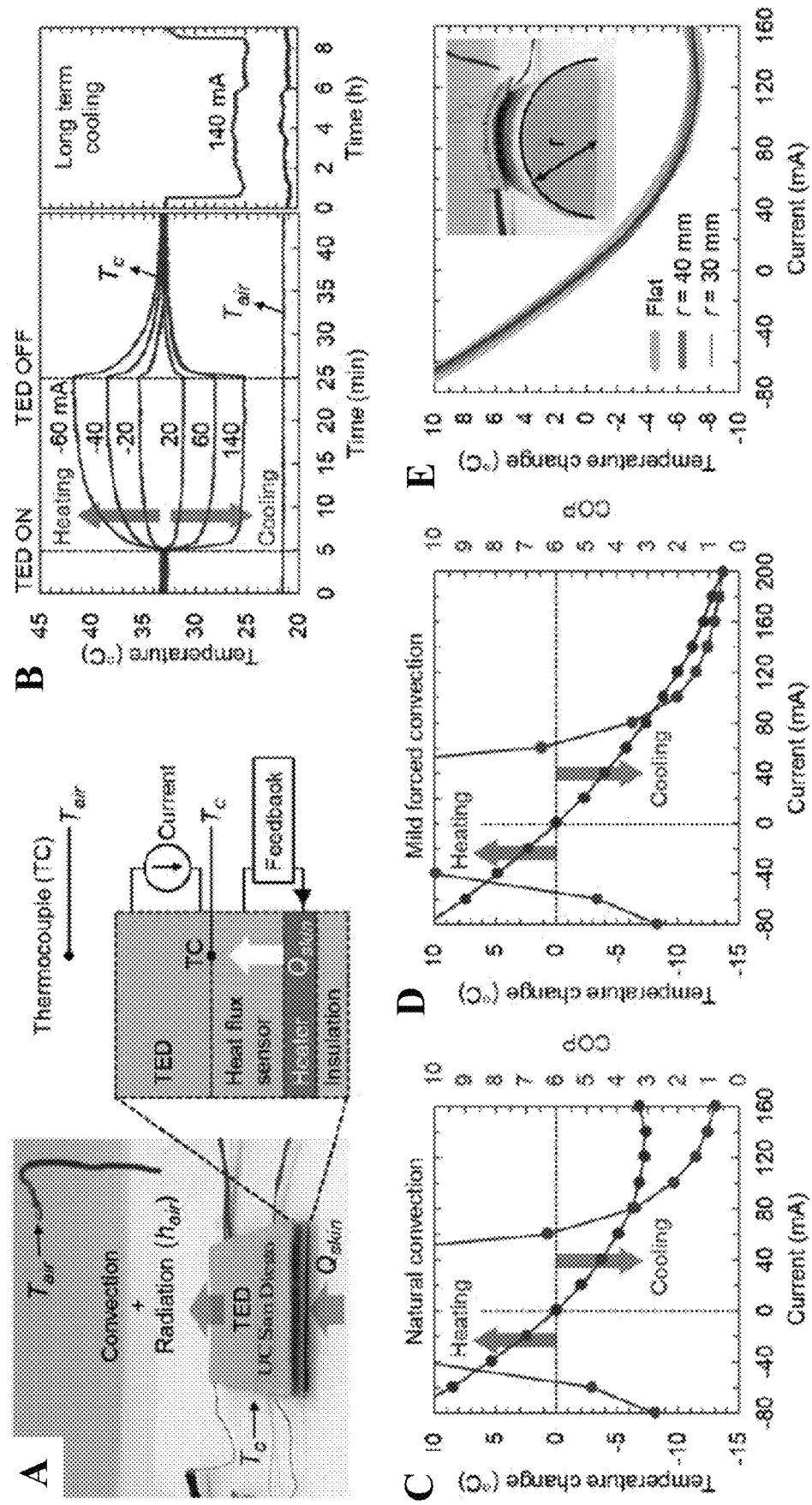
FIG. 43A-E

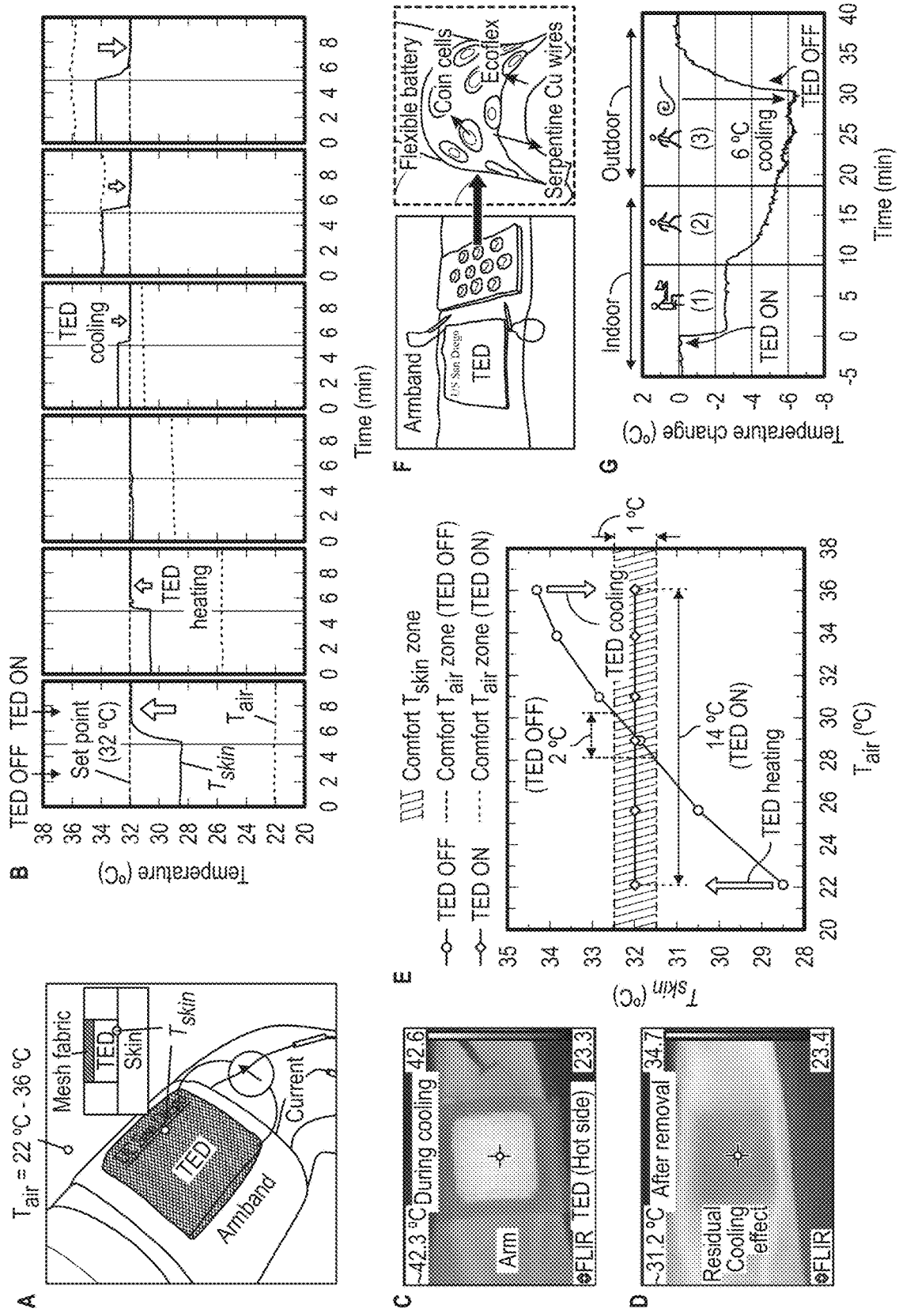
FIG. 44A-G

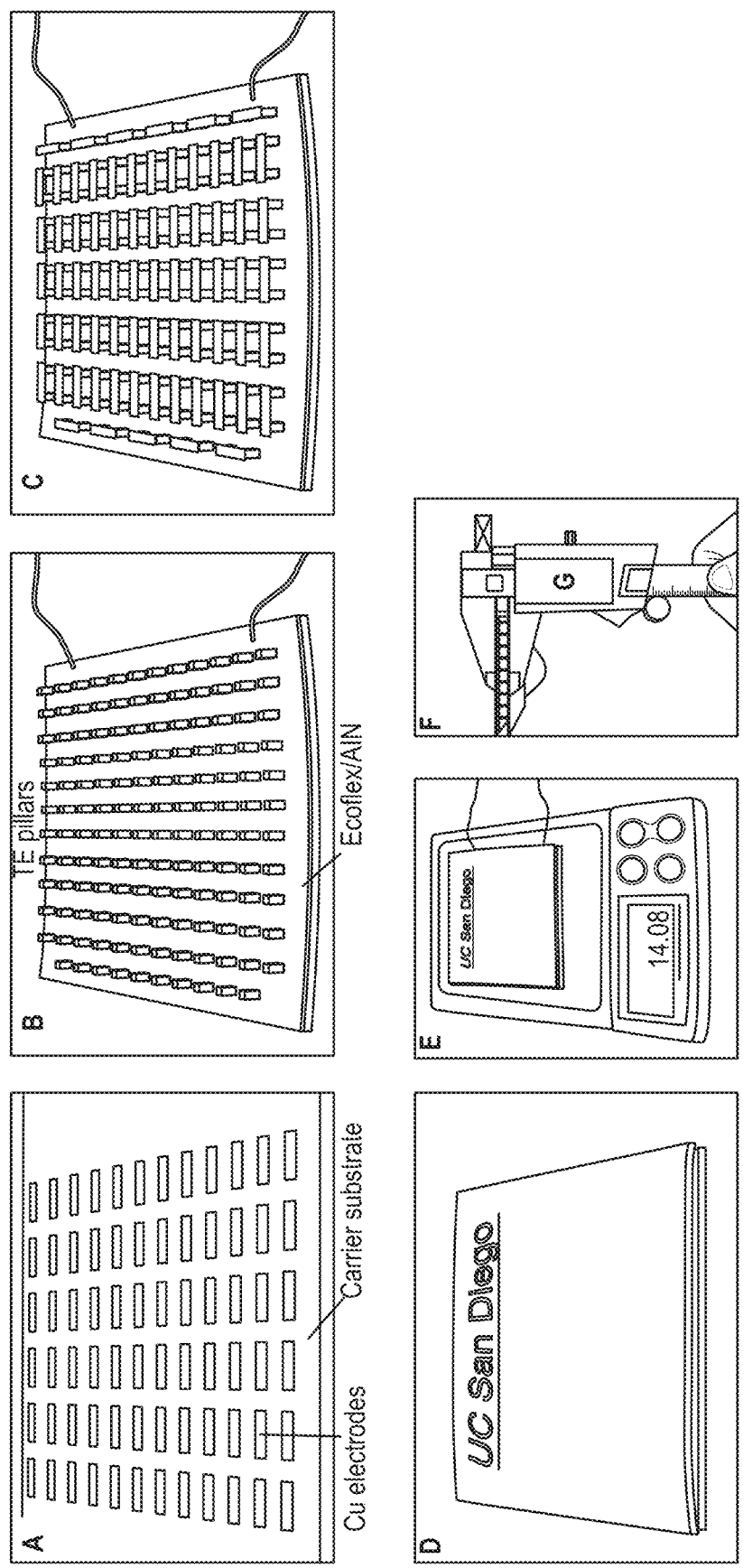
FIG. 45A-F

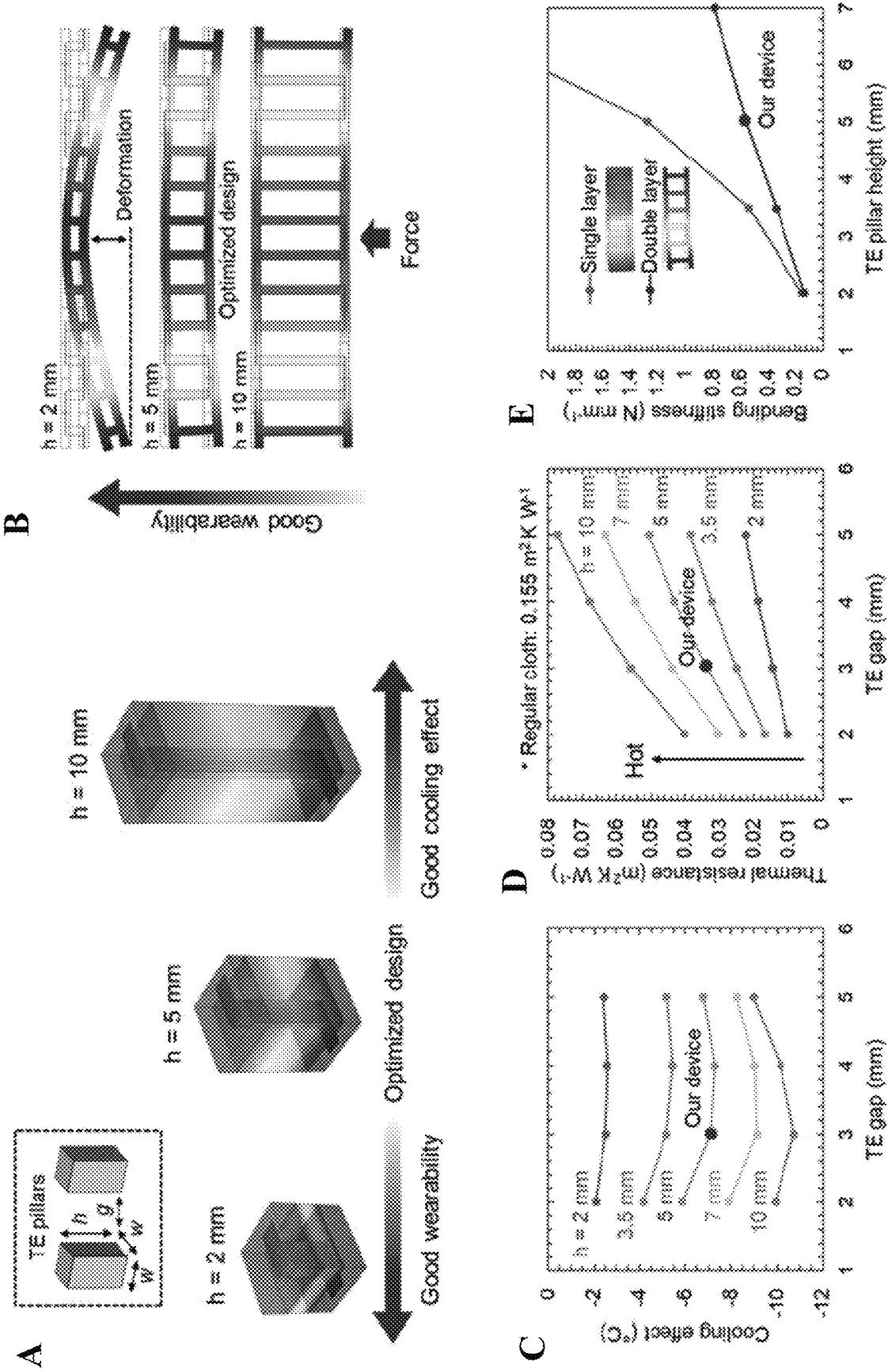
FIG. 46A-E

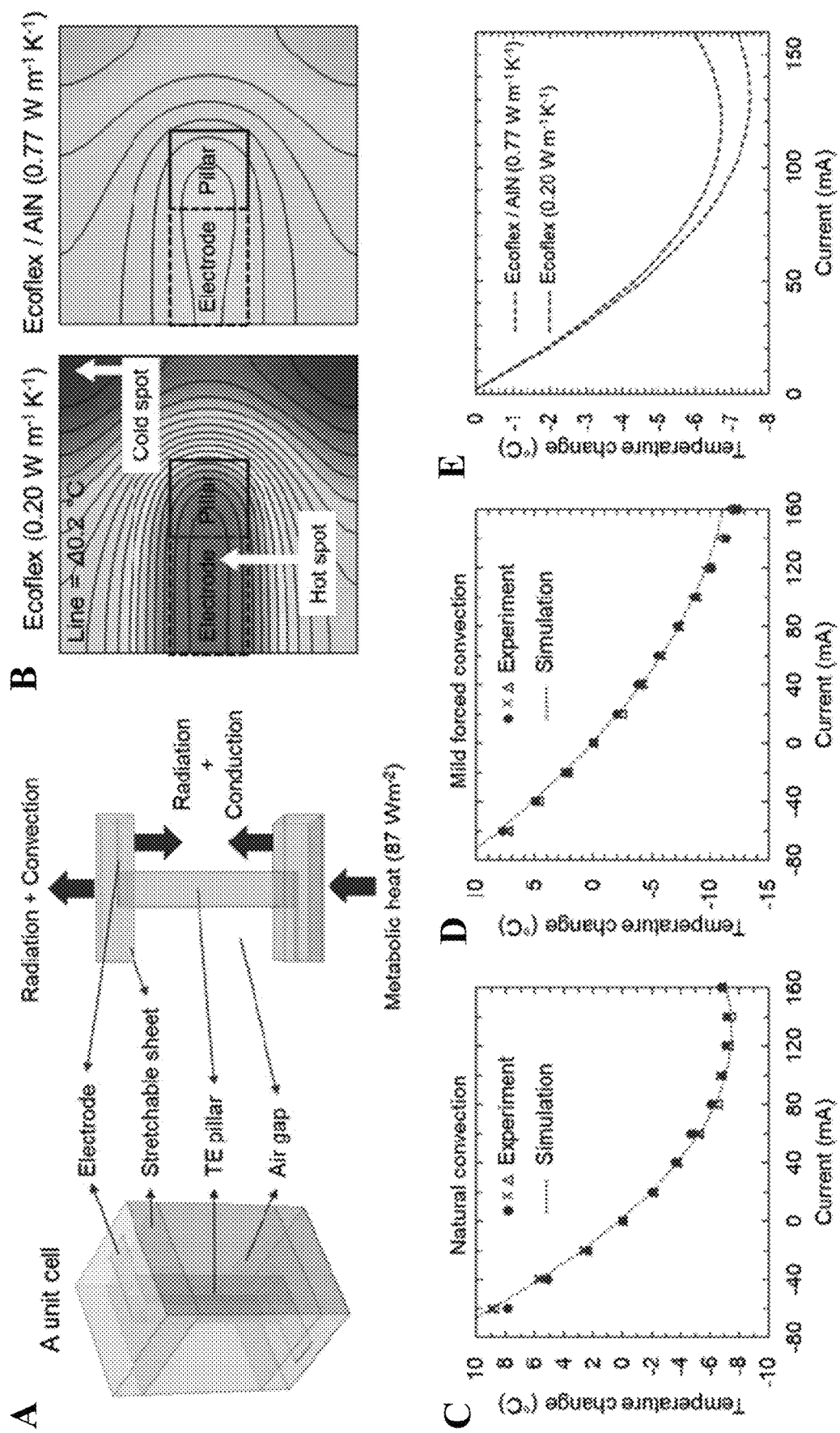
FIG. 47A-E

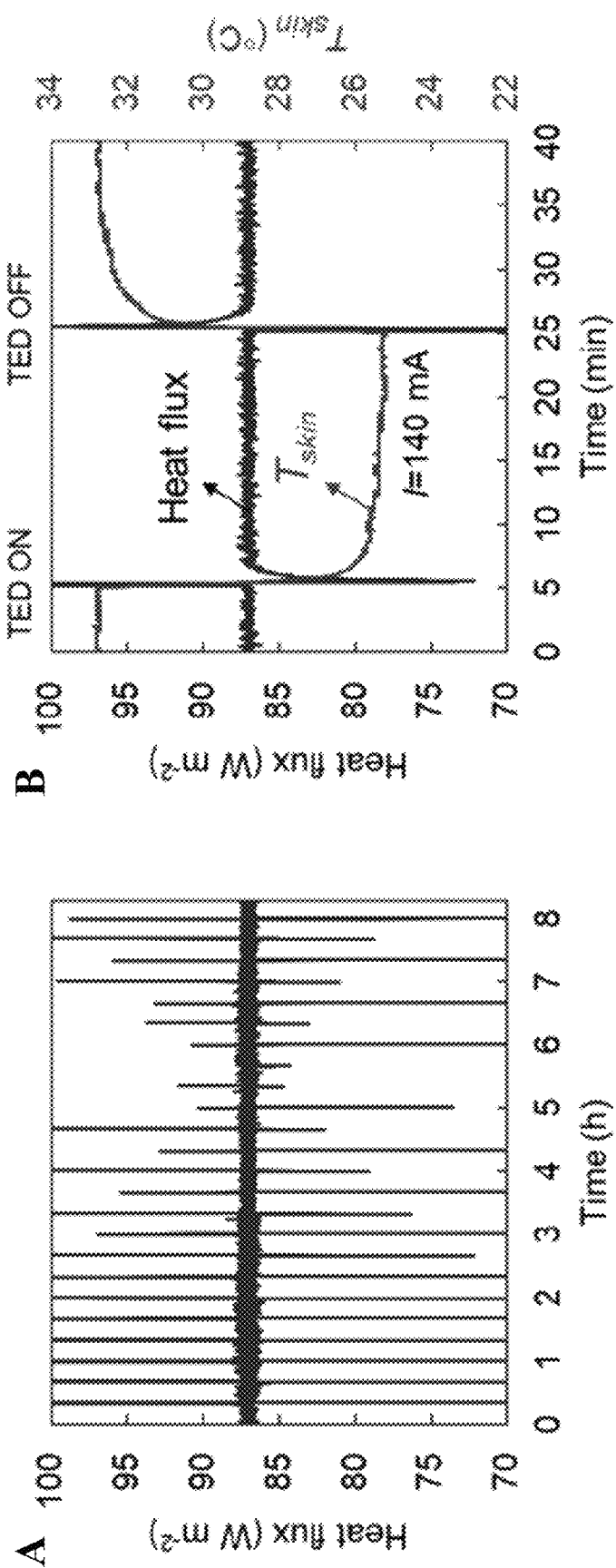
FIG. 48A-B

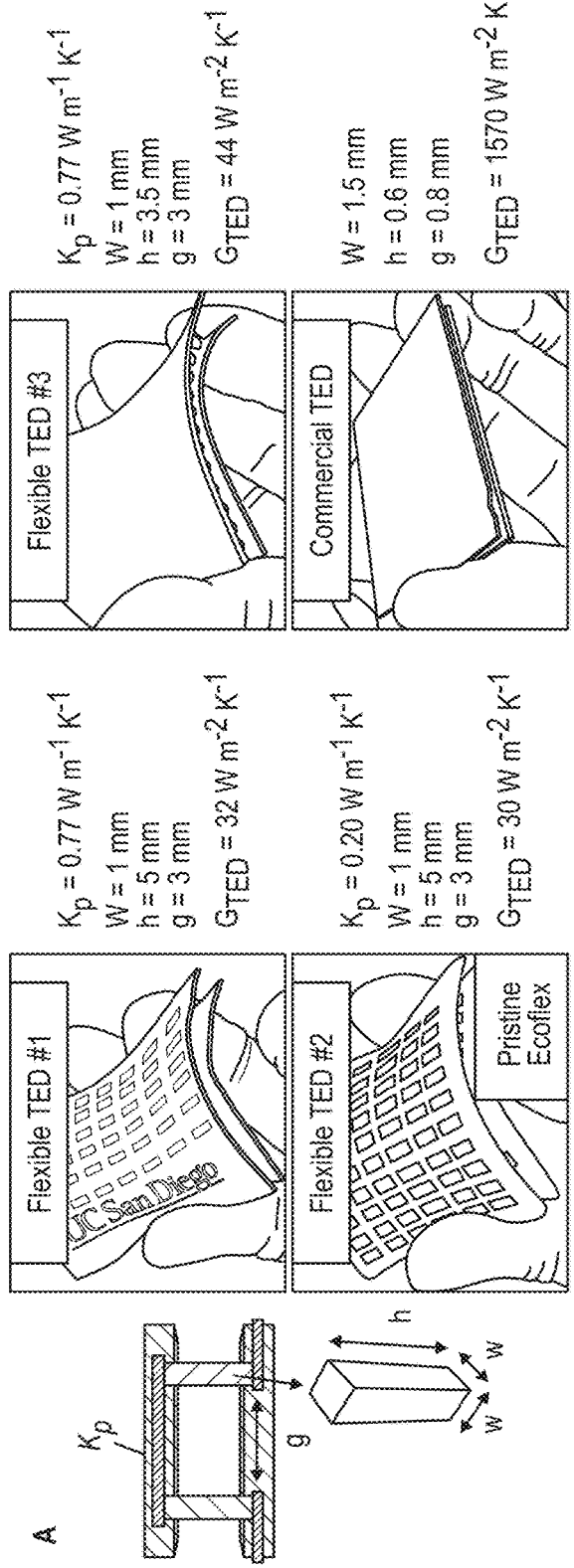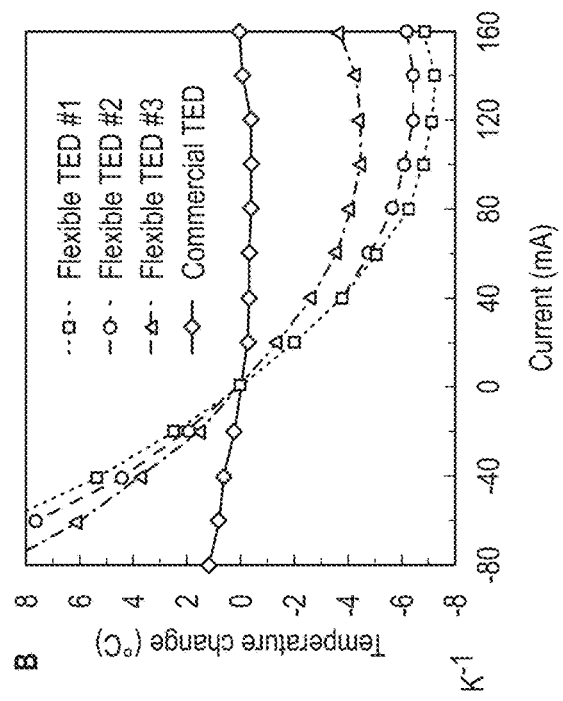
FIG. 49A-B

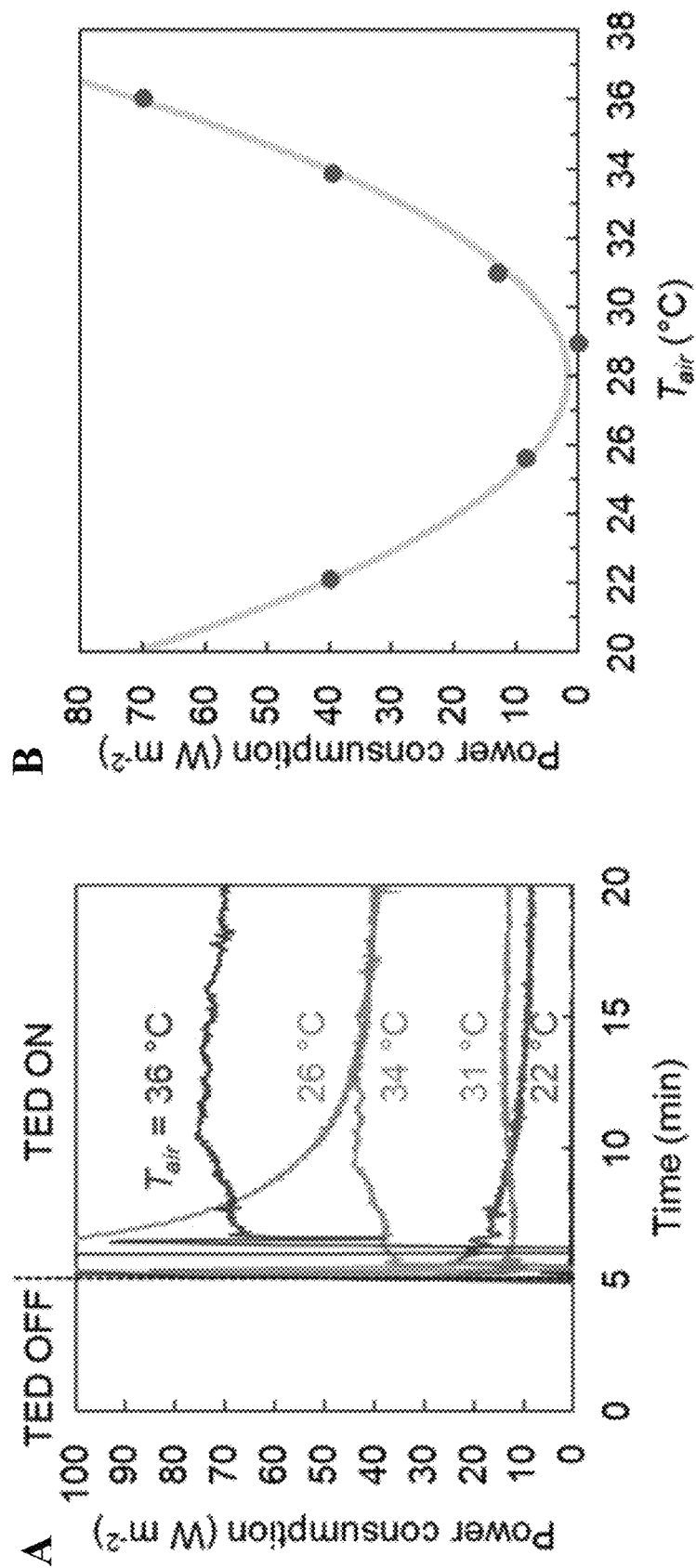
FIG. 50A-B

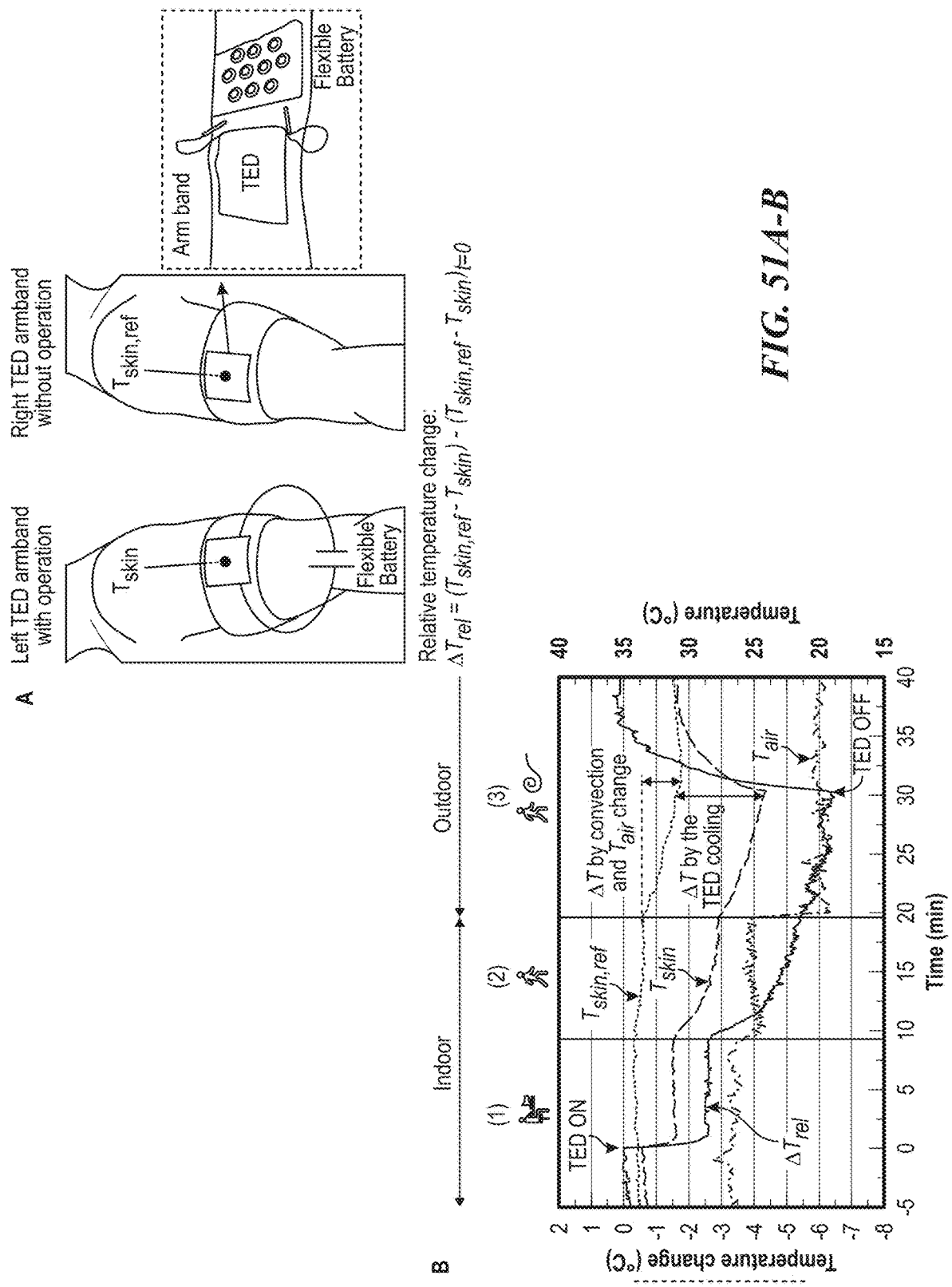
FIG. 51A-B

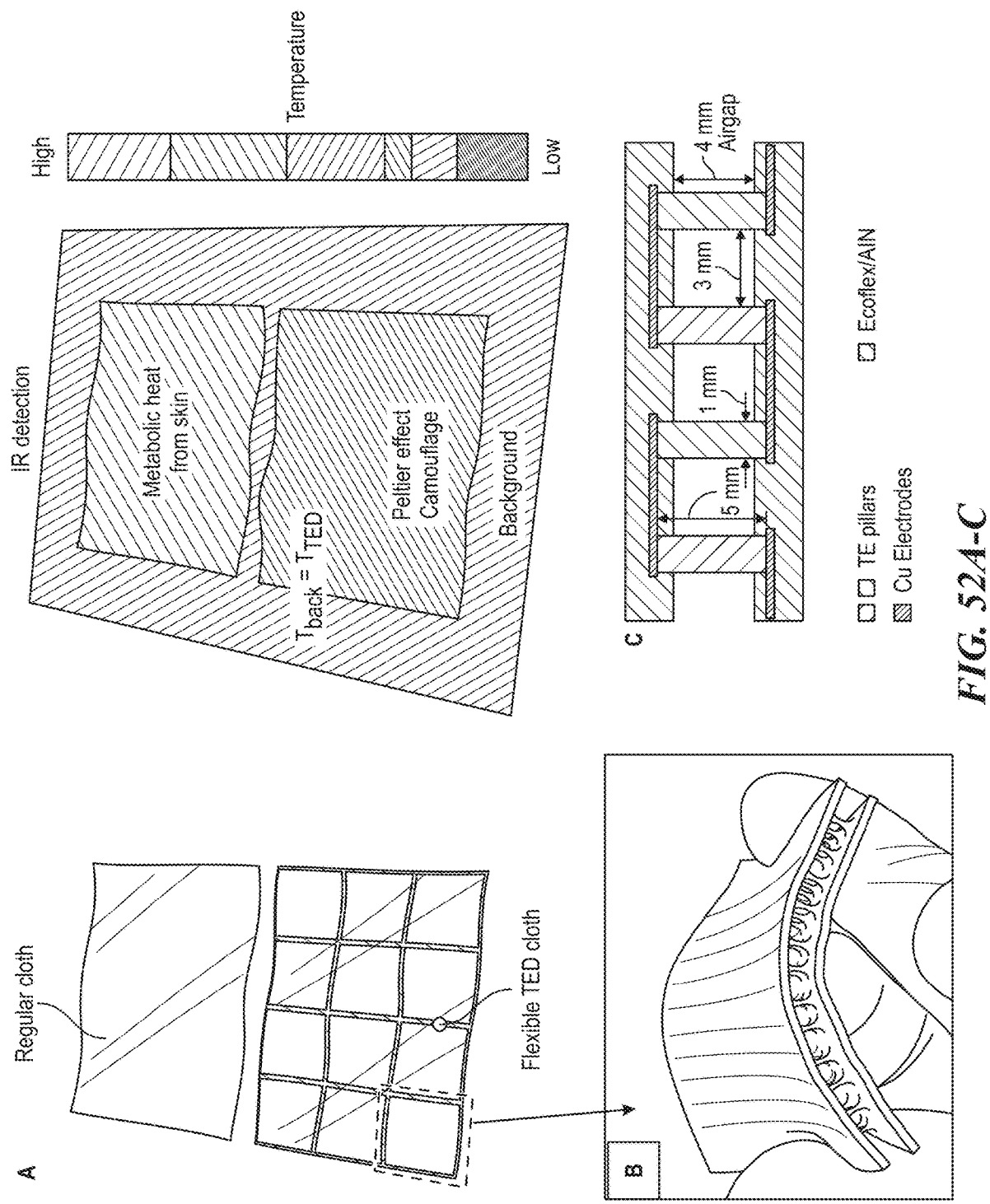
FIG. 52A-C

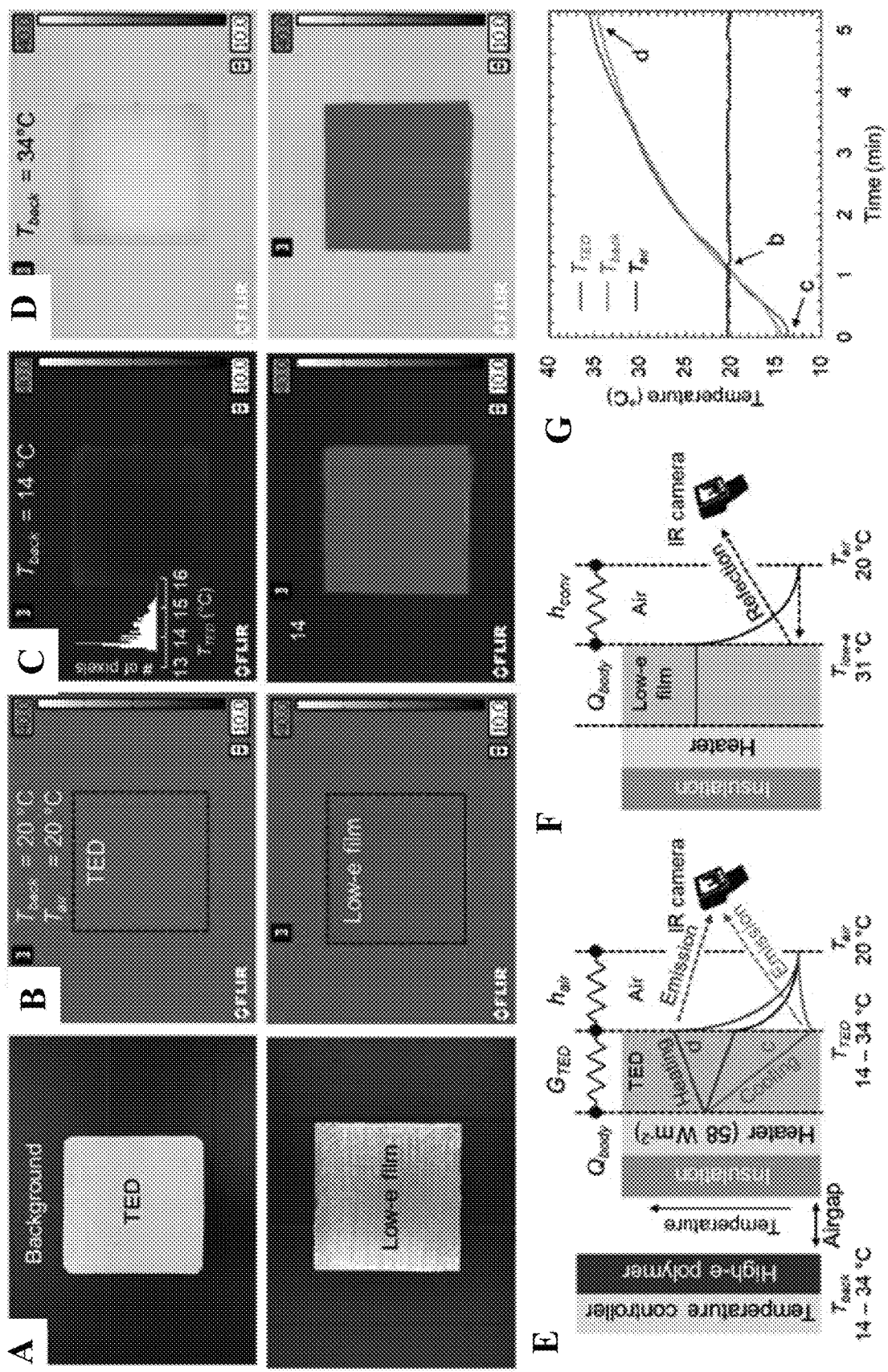
FIG. 53A-G

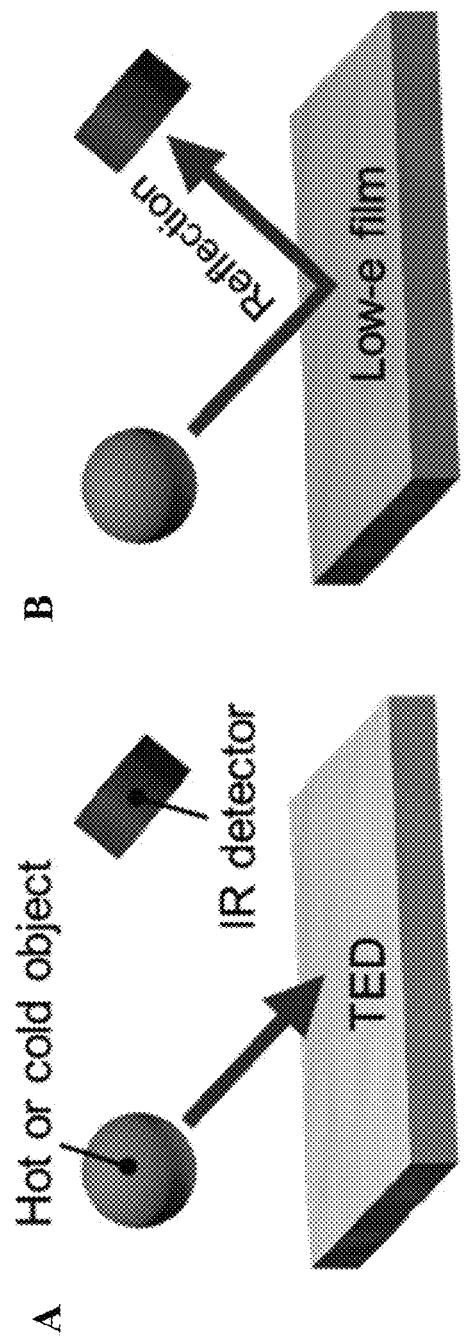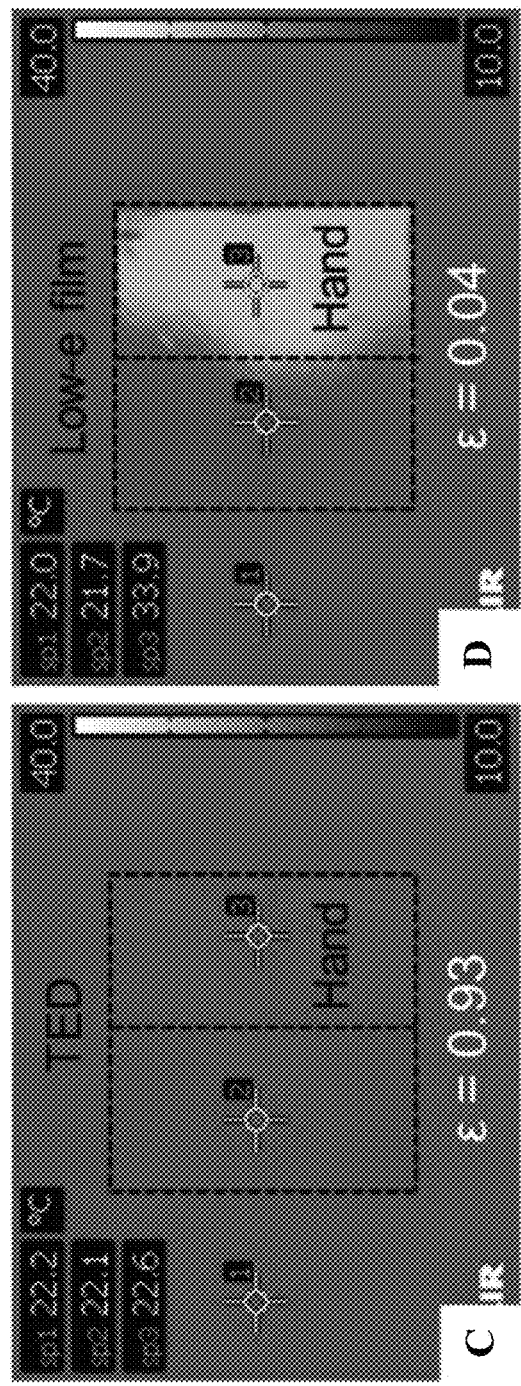
FIG. 54A-D

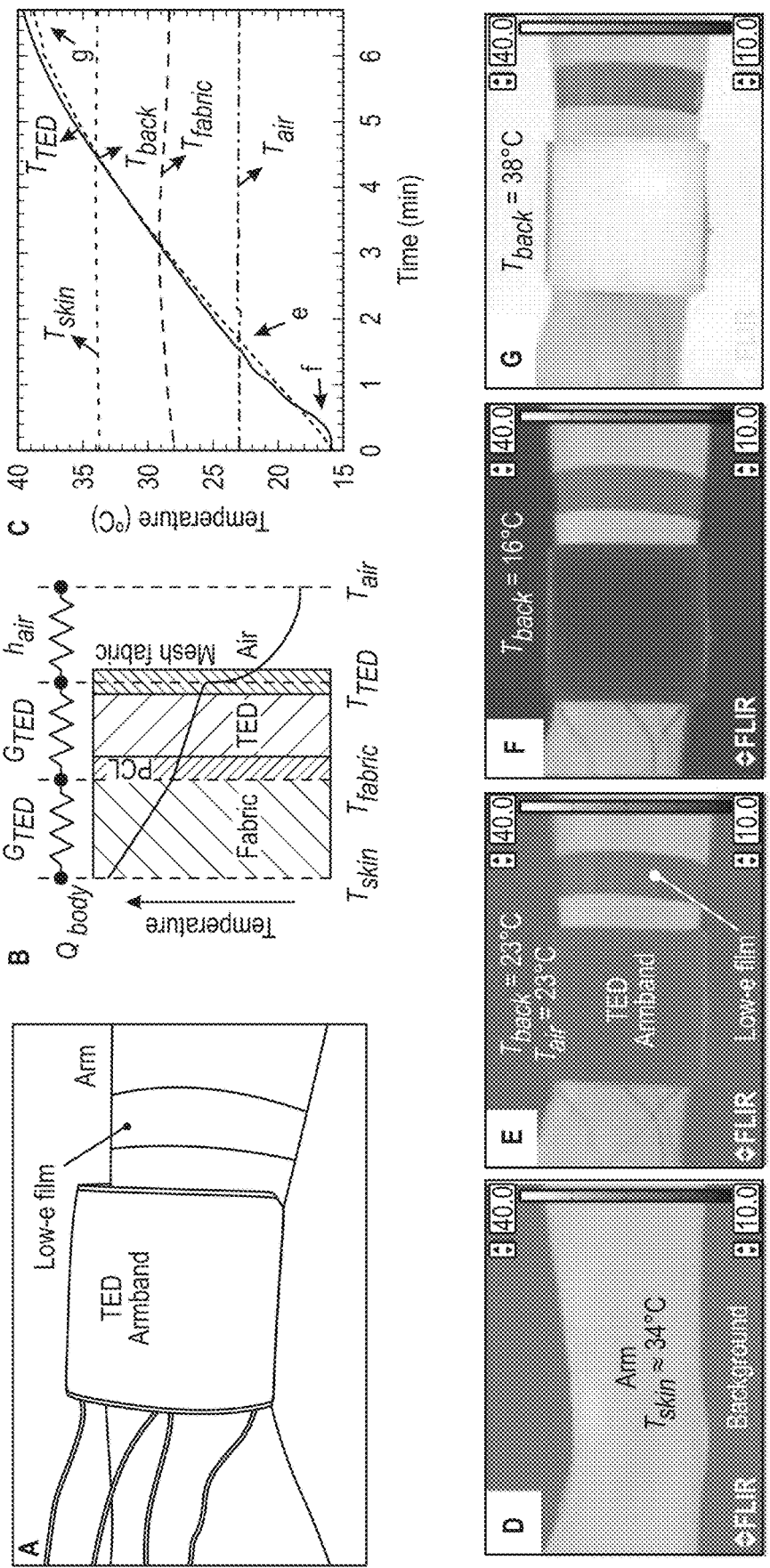
FIG. 55A-G

5600

5610 — Placing a flexible top sheet in thermal contact with top surfaces of thermoelectric pillars, wherein each of the thermoelectric pillars exhibits a thermoelectric property, and wherein the flexible top sheet is exposed to a natural environment 5620 — Placing a flexible bottom sheet in thermal contact with bottom surfaces of the thermoelectric pillars, wherein flexible electrodes electrically interconnecting adjacent thermoelectric pillars, and wherein the flexible bottom sheet is in contact with the biological skin

┌─ 5710 Attaching an array of regularly spaced thermoelectric pillars to a substrate, wherein the thermoelectric pillars are arranged as alternating N-type semiconductor and P-type semiconductor ┌─ 5720 Arranging flexible electrodes on another substrate, wherein each electrode includes solder ┌─ 5730 Heating the other substrate to cause the solder to melt on each electrode to provide permanent electrical connections between pairs of adjacent thermoelectric pillars ┌─ 5740 Depositing an adhesion layer onto the flexible electrodes after attachment to the thermoelectric pillars and cooling of the substrate ┌─ 5750 Attaching a flexible sheet to the flexible electrodes with attached thermoelectric pillars via the deposited adhesion layer

FIG. 57

FLEXIBLE THERMOELECTRIC DEVICES

CROSS-REFERENCE TO RELATED APPLICATION

This patent document is a 371 National Phase Application of International Application No. PCT/US2019/062475, filed on Nov. 20, 2019, which claims priority to and benefits of U.S. Provisional Patent Application No. 62/770,123, entitled "FLEXIBLE THERMOELECTRIC DEVICES," filed on Nov. 20, 2018. The entire content of the above patent application is incorporated by reference as part of the disclosure of this patent document.

FEDERALLY SPONSORED RESEARCH OR DEVELOPMENT

This invention was made with government support under DE-AR0000535 awarded by the U.S. Department of Energy Advanced Research Project Agency. The government has certain rights in the invention.

TECHNICAL FIELD

The present document discloses design and fabrication methods for mechanically flexible and/or stretchable thermoelectric devices for wearable personalized thermo-regulation, power generation by harvesting body heat, and/or for thermal camouflaging.

BACKGROUND

Thermoelectric (TE) energy conversion utilizes solid state semiconductor devices to convert thermal energy into electricity, or vice versa. When operated in a cooling or heating mode to convert electrical power to thermal energy, TE devices utilize the Peltier effect to achieve cooling or heating. When operated in a power generation mode, TE devices utilize the Seebeck effect. These two effects are related through the Kelvin relationship, namely, $S=\Pi \cdot T$, where S is the Seebeck coefficient, H is the Peltier coefficient, and T is the absolute temperature measured in Kelvin. New TE devices and applications for the TE devices are needed.

SUMMARY

This patent document discloses flexible TE devices for wearable applications on the human body or other biological skins, including personalized thermo-regulation, power generation by harvesting body heat, and for thermal camouflaging.

Devices, materials, processes, and methods are disclosed. In one aspect, a flexible thermoelectric device or material is disclosed. The thermoelectric device or material may include thermoelectric pillars made from thermoelectric materials. The thermoelectric device or material may further include flexible electrodes electrically interconnecting adjacent thermoelectric pillars. A flexible top sheet in thermal contact with top surfaces of the thermoelectric pillars may be included and a flexible bottom sheet in thermal contact with bottom surfaces of the thermoelectric pillars may be included. The top and bottom sheets may be made of flexible materials, such as polymeric or elastomeric sheets.

In another aspect, a method of thermoregulating biological skin is disclosed. The method includes placing a flexible top sheet in thermal contact with top surfaces of thermoelectric pillars, wherein each of the thermoelectric pillars exhibits a thermoelectric property, and wherein the flexible top sheet is exposed to a natural environment. The method further includes placing a flexible bottom sheet in thermal contact with bottom surfaces of the thermoelectric pillars, wherein flexible electrodes electrically interconnecting adjacent thermoelectric pillars, and wherein the flexible bottom sheet is in contact with the biological skin.

In another aspect a process for producing a flexible thermoelectric device or material is disclosed. The process may include attaching an array of regularly spaced thermoelectric pillars to a flexible sheet or substrate, wherein the thermoelectric pillars are arranged as alternating N-type semiconductor and P-type semiconductor. The process may further include arranging flexible electrodes on another flexible substrate, wherein each electrode is connected to the thermoelectric pillars using solder. The process may further include heating the other substrate to cause the solder to melt on each electrode to provide permanent electrical connections between the thermoelectric pillars and the flexible electrodes. The process may further include depositing an adhesion layer onto the flexible electrodes after attachment to the thermoelectric pillars and cooling of the substrate and/or attaching a flexible sheet to the flexible electrodes with attached thermoelectric pillars via the deposited adhesion layer.

In another aspect a thermoelectric device is disclosed. The thermoelectric device includes a first flexible layer to face the air and a second flexible layer to contact a body part of a person. The thermoelectric device further includes thermoelectric pillars formed between the first and second flexible layers, each thermoelectric pillar configured to exhibit a thermoelectric property and has a high aspect ratio with a length along each pillar to be greater than a dimension cross each pillar to produce an effective thermal resistance that is close to or matches a thermal resistance for a natural convection and radiated heat transfer to the air. The thermoelectric device includes flexible electrodes electrically interconnecting adjacent thermoelectric pillars.

In another aspect, a thermal camouflage device is disclosed. The thermal camouflage device includes a first fabric layer with a first side exposed to air and a second side and a thermoelectric layer with a third side in contact with the second side of the first fabric layer and a fourth side. The thermal camouflage device further includes a phase change layer with a fifth side in contact with the fourth side and a sixth side, and a second fabric layer with a seventh side in contact with the sixth side and an eighth side in contact with an object to thermally camouflage.

The following features may be included in any combination. The thermoelectric pillars may include alternating N-type semiconductor devices and P-type semiconductor devices. A height of the thermoelectric pillars and/or a areal packing density of the thermoelectric pillars may be selected to produce a target thermal conductance. The flexible thermoelectric device or material may dissipate heat via natural convection. The flexible thermoelectric device or material may be configured to heat an area of skin. The flexible thermoelectric material may be configured to generate electrical power from body heat at skin. The flexible thermoelectric material may be incorporated into cloth or clothing including a shirt, a vest, a jacket, a hat, gloves, shoes, insoles, and so on. The thermoelectric pillars may have an aspect ratio with a high value, wherein the aspect ratio is a ratio of a height of each pillar to a width of each pillar. A height of the thermoelectric pillars and a areal packing density of the thermoelectric pillars may be selected to produce a target thermal conductance.

BRIEF DESCRIPTION OF THE DRAWINGS

FIGS. 5A-B depict results from a simulation of a flexible thermoelectric device, in accordance with some example embodiments;

FIGS. 9A-9F depict a process for producing a flexible thermoelectric device, in accordance with some example embodiments;

FIGS. 12A-B depict a diagram and a photograph of a flexible thermoelectric device, with the top and bottom substrates being flexible polymeric or elastomer sheets, in accordance with some example embodiments;

FIGS. 13A-B depict another diagram and another photograph of a flexible thermoelectric device with high thermal conductivity fillers in a polymeric or elastomer sheets, in accordance with some example embodiments;

FIGS. 18A-C depict examples of infrared photographs of a flexible thermoelectric device, in accordance with some example embodiments;

FIGS. 19A-B depict examples of a flexible thermoelectric device under bending, in accordance with some example embodiments;

FIGS. 20A-B depict an example of a photograph of a flexible thermos electric device under bending and a performance curve under bending, in accordance with some example embodiments;

FIGS. 21A-B depict photographs and normalized resistance of a flexible thermoelectric device under bending, in accordance with some example embodiments;

FIGS. 22A-B depict a photograph and change in resistance of a flexible thermoelectric device as a function of bending cycles, in accordance with some example embodiments;

FIGS. 25A-B depict a photograph of a flexible thermoelectric device worn on an arm and an example of a performance curve, in accordance with some example embodiments;

FIGS. 26A-B depict another photograph of a flexible thermoelectric device worn on an arm and another example of a performance curve, in accordance with some example embodiments;

FIGS. 27A-B depict a diagram of a flexible thermoelectric device in contact with skin and a photograph of a thermoelectric device worn on the arm, in accordance with some example embodiments;

FIGS. 28A-B depict examples of cooling performance of an armband in an indoor environment, in accordance with some example embodiments;

FIG. 39 depicts performance curves including spectral reflectance in 39A and spectral emissivity in 39B for a flexible radiative cooling device including a polymer (Ecoflex) embedded with Boron Nitride (BN) nanopowder, in accordance with some example embodiments;

FIGS. 40A-E depict an example of design and fabrication of thermoelectric devices (TEDs);

FIGS. 41A-G depict examples of plots showing the characteristics of example TEDs;

FIGS. 42A-F depict an example of power generation performance of example TEDs and the impact on active cooling;

FIGS. 43A-E depict examples of heating and cooling performance of example TEDs;

FIGS. 44A-G depict an example device for thermoregulation and example performance plots;

FIGS. 45A-F depict fabrication and characterization of example TEDs;

FIGS. 46A-E depict examples of design optimization of TEDs;

FIGS. 47A-E depict examples of simulation results of a TED;

FIGS. 48A-B depict an example of proportional-integral-derivative controlled heat flux from a heater;

FIGS. 49A-B shows a comparison of TEDs;

FIGS. 50A-B depict an example of power consumption during the thermoregulation of human skin;

FIGS. 51A-B depict an example of temperature change during a mobile thermoregulation demonstration;

FIGS. 52A-C depict an example of thermal camouflage cloth made from flexible thermoelectric devices (TEDs);

FIGS. 53A-G depict an example of an active thermal camouflage using a flexible TED;

FIGS. 54A-D depict an example of an anti-reflective property of a TED;

FIG. 55A-G depict an example of thermal camouflage of human skin;

FIG. 56 depicts a process 5600 used for thermoregulating biological skin, in accordance with some example embodiments; and FIG. 57 depicts a process 5700 for producing a flexible thermoelectric material, in accordance with some example embodiments.

DETAILED DESCRIPTION

Figure 1:
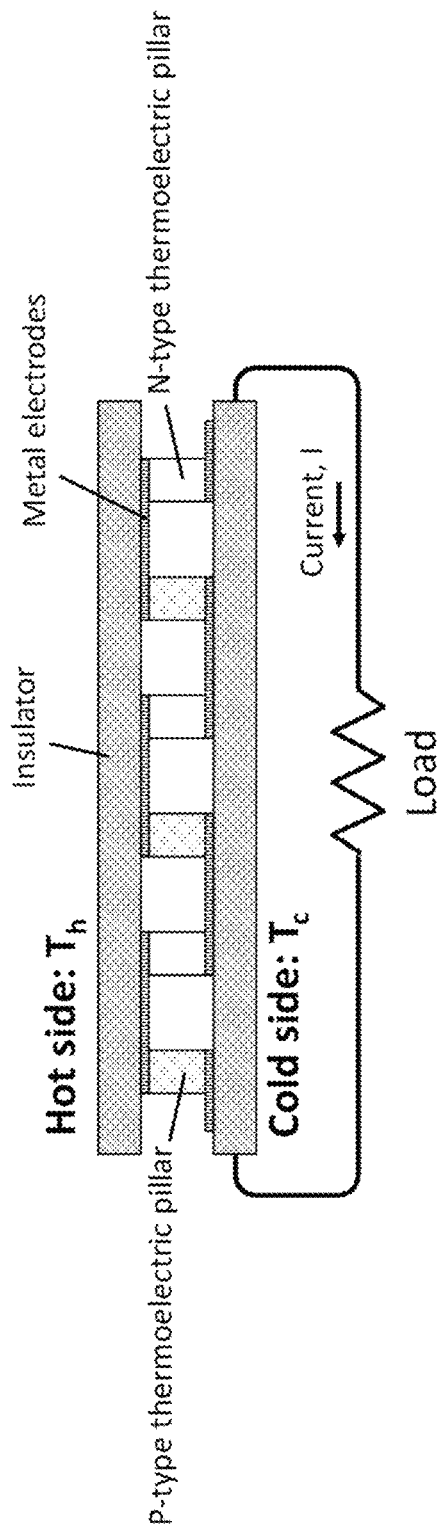
FIG. 1 depicts an example of a thermoelectric device used for power generation due to a temperature difference between a hot side and cold side, in accordance with some example embodiments.

Section headings are used in the present document only for ease of understanding and do not limit the scope of the embodiments to the section in which they are described. Subject matter described under one section heading may be combined with subject matter from other section headings.

In some example embodiments, by harvesting heat from the body, TE devices may be used to power wearable electronics, such as watches and sensors. TE devices that harvest body heat may fully power the wearable devices, partially power the wearable devices to extend a usage time, or to recharge a battery. In this way, TE devices may be used to partially or perpetually power wearable devices and sensors.

In other example embodiments, TE devices can be used to help regulate the temperature of individuals by providing heating and/or cooling. The TE devices can be integrated into garments such as clothes, vests, and armbands for outdoor and indoor environments. For outdoor environments, applications include, but are not limited to, sports such as golfing, bicycling, running, walking, training, soccer, hiking, and other outdoor activities related to occupations, such as construction, fire-fighting, military operations, law enforcement, farming, underground mining, and so on. For indoor environments, applications include usage of TE devices for personalized heating end/or cooling to improve personal thermal comfort and/or save building energy consumption.

In addition to wearable applications in clothes and garments, flexible TE devices may also find applications in other scenarios, such as office and home furniture (e.g., chairs), vehicles and boats (e.g., seats in the cars and motorcycles), fitness equipment (e.g., bicycles, treadmills, etc).

This patent document describes flexible thermoelectric (TE) devices that enable cooling and heating without the need to for a heat sink (e.g., a fan or a water heat sink). Some example embodiments of a cooler can dissipate heat via natural convection of air and radiation heat transfer. These devices may be flexible and may make intimate contact with the wearer's skin for power generation from body heat and/or active heating and/or cooling to aid personal thermoregulation. The disclosed devices have improved thermal performance over previous devices and may be operated without the use of a fan or other active heat sink. Previous wearable thermoelectric devices required a heat sink (e.g., metal pin fin structures, or a fan), or the device performed poorly with no heat sink. The disclosed devices enable high performance in the absence of a heat sink. When forced air convection is available (e.g., wind), the cooling performance will be further enhanced. Additionally, some embodiments of the disclosed TE devices are made into a flexible form using a fabrication process disclosed below and rigid thermoelectric pillars. The process is compatible with any thermoelectric material. The device performance can be further optimized by adopting thermoelectric materials that possess a high thermoelectric figure of merit (ZT). Fabrication methods and the performance of the fabricated devices is detailed below.

In some example embodiments, a flexible thermoelectric device includes thermoelectric pillars electrically connected on each side of the pillars via flexible conductors. The pillars may have a high aspect ratio (e.g., the pillars are taller than either cross sectional dimension). In some implementation of a heater/cooler, one side of the pillars may act as a "hot" side and the other side as a "cold" side. The "hot" and "cold" sides of the flexible thermoelectric device may have a flexible sheet adhered to the device. The aspect ratio of the pillars and the areal packing density of pillars in the flexible thermoelectric device may be selected to provide a thermal impedance match between air and the "hot" side for a cooler, and between air and the "cold" side for a heater. In another aspect, a pillar height and pillar areal packing density may be selected to produce a target thermal conductance for the flexible device.

FIG. 1 shows a schematic of a TE device used as a power generator. When the device is subject to a temperature difference (hot side temperature $T_h$ and cold side temperature $T_c$), the device generates a voltage due to the Seebeck effect. The voltage is proportional to the temperature difference via the Seebeck coefficient, i.e., $\Delta V = S \Delta T$. When the device is connected to an external load (R), the TE device will generate power that can power a load. For example, a device may include thermoelectric pillars that are electrically connected in series and are thermally connected in parallel. In some example embodiments, n-type and p-type pillars are connected in an alternating fashion to generate a larger voltage, as the resulting total voltage across the series of pillars will be added up due to the in-series connections of the pillars. For example, a n-type pillar may be connected to a p-type pillar which is connected to another n-type pillar, and so on. The thermoelectric pillars may be connected via metal electrodes. For example, the electrodes may include Cu, Ag or other metals. A soldering material and a barrier layer (e.g., Ni) may be used between the metal electrodes and the thermoelectric pillars. Both sides of the devices may be covered by electrically insulating materials.

Figure 2:
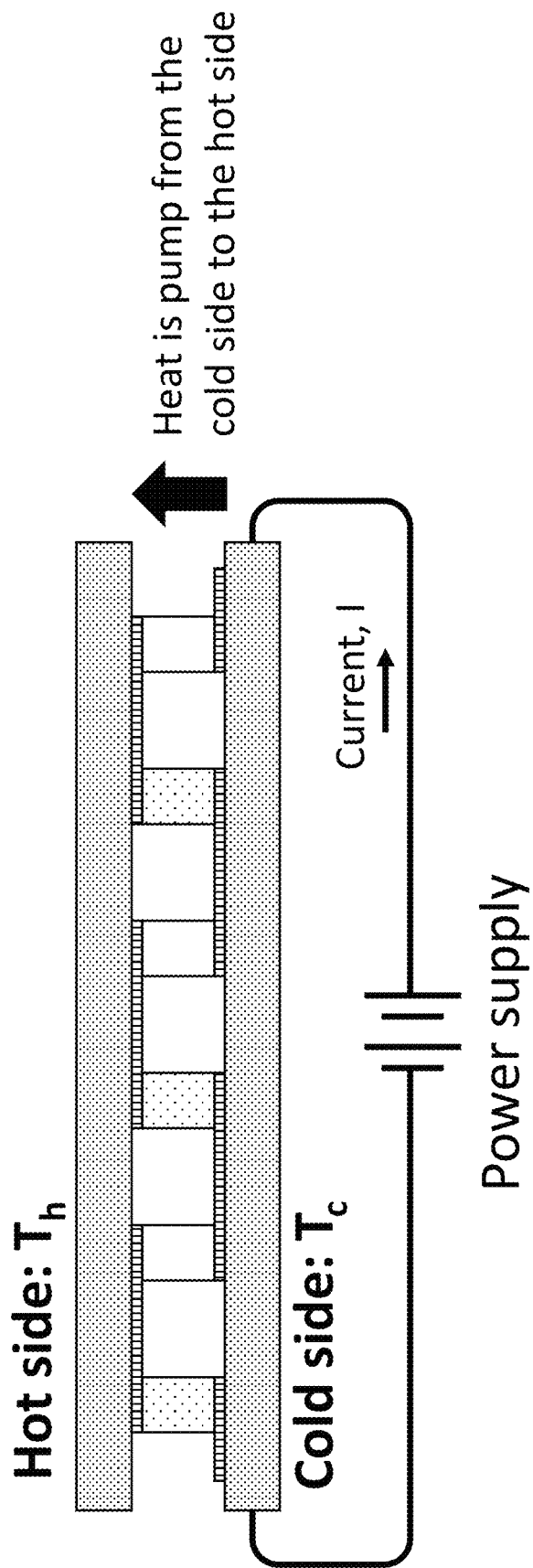
FIG. 2 depicts another example of a thermoelectric device used for heating and/or cooling, or pumping heat from the bottom side to the top side, in accordance with some example embodiments.

FIG. 2 shows a schematic of the TE device used as a heater/cooler. Here, a power supply, such as a battery, is connected to the TE device to supply electrical current. One side of the device will be cooled (the bottom side shown in the schematic) while the other side will be heated up. The thermoelectric device pumps the heat from the cold side to the hot side. The heat pumping is caused by the Peltier effect, which may be expressed as the heat flux to be pumped (Q) is proportional to the applied current through the Peltier coefficient (Q=Π*I). The Peltier coefficient and Seebeck coefficient are related through the Kelvin relationship: Π=ST.

For both the power generation and cooling/heating modes, the performance of a thermoelectric device depends on both the material properties of the thermoelectric pillars and the thermal design of the device. For the material properties, the most important factor is a thermoelectric figure of merit, which may be expressed as:

$$ZT = S^2 \sigma T / \kappa,\qquad \text{Equation 1.}$$

where S is the Seebeck coefficient, $\sigma$ is the electrical conductivity, $\kappa$ is the thermal conductivity, and T is the absolute temperature. ZT is related to the efficiency of power generation and the coefficient of performance (COP) of cooling/heating. For example, some thermoelectric materials have a ZT of approximately 0.6 to 1.0 at room temperature.

Besides the material properties of the thermoelectric pillars, thermal design is also crucial to achieve high device performance. For most applications, the thermal conductance of the device should match well with the heat flux and the temperature difference between the cold and hot sides (FIGS. 1 and 2). The thermal conductance of the device is written as:

$$G = N_p \kappa_p (A_p/l) + N_n \kappa_n (A_n/l),\qquad \text{Equation 2}$$

where N, A, and l are the number of pillars, cross-sectional area of each pillar, and length of the pillars, respectively. The subscripts p and n denote the p-type and n-type thermoelectric pillars, respectively. Additionally, the power factor of the device, $S^2\sigma$, should also match well with the heat flux of the particular applications.

In some example embodiments, two thermal issues are considered including: (1) the heat flux from the skin (Q), or the metabolic rate of a person (e.g., for an average person Q is approximately 50-80 $W/m^2$. This is the heat flux that needs to be removed in the cooling/heating mode, or the heat flux to be utilized for power generation in the generator mode. (2) If no active heat sink is used, the heat transfer coefficient between the device and the air (h) is approximately 9-16 $W/m^2$-K, where the radiation heat transfer may contribute approximately 5-6 $W/m^2$-K and natural convection may contribute to about 4-10 $W/m^2$-K. If a wearable device is in motion (walking or running), the convection heat transfer coefficient may be substantially higher. These parameters indicate that the temperature drop at the device/air interface will be at around 5 K. If the thermal conductance (G) of the thermoelectric device is not low enough to yield an appreciable temperature drop compared to 5 K, then the device performance will be diminished by the relatively poorer device/air interfacial heat conduction.

Figure 3:
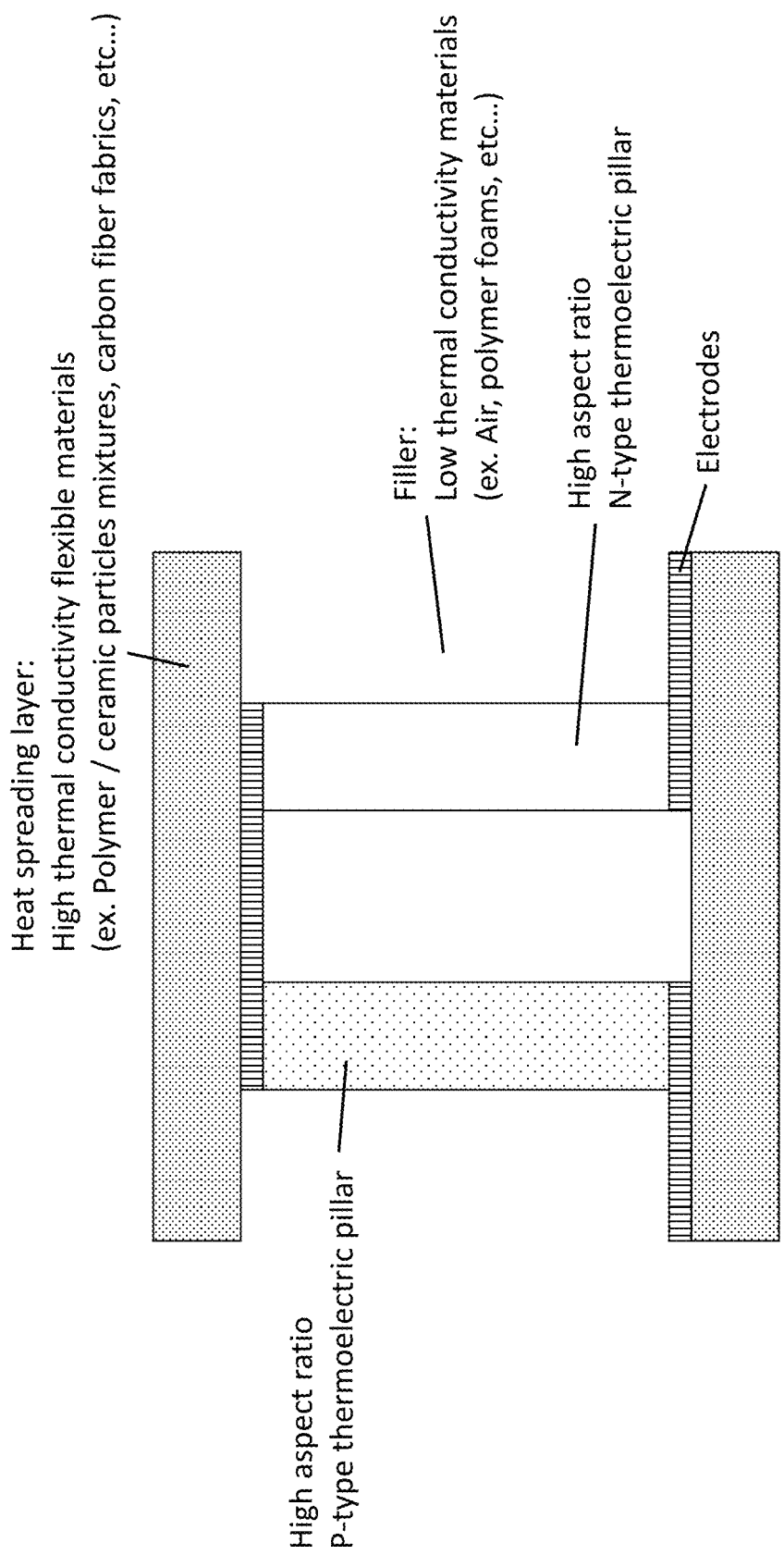
FIG. 3 depicts an example of a thermoelectric device to achieve heating/cooling and/or power generation without the use of a heat sink or a fan, in accordance with some example embodiments.

FIG. 3 shows a thermoelectric device that achieves high-performance cooling/heating and power generation without the use of a heat sink. In FIG. 3, the P- and N-type pillars have a high aspect ratio, which is the ratio between the height and the width of the pillars. The device has a very low filling density, or areal packing density, of pillars. Both of these may lead to low thermal conductance of the device (G). To yield an appreciable temperature drop (e.g., $\Delta T$~5 K) across the device for the given metabolic rate (Q~60 $W/m^2$), the minimum thermal conductance (G) is approximately 10-12 $W/m^2$-K.

Figure 4:
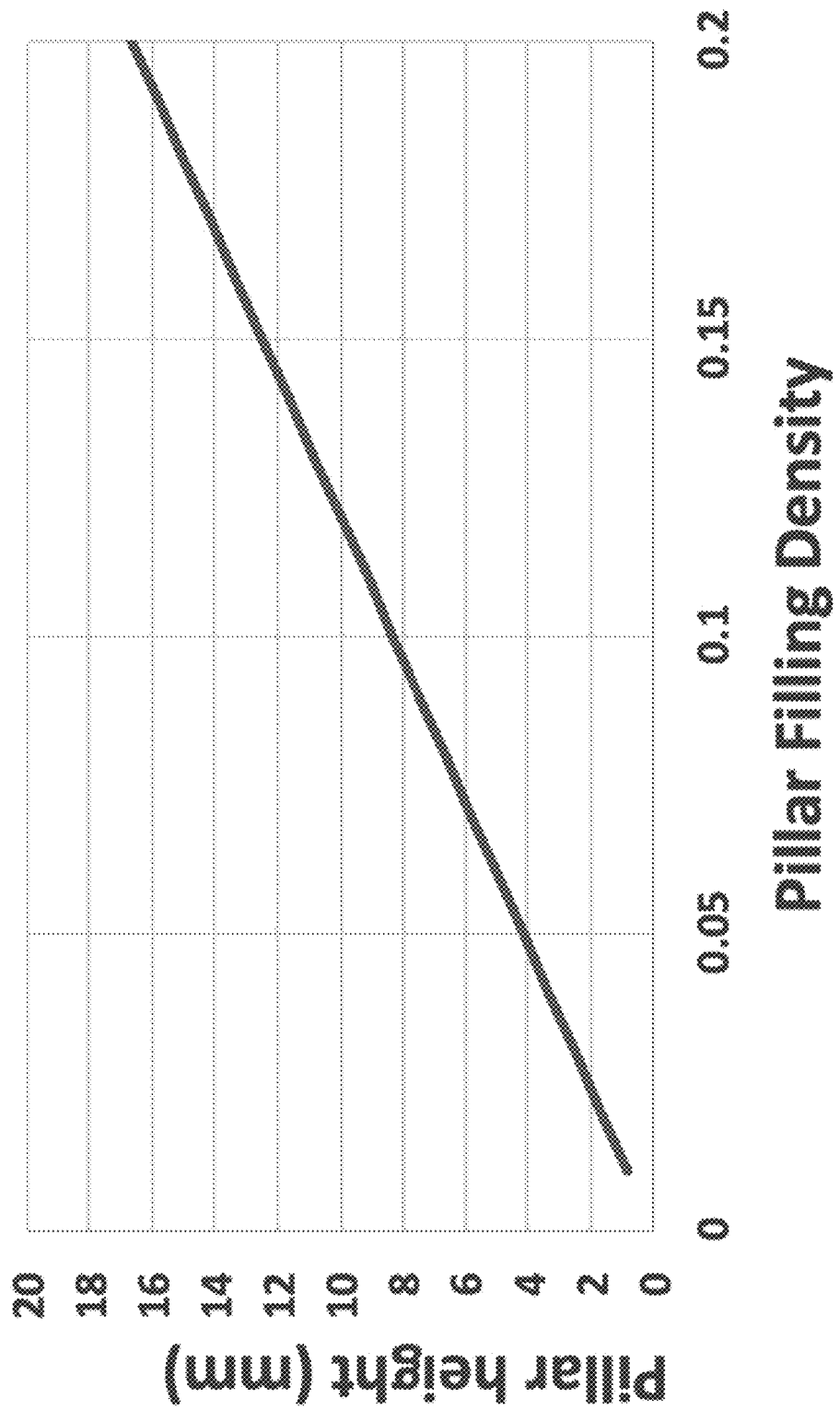
FIG. 4 depicts an example of a pillar height as a function of pillar filling density, or areal packing density, to achieve a thermal conductance (G) of 12 W/m2-K where the thermal conductivity of the pillars is 1.0 W/m-K, in accordance with some example embodiments.

FIG. 4 shows pillar height (in mm) as a function of pillar areal packing density, in order to achieve a thermal conductance (G) of 12 $W/m^2$-K. Considering most thermoelectric materials have a thermal conductivity (k) of ~1.0 W/m-K, the areal packing density of the pillars may be less than 10% and the height of the pillars may be greater than ~3 mm. Given the fact that a very thick thermoelectric device is not desirable for wearable applications, it is then necessary to limit the device thickness to less than ~5 mm, which has a corresponding pillar filling density of less than approximately 7%. As an example, devices with pillars of 1×1 $mm^2$ in cross section and 3.5 mm or 5.0 mm height and pillar-to-pillar spacing of 4.0 mm (corresponding to a pillar filling density of 6.25%).

FIGS. 5A-B depict simulation of the operation of a TE cooler (TEC), in accordance with some example embodiments. In the example of FIGS. 5A-5B, the multiphysics finite element analysis software tool COMSOL was used. FIG. 5A shows the schematic of the structure modeled in COMSOL. In the simulation, one pillar is modeled. The filler material in the space between the hot and cold side is air with thermal conductivity of approximately 0.025 W/m-K. The pillar height is varied from 2 mm to 5 mm. FIG. 5B shows the simulated temperature drop as a function of the electrical current applied to the TEC, for TECs with various pillar heights (from 2 mm to 4 mm). The simulation results show that the device cooling performance is better, with larger temperature drop, for a device with thickness of greater than 4 mm, which is consistent with FIGS. 2 and 4.

Figure 6:
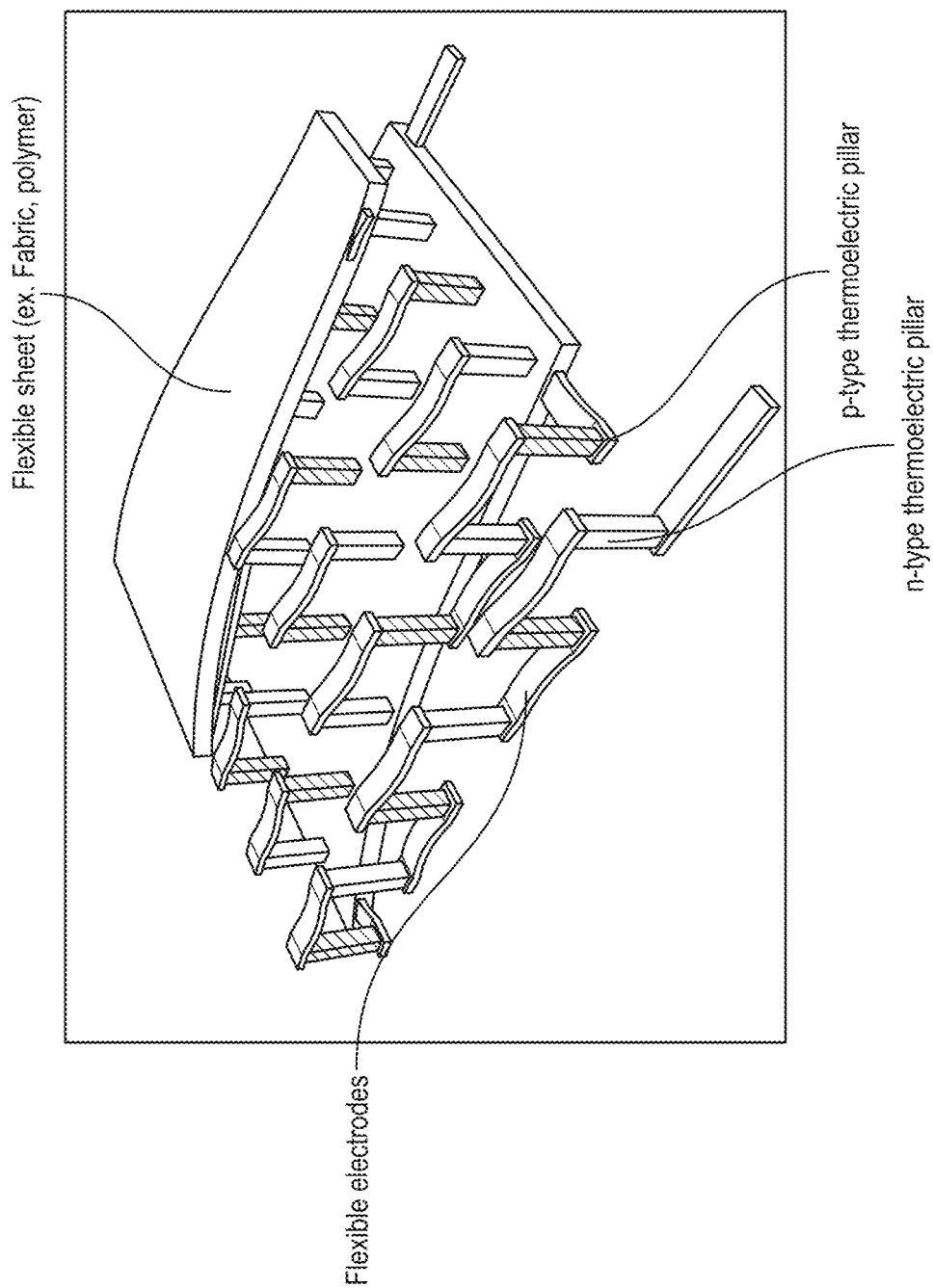
FIG. 6 depicts an example of a flexible thermoelectric device, in accordance with some example embodiments.

FIG. 6 depicts mechanical flexibility of the thermoelectric devices, even though the thermoelectric pillars are made of rigid materials. This allows the utilization of high-performance inorganic rigid thermoelectric materials, such as p-type Bi—Sb—Te alloys and n-type Bi—Te—Se alloys. This is achieved by using small thermoelectric pillars (e.g., equal to or smaller than ~2×2 $mm^2$) and embedding them into flexible matrix, such as polymers, elastomers, or fabrics. The TE pillars may be sandwiched by flexible sheets, such as those made of polymers, elastomers, or fabrics. In the example of FIG. 6, the TE pillars are surrounded by air, as numerically modeled in FIG. 5.

FIG. 6 depicts an example of a flexible thermoelectric device. One end of each pillar is anchored to a first flexible sheet and the other end of each pillar is anchored to a second flexible sheet. The flexible sheets may be may include fabrics and/or polymers. Empty space between the flexible sheets may be filled with low thermal conductivity materials (such as fabrics or polymer) as shown in FIG. 3, or be filled with air. The metal electrodes connecting the pillars may be made of flexible and/or stretchable metal ribbons, such as copper (Cu), aluminum (Al), or gold (Ag) ribbons, or ribbons made of other metals or other conductive materials. The contacts between the metal electrodes and the thermoelectric pillars may be made using a metallization process with an appropriate solder, or via a conductive adhesive or other conductive materials.

Figure 7:
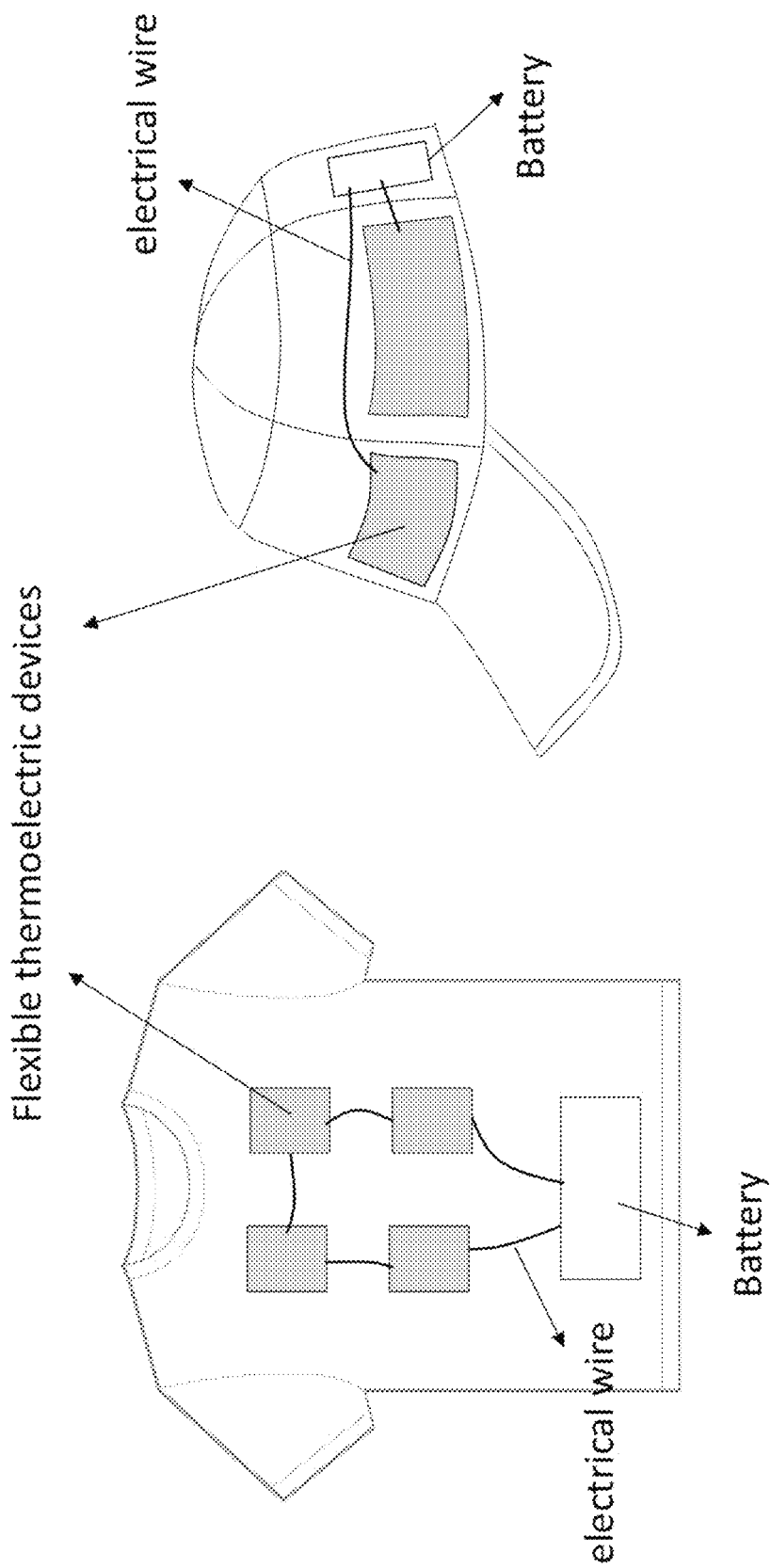
FIG. 7 depicts examples of flexible thermoelectric devices on clothing, in accordance with some example embodiments.

FIG. 7 depicts some of the possible locations to place flexible thermoelectric devices for power generation and/or cooling/heating, on clothes and/or on a hat. The devices can also be placed inside shoes (i.e., as an insole).

Figure 8:
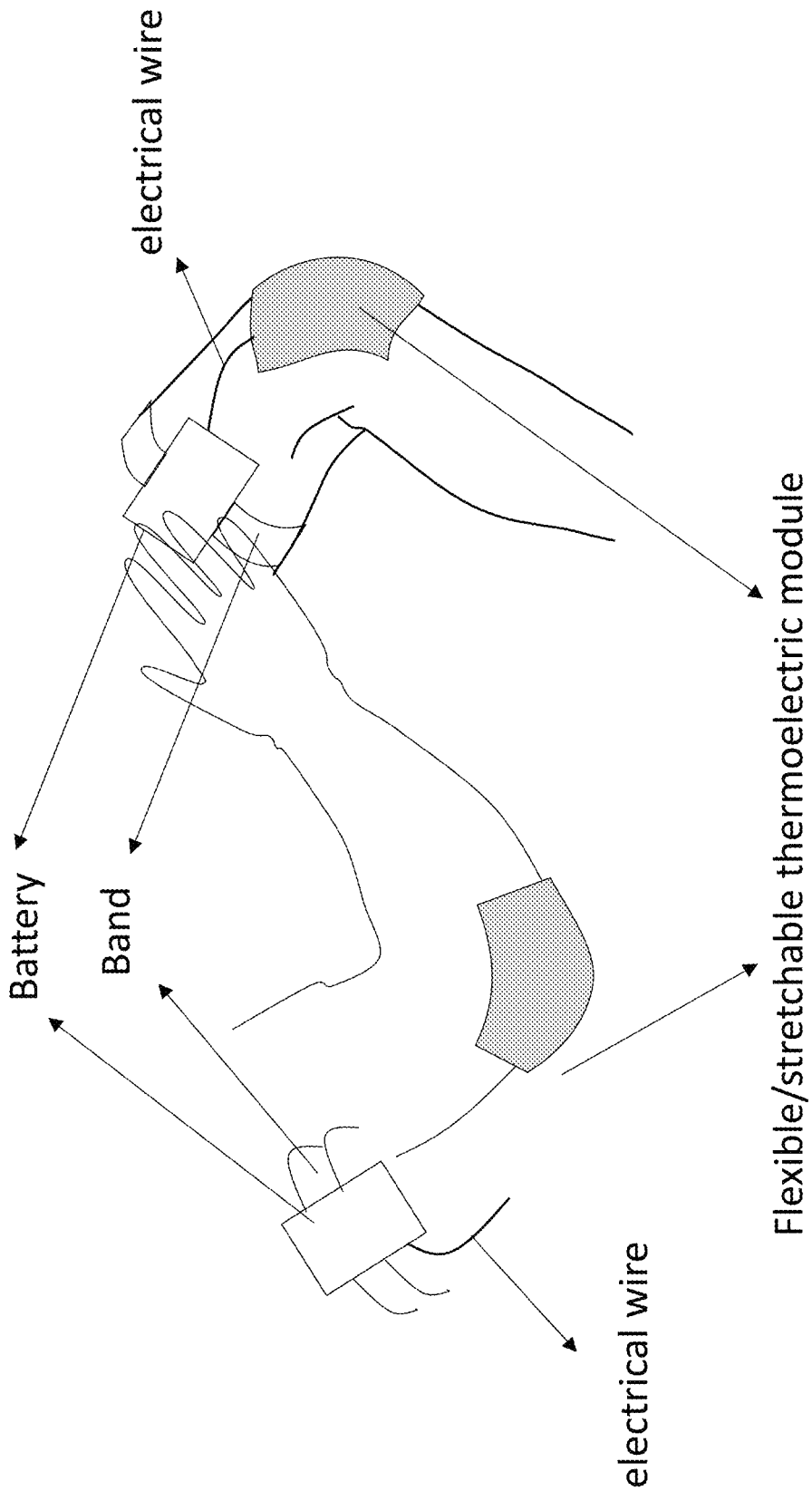
FIG. 8 depicts an example of a flexible thermoelectric device placed on skin, in accordance with some example embodiments.

FIG. 8 depicts flexible thermoelectric devices placed on skin on arms and other places on the body, such as the chest, back, neck, and so on. Anchoring the devices can be performed by using an armband or wristband or adhered to or integrated into clothes.

Figure 9B:
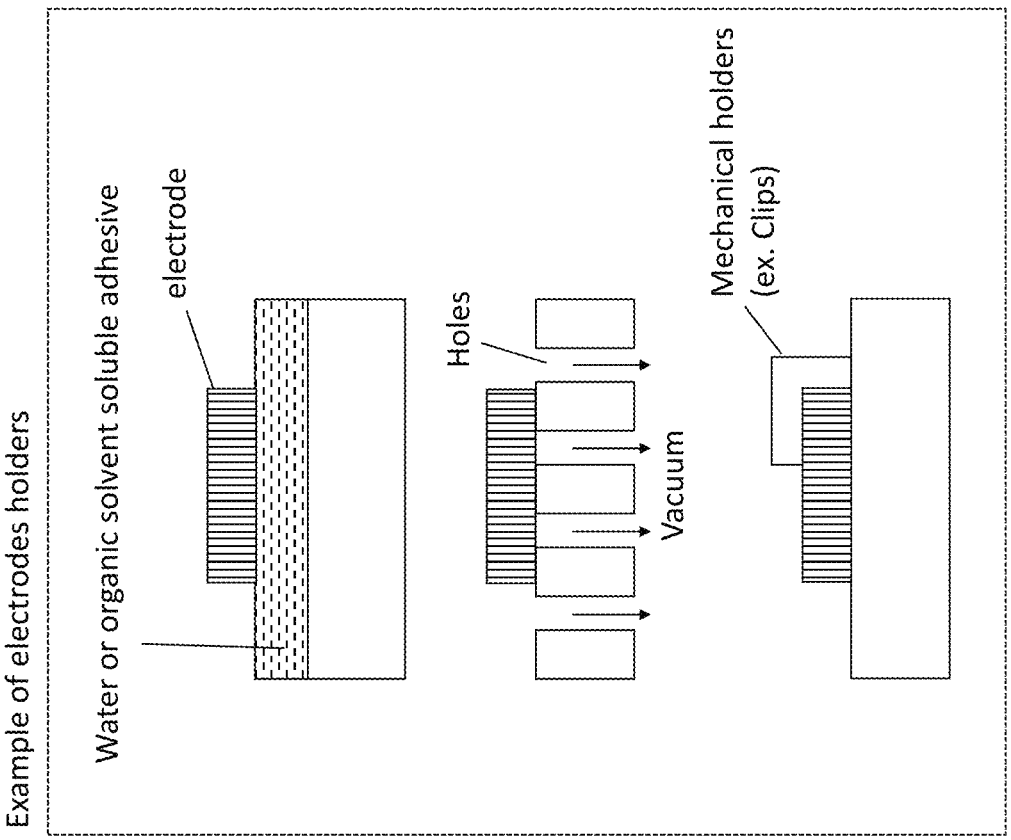
Figure 9C:
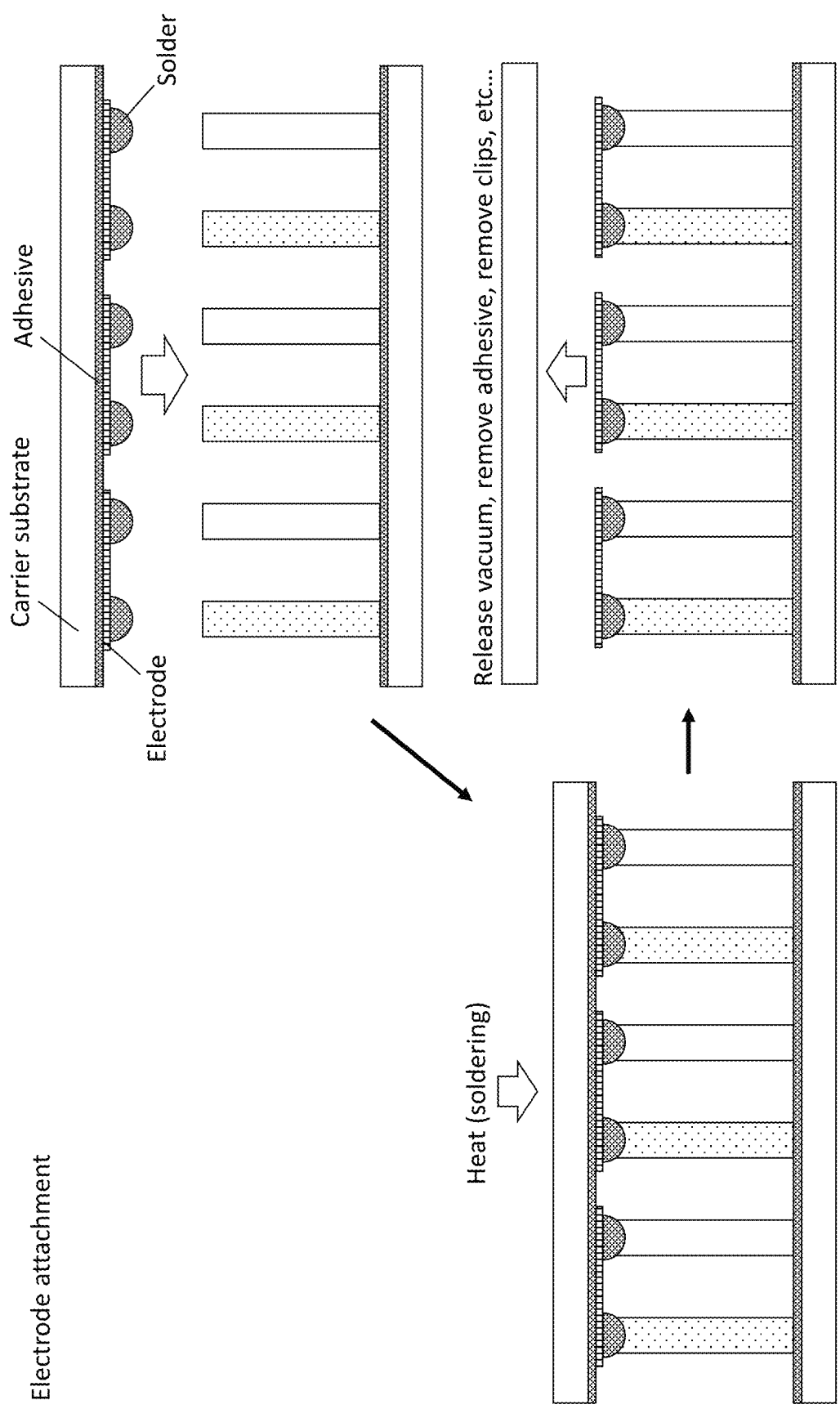
Figure 9D:
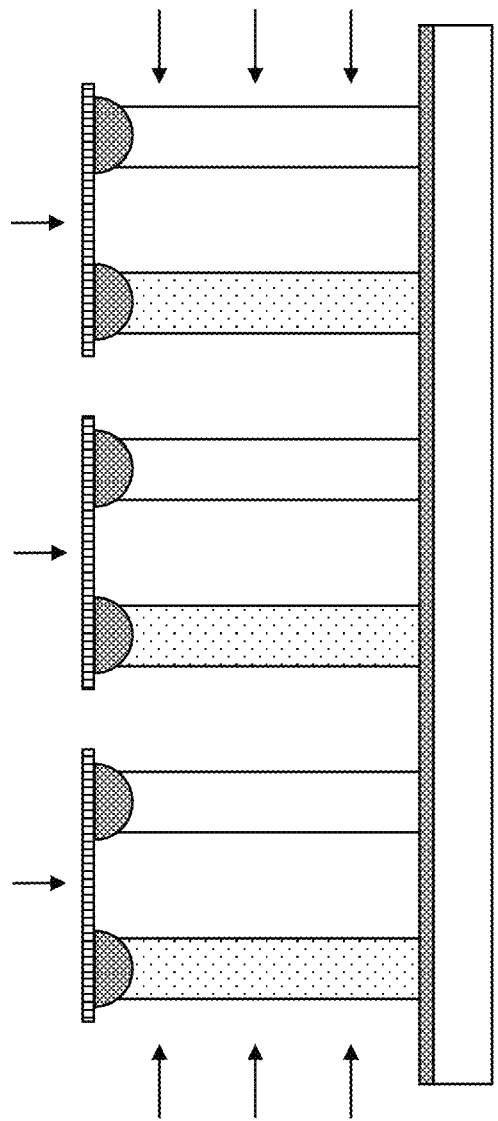
Figure 9E:
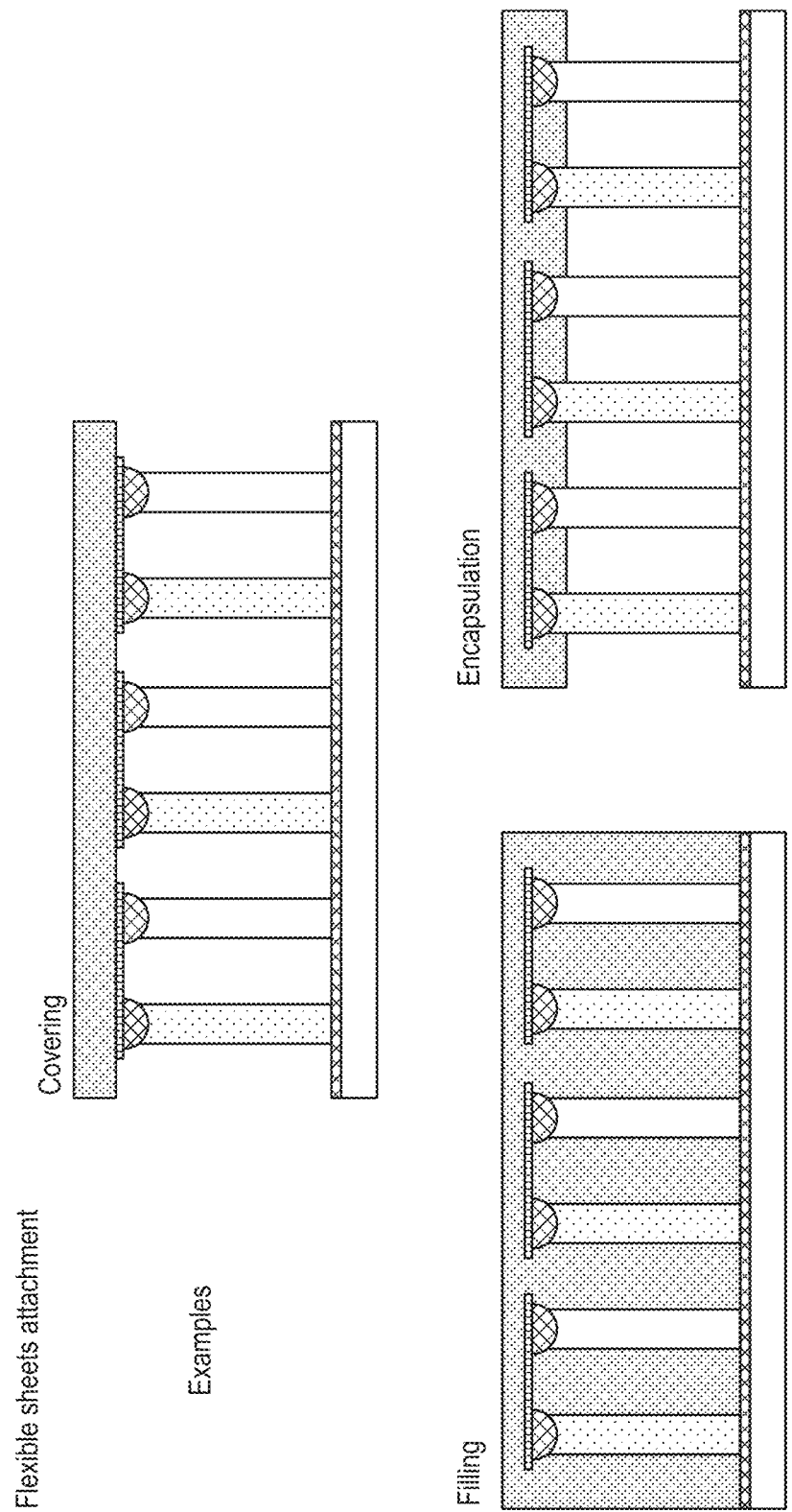
Figure 9F:
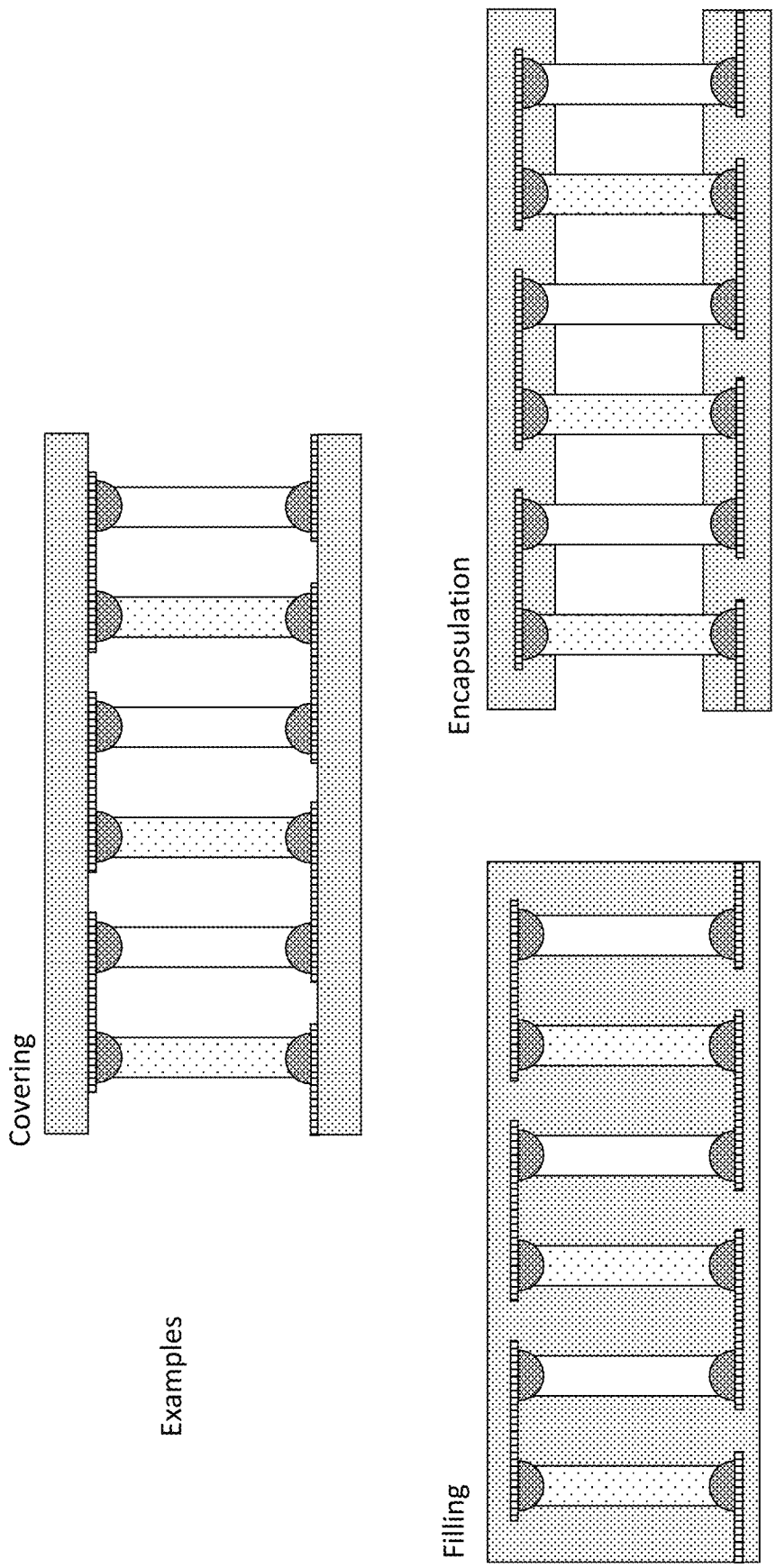

FIGS. 9A-F depicts a fabrication process for making flexible thermoelectric devices. FIG. 9A depicts preparing n-type and p-type thermoelectric pillars and anchoring them to a substrate. Holders such as adhesives, soldering pastes, or mechanical holders can be used to anchor the pillars. The pillar-to-pillar spacing may be determined based on the design of thermoelectric devices for a specific wearable application. FIG. 9B depicts preparing another substrate attached with ribbons of metal contacts and aligning the ribbons with the pillars. Adhesives, a vacuum, or a mechanical holder may be used to hold the metal contacts. FIG. 9C depicts transferring the metal ribbons onto the thermoelectric pillars. Solder may be applied to the top surface of the pillars or on the metal ribbons. The ribbons may be firmly bonded to the pillars after the soldering. The carrier substrate may then be removed. FIG. 9D depicts treating the surface of pillars and metal ribbons with adhesives for better adhesion of flexible sheets. FIG. 9E depicts a top flexible sheet that covers, encapsulates, or fills the top portion of the thermoelectric pillars and the top metal electrodes. A polymer sheet can be prepared by pouring and curing a mixture of PDMS and Ecoflex, or by attachment of a fabric. Polymer sheets or other flexible sheets may be made using other flexible materials. The top and bottom plates may be made of a high thermal conductivity material such as a polymer/ceramic mixture or carbon fiber while the space surrounding the pillars and between the top and bottom plates may be either empty (i.e, filled with air), or filled with materials with low thermal conductivity such as porous polymer or porous dielectric materials. FIG. 9F depicts repetition of the processes from B to E to make the bottom metal electrodes and flexible sheet.

Figure 10:
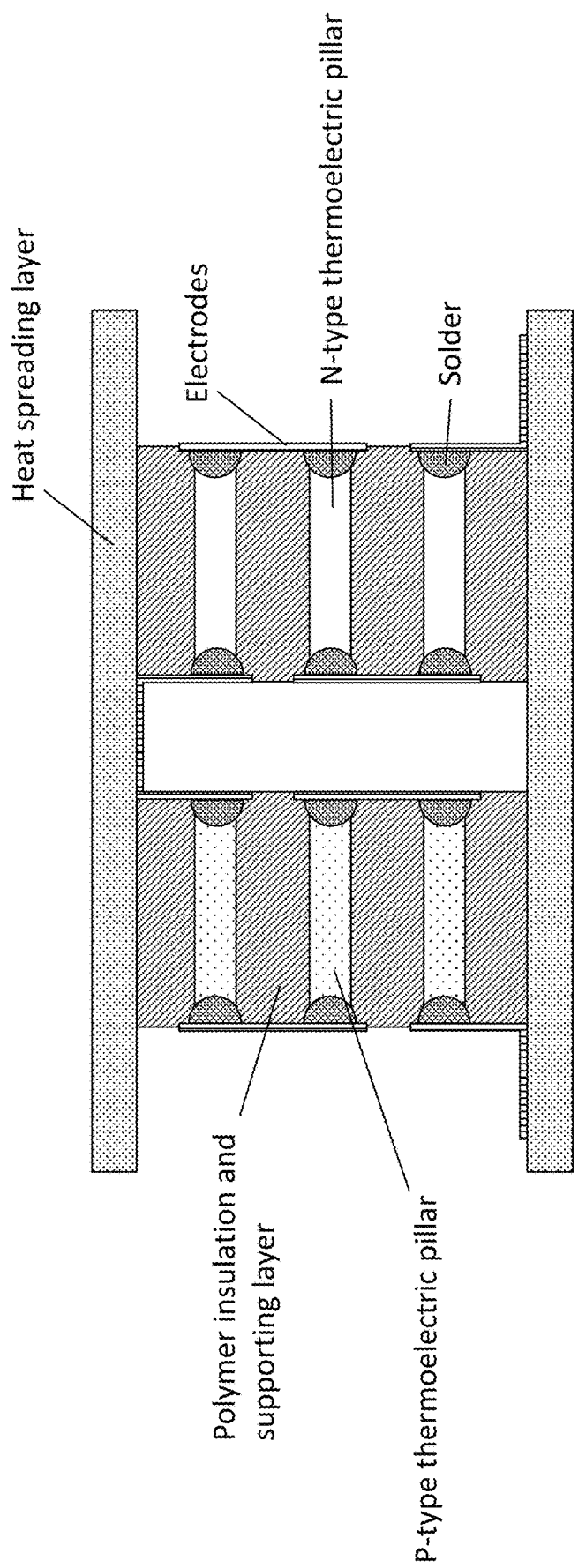
FIG. 10 depicts an example of a thermoelectric device with an increased aspect ratio, where multiple n-type or p-type segments are electrically connected to increase the effective height of the pillars (compared to single pillars), in accordance with some example embodiments.

FIG. 10 depicts an example of a thermoelectric device with an increased aspect ratio, where multiple n-type or p-type segments are electrically connected to increase the effective height of the pillars (compared to single pillars), in accordance with some example embodiments. The segments within the pillars can be arranged horizontally or with an angle between 0 and 90° with respect to the vertical direction. In some implementations consistent with FIG. 10, a smaller overall TE device thickness is achieved by using a zig-zag TE structure of the TE pillars. The example of FIG. 10 maximizes the aspect ratio of the pillars, and eventually may reduce the thermal conductance of pillars that usually dominates the total thermal conductance between the top and bottom plates. The design also can improve mechanical strength of thermoelectric device by absorbing external stress with the zig-zag structure like a spring. Moreover, the device can be thinner than the design shown in FIGS. 3 and 6.

Figure 11:
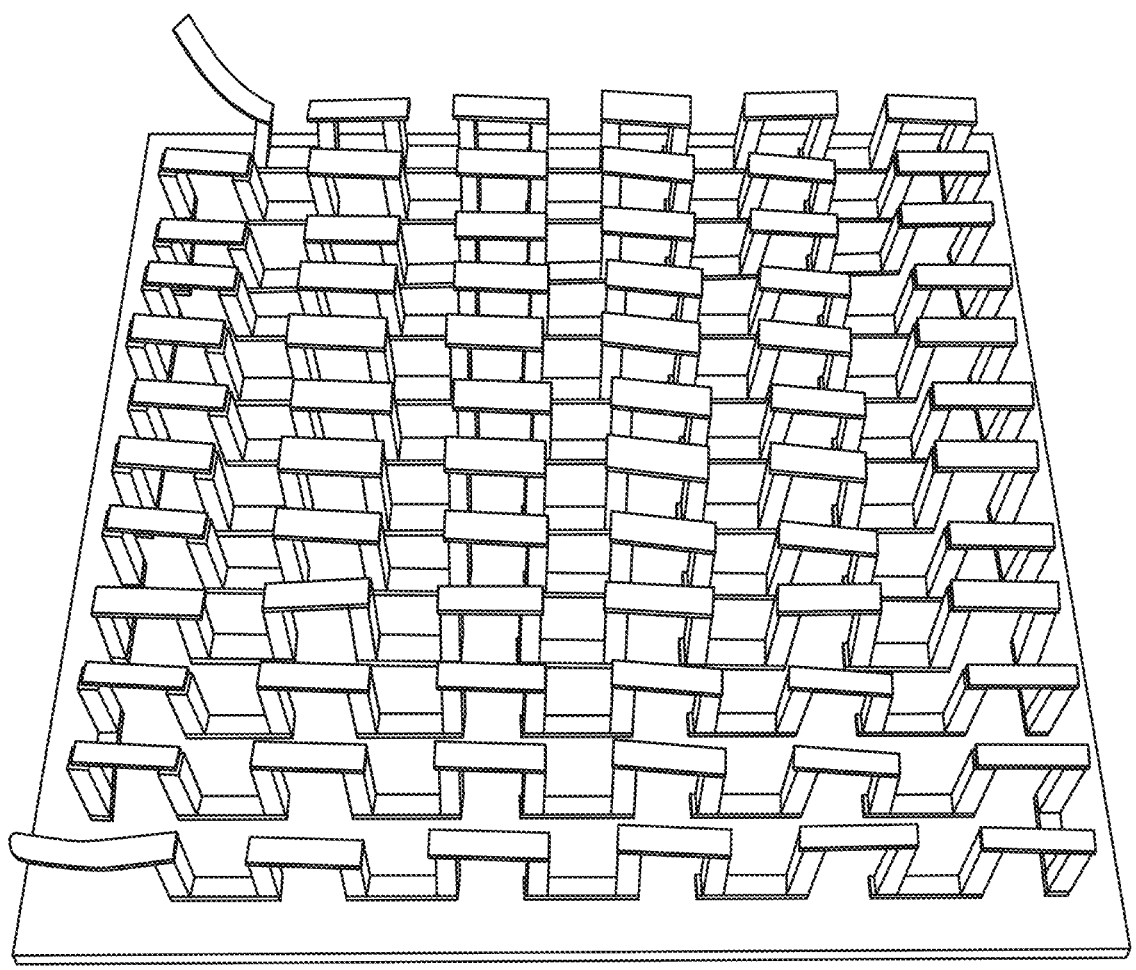
FIG. 11 depicts an example of a photograph of thermoelectric pillars attached to flexible metal electrodes, in accordance with some example embodiments.

FIG. 11 shows a photograph of arranged thermoelectric pillars, after attaching the top metal electrodes.

FIG. 12A shows a schematic and FIG. 12B shows a photograph of a flexible thermoelectric device made from the processes described in FIG. 9. In the example of FIGS. 12A-B, the top and bottom polymer layers are made of Ecoflex/PDMS mixture with no fillers.

Ecoflex/PDMS mixture is flexible. Accordingly, the polymer is transparent. Other polymeric and elastomeric materials can be used to make the flexible sheets.

FIGS. 13A-B depict another diagram and another photograph of a flexible thermoelectric device with high thermal conductivity fillers in a polymeric or elastomer sheets, in accordance with some example embodiments; The fillers are made of high thermal conductivity micro and nano-scale particles with particle sizes ranging from 1 nanometer to 100 microns. FIGS. 13A-B depict increasing the lateral thermal conductivity of the polymer sheets.

FIG. 13A shows a schematic of adding a high thermal conductivity filler in the Ecoflex/PDMS polymer to enhance the heat spreading capability of the polymer layer. Example of the fillers include BN, AlN, SiC, and other high thermal conductivity materials. The shapes of the fillers may be irregular powder, spherical particle, rods, and other shapes.

FIG. 13B depicts a photograph of device showing the polymer layers with embedded AlN particles. The polymer layers may become opaque or white after adding the dielectric AlN micro and nano powders.

Figure 14:
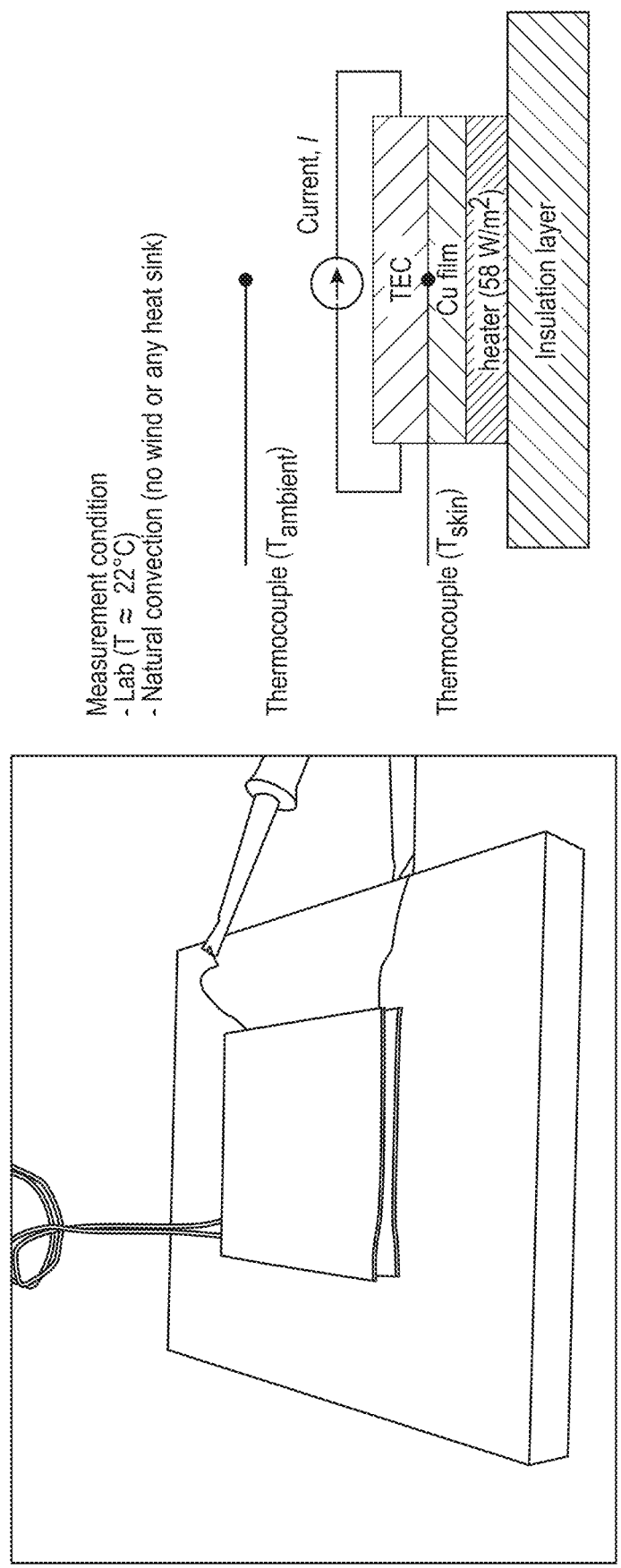
FIG. 14 depicts an example of an experimental setup to measure the heating, cooling, and power generation effects of a thermoelectric device, in accordance with some example embodiments.

FIG. 14 depicts an example of a test setup to measure the performance of flexible thermoelectric devices for both power generation and cooling/heating. The device operation modes are the same as what is shown in FIGS. 1 and 2. A heater with a power density of ~50-100 W/m² may be used to simulate the metabolic heat from human body. In the example of FIG. 14, the bottom of the heater is thermally insulating material to prevent heat loss to the substrate. The heat flux may be calibrated with a heat flux sensor. In the example of FIG. 14, no heat sink is used during the measurement. Heat dissipation from the device to the air is solely due to radiation and natural convection.

Figure 15:
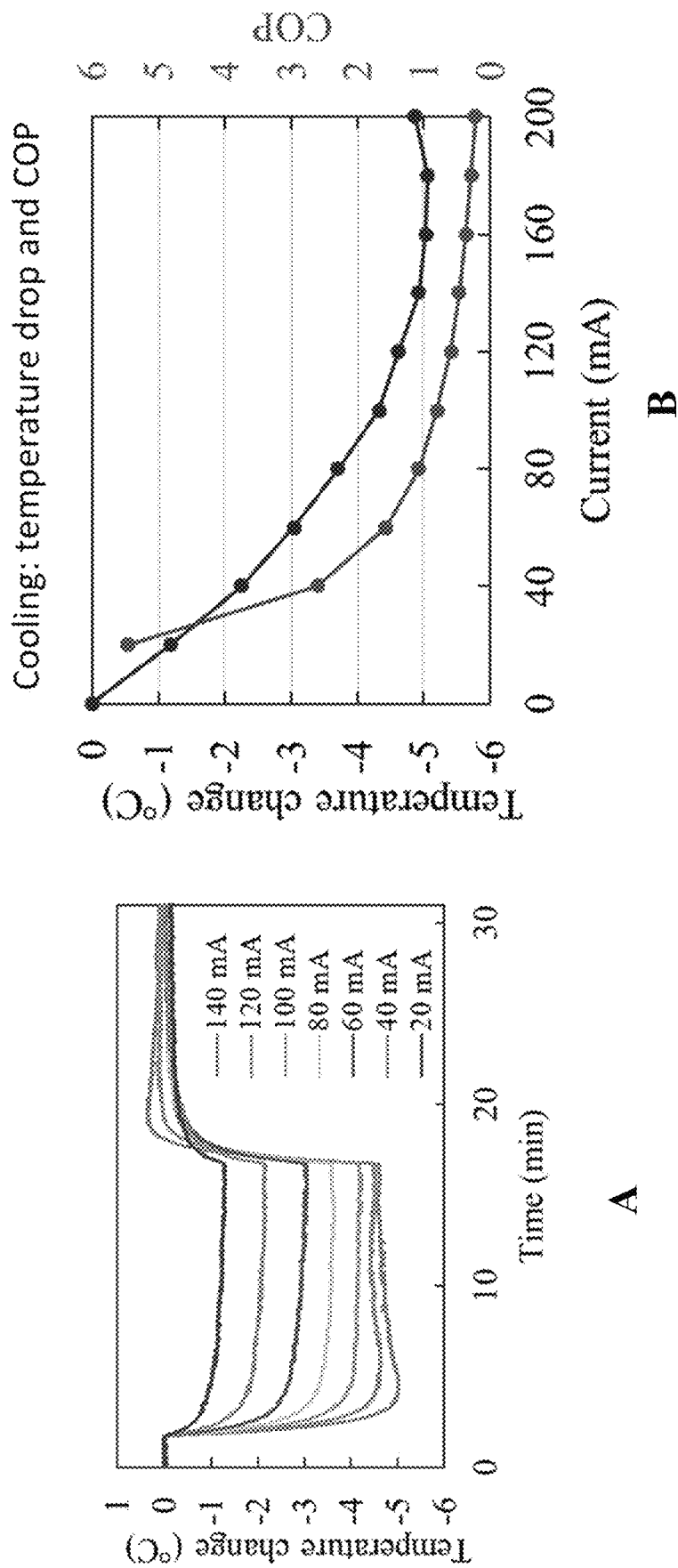
FIGS. 15A-B depict examples of heating and cooling performance of a flexible thermoelectric device, in accordance with some example embodiments.

FIG. 15A depicts an example of cooling performance of a flexible thermoelectric device on flat insulation layer with ~80 W/m² of heater power density. In this example, the cooling is stable after the initial first minute. During the steady state, the cooling is sustainable over a long period of time. For example, periods of cooling over 8 hours have been performed using a AAA battery. Longer periods are possible with a higher-capacity power source. In the example of FIG. 15A the current is switched on at approximately after two minutes and switched off after approximately 18 minutes. FIG. 15B depicts an example of a stable temperature drop vs. the applied electrical current. In this example, a sustainable temperature reduction of ~5° C. is achieved with a current of 0.14 A to 0.16 A. A higher current may lead to a smaller temperature drop due to the joule heating in the TE devices. The right axis of FIG. 15 B shows an example of a coefficient of performance (COP) of an example device while cooling. The COP may reflect the additional heat flux removed from the heater to the environment due to the TE device divided by the supplied electrical power. In the example of FIG. 15B, a high COP (e.g., >1.0) can be achieved for a temperature drop of ≤~4 degrees C.

Figure 16:
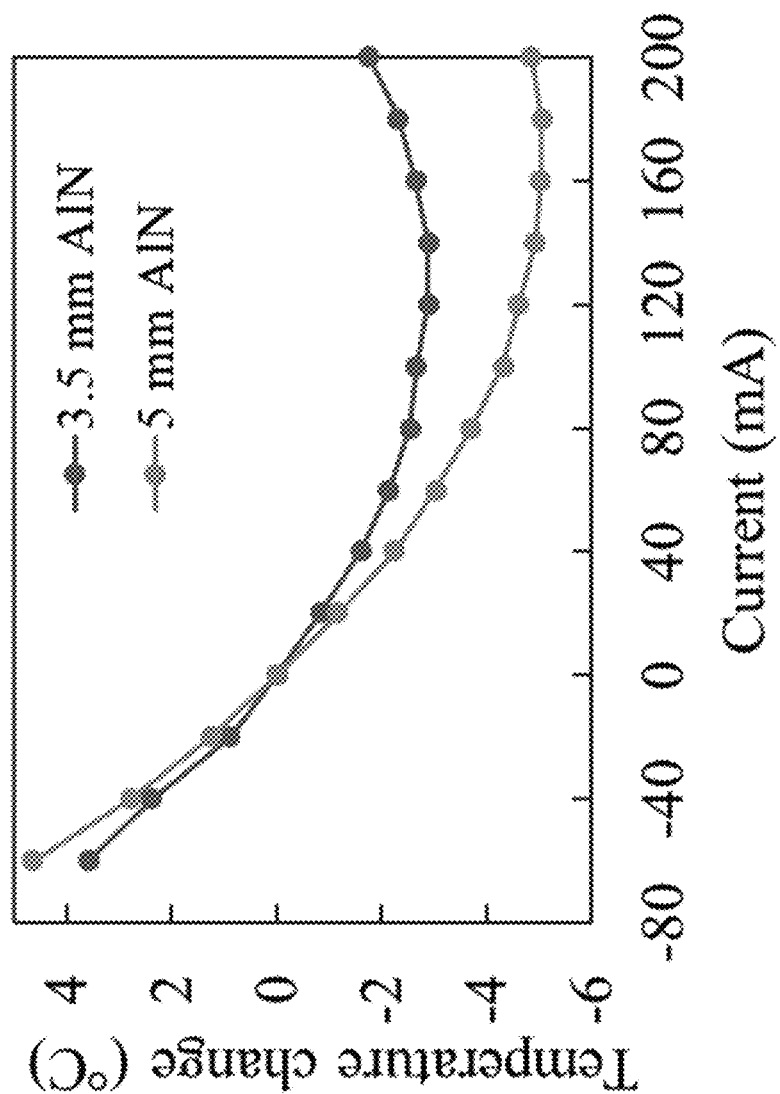
FIG. 16 depicts an example of an effect that pillar height has on cooling performance, in accordance with some example embodiments.

FIG. 16 depicts an example of the effect of the pillar height (3.5 mm vs 5 mm) on the cooling performance of the flexible TEC. In this example, the heat flux is ~80 W/m² and the filler material in the polymer sheets is AlN powder.

Figure 17:
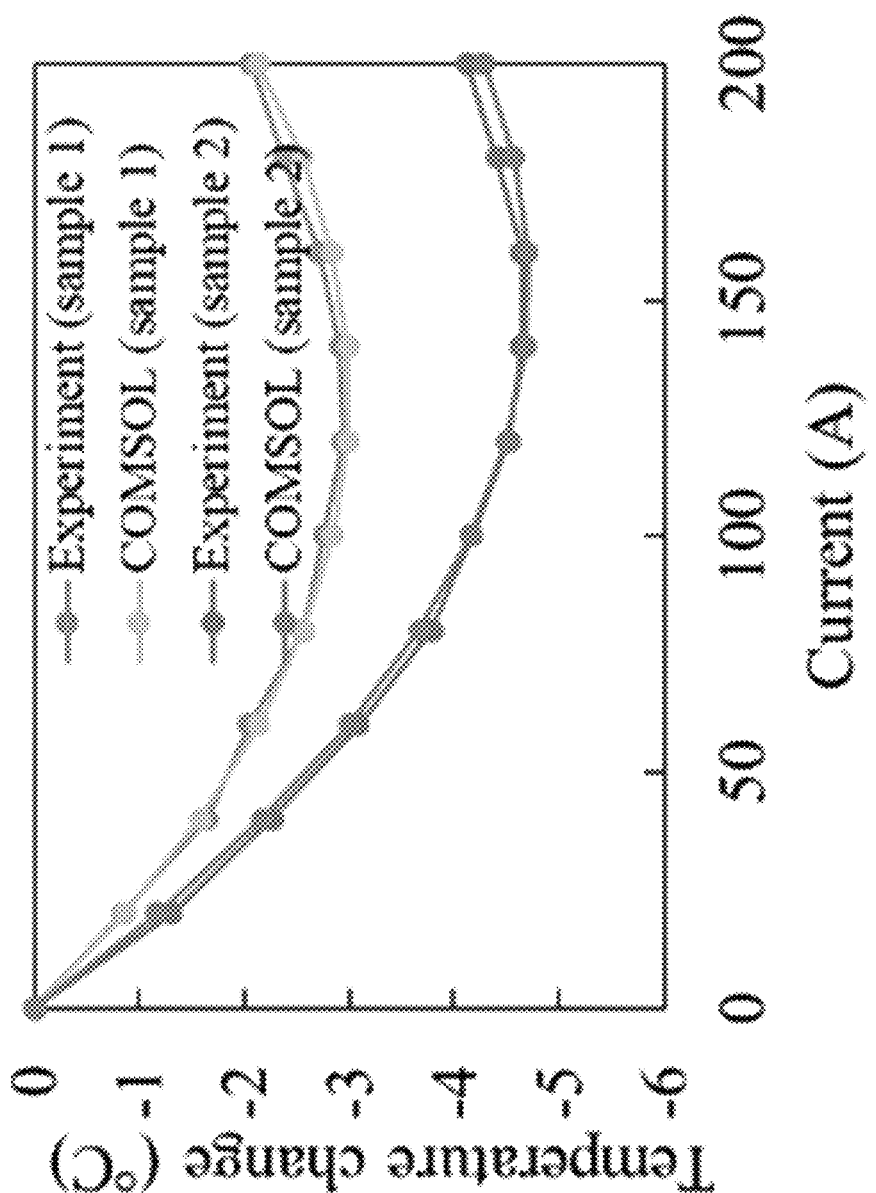
FIG. 17 depicts an example of a comparison of simulation results (using COMSOL, a finite element analysis software program) to experimental results, in accordance with some example embodiments.

FIG. 17 depicts an example of measured current vs. temperature change compared to the results from finite element analysis simulations using COMSOL.

FIGS. 18A-C shows examples of infrared (IR) camera images of a TE device suspended on plastic pillars. FIG. 18A shows an example of an experimental setup of the TE device suspended by plastic pillars, such that no heat sink is applied to the hot side. FIG. 18B shows an example of an IR image of the cold (top) side of the TE device while cooling. FIG. 18C shows an IR image of the hot (top) side of the TE device while heating.

FIGS. 19A-B show some examples of parameters that may be adjusted to achieve mechanical flexibility of the TE devices that may include rigid TE pillars. FIG. 19A shows the TE device when flat and FIG. 19B shows the TE device when bent. When bent, the flexible polymer or fabric layer will be stretched at the top layer and/or contracted at the bottom layer and the TE pillars will be rigid. The electrodes (e.g., thin metal sheets) may also be flexible to accommodate stretching and/or contracting.

FIG. 20A depicts a flexible thermoelectric device on a curved insulation layer with bending radii of 3 cm and 4 cm, respectively. FIG. 20B depicts an example of temperature change vs. current into the flexible thermoelectric device on the curved insulation layer. The cooling of the flexible thermoelectric device is unchanged by bending.

FIG. 21A depicts a flexible thermoelectric device bent at different radii. The resistance of the thermoelectric device does not change, or changes little, as a function of the bending. FIG. 21B depicts normalized resistance as a function of bending radius of the thermoelectric device.

FIG. 22A depicts an example flexible thermoelectric device that is repeatedly bent as shown for 1000 cycles. FIG. 22B depicts the device resistance as a function of number of bending cycles. The resistance does not change appreciably over the 1000 cycles of bending in both the X and Y directions.

Figure 23:
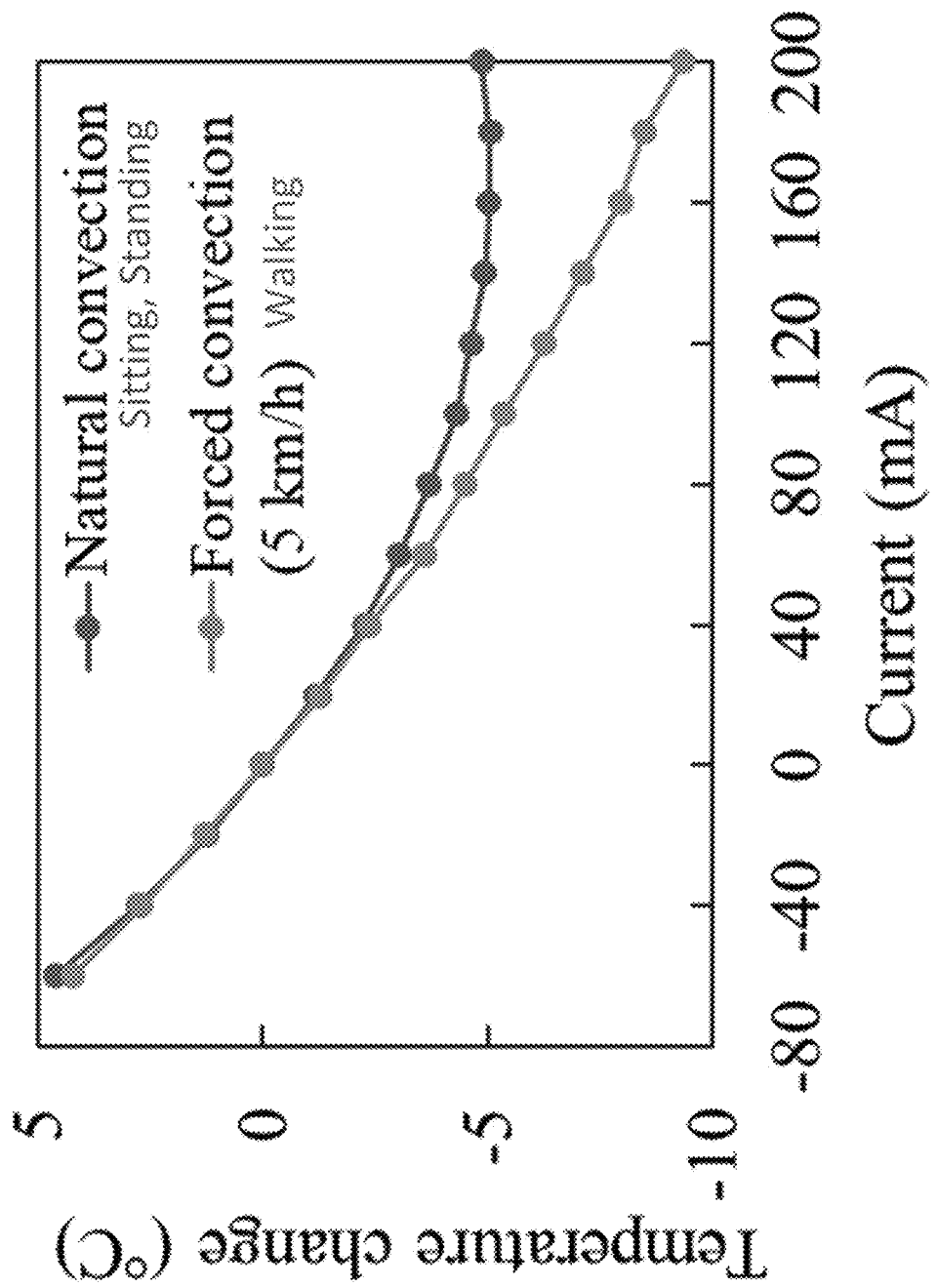
FIG. 23 depicts an example of cooling performance of a flexible thermoelectric device with natural convection and forced convection, in accordance with some example embodiments.

FIG. 23 depicts an example of cooling performance of a TE device which may be enhanced by air passing over the device with an air speed of 5 km/h. This air speed is less than the typical wind speed experienced during walking. This low-speed air can improve the cooling effect by ~50% to ~100%. In this example, the temperature drop is increased to ~10° C. at a current of 0.2 A.

Figure 24:
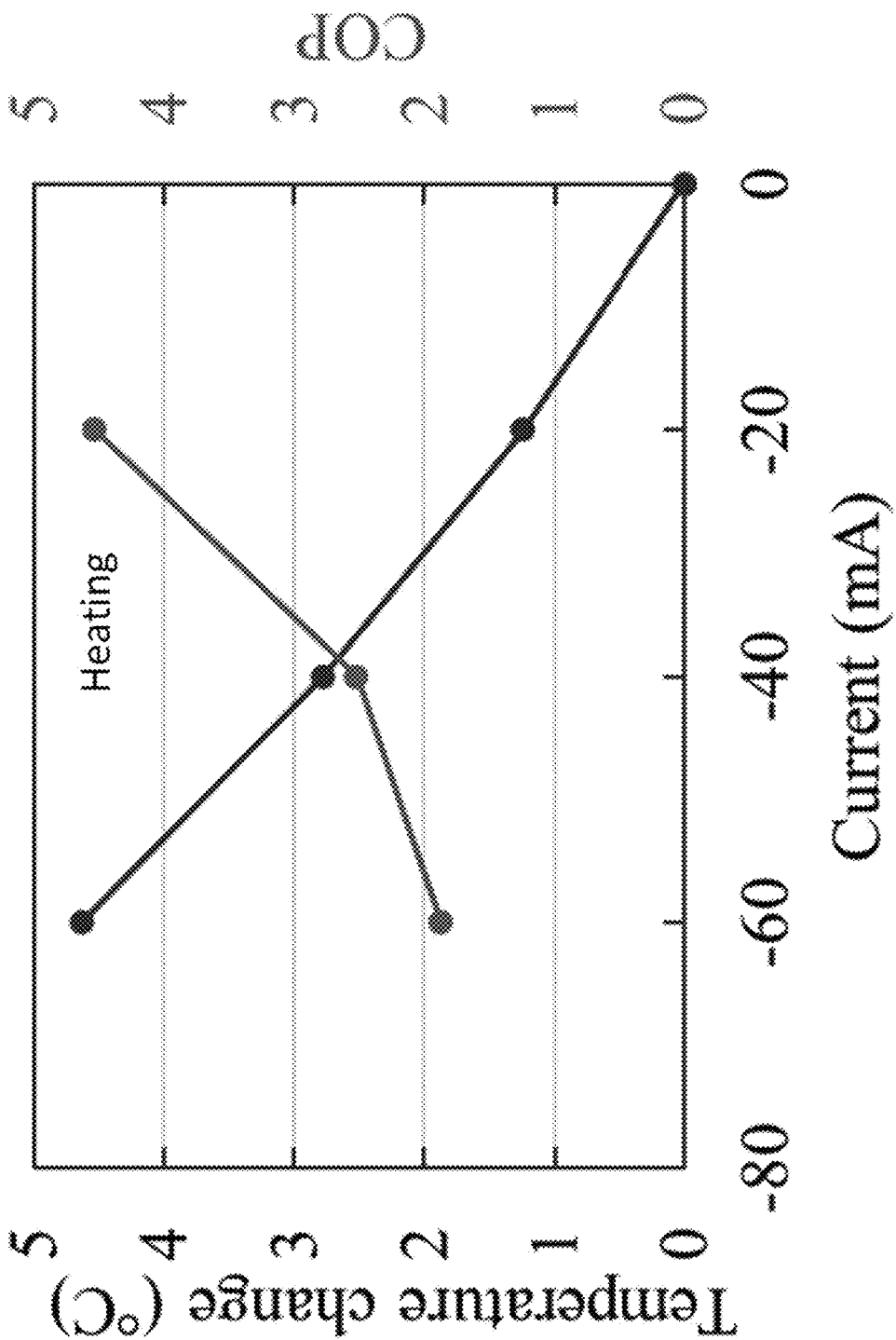
FIG. 24 depicts an example of a plot of a coefficient of performance (COP) and temperature of a flexible thermoelectric device, in accordance with some example embodiments.

FIG. 24 depicts an example of the heating performance of an example TE device. In particular FIG. 24 shows temperature change and COP as a function of current applied to the device. FIG. 24 depicts temperature change with natural convection. The setup used in FIG. 24 is the same as in FIG. 14, but with the electrical current applied in the reverse direction.

FIG. 25A depicts an example of a flexible thermoelectric device worn on a person's arm. In the example of FIG. 25B, a temperature reduction of ~3° C. may be achieved with a current of 0.14 A to 0.16 A. The cooling effect on skin is reduced by ~30% due to the small surface area of the flexible thermoelectric device (approx. 25 cm²) compared to human skin (~1.8 m²), and parasitic heat transfer through the skin.

FIG. 26A-B depicts cooling on the arm similar to FIGS. 25A-B. In the example of FIG. 26A-B, a proportional-integral-derivative (PID) controller may be used to regulate the applied current to the thermoelectric device such that the skin temperature is kept at a set point temperature. For example, the skin temperature can be kept at a constant 31° C. with the PID controlled thermoelectric cooling even when the ambient temperature changes from 24 to 32° C. In this example, on the skin that is not covered with the thermoelectric cooler, the skin temperature changes from 30 to 33° C. for the same ambient temperature fluctuations.

FIG. 27A-B depicts an example of integration of a flexible TE device into an armband. FIG. 27A depicts a schematic of the armband with a TE device. FIG. 27B depicts a photograph of the armband worn by a person.

FIGS. 28A-B depict an example of measured skin cooling performance of an armband in an indoor environment (e.g., in a laboratory with AC controlled ambient temperature of 32.5° C. and no wind) where the wearer was not moving. FIG. 28A shows the measured temperature drop on the skin as a function of applied current to the TE device in the armband. FIG. 28B shows the measured skin temperature vs time under different applied current. In this example, the lowest skin temperature achieved was ~30° C., demonstrating the active cooling of 2.5° C. below the ambient temperature.

Figure 29:
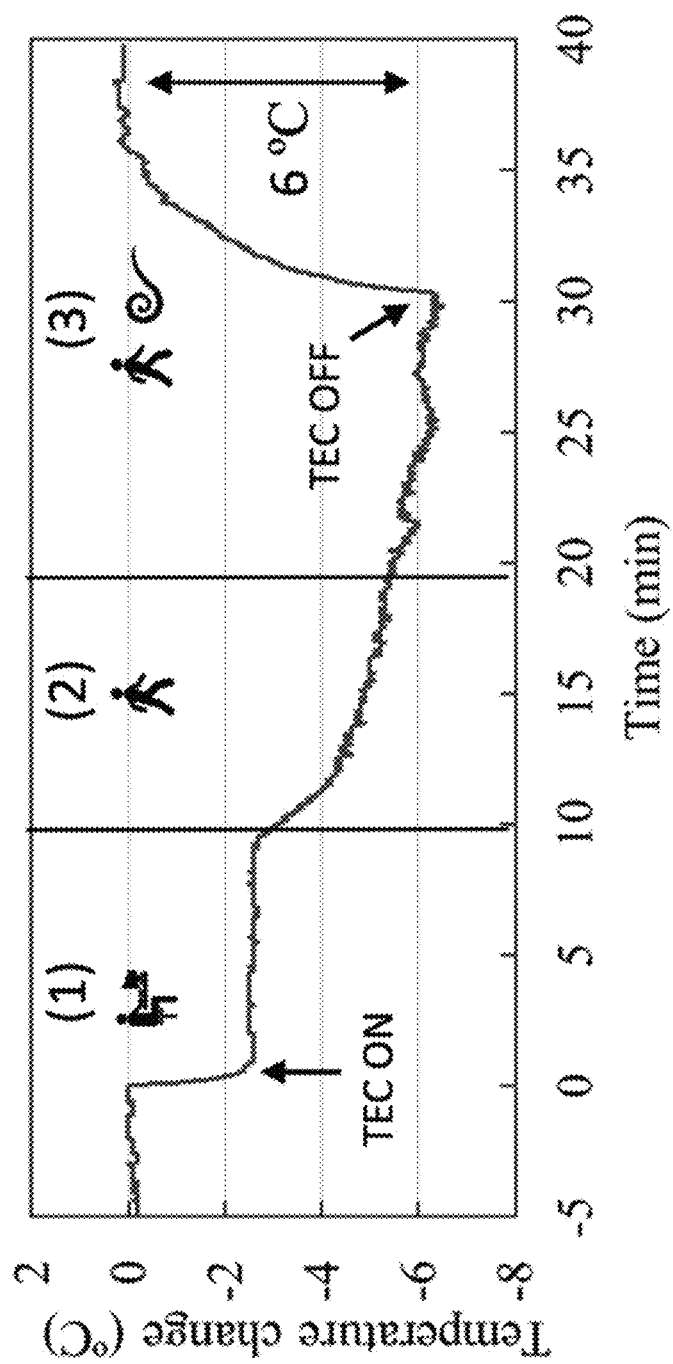
FIG. 29 depict examples of cooling performance of an armband in an outdoor environment, in accordance with some example embodiments.

FIG. 29 shows the measured skin cooling performance of an example TE armband in an outdoor environment while the wearer was (1) sitting, (2) walking, (3) jogging slowly.

Figure 30:
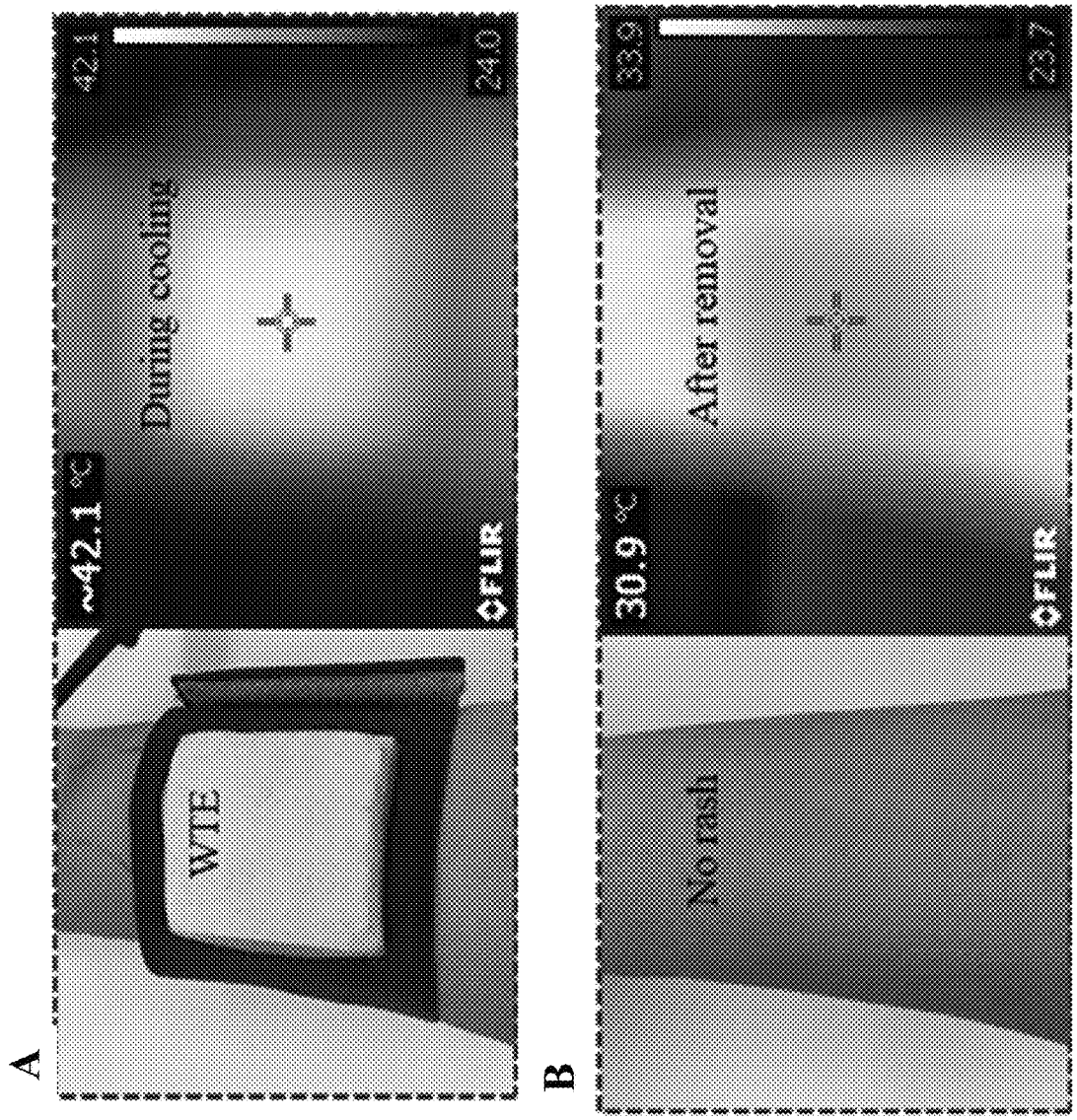
FIGS. 30A-B depict examples of visible light and infrared photographs of a flexible thermoelectric device, in accordance with some example embodiments.

FIGS. 30A-B depict examples of infrared (IR) imaging of skin showing the cooling performance of a TE armband. FIG. 30A depicts a photograph and IR image of the TE armband and skin while the TE armband is cooling. The high temperature on the top side of the TE device shows that it is pumping the heat from the cold side (skin) to the top side (environment). FIG. 30B depicts a photograph and IR image of the arm immediately after removing the TE device, showing that the skin underneath the TE device has a lower temperature than the rest area of the skin.

Figure 31:
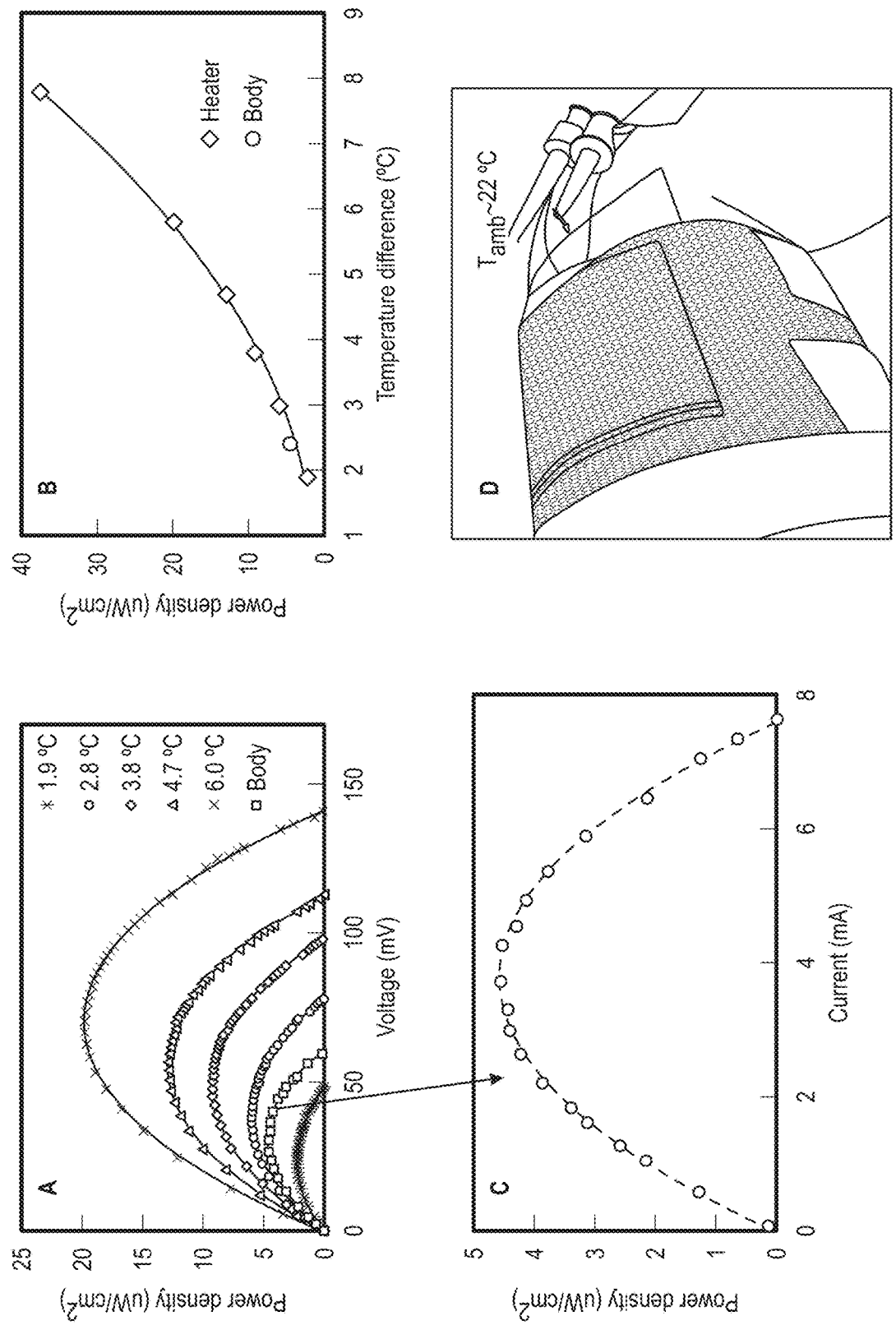
FIGS. 31A-D depict a photograph and example performance curves for a flexible thermoelectric device used for power generation, in accordance with some example embodiments.

FIGS. 31A-D depict power generation by harvesting body heat at a flexible thermoelectric device. FIG. 31A depicts an example of output power density vs. output voltage of an example TE device at various temperature differences across the device. The black curve (also in C) shows an example of performance for a power density corresponding to body heat. FIG. 31B depicts an example of power density vs. temperature difference. FIG. 31D depicts an example photograph of a TE device worn on an arm to showing energy harvesting from body heat. With the same ambient temperature, the power generation density increases with the temperature of the heater. In the examples of FIG. 31A-D, no heat sink or fan is used. When attached to skin, the device may generate a power of 4.5 µW/cm².

Figure 32:
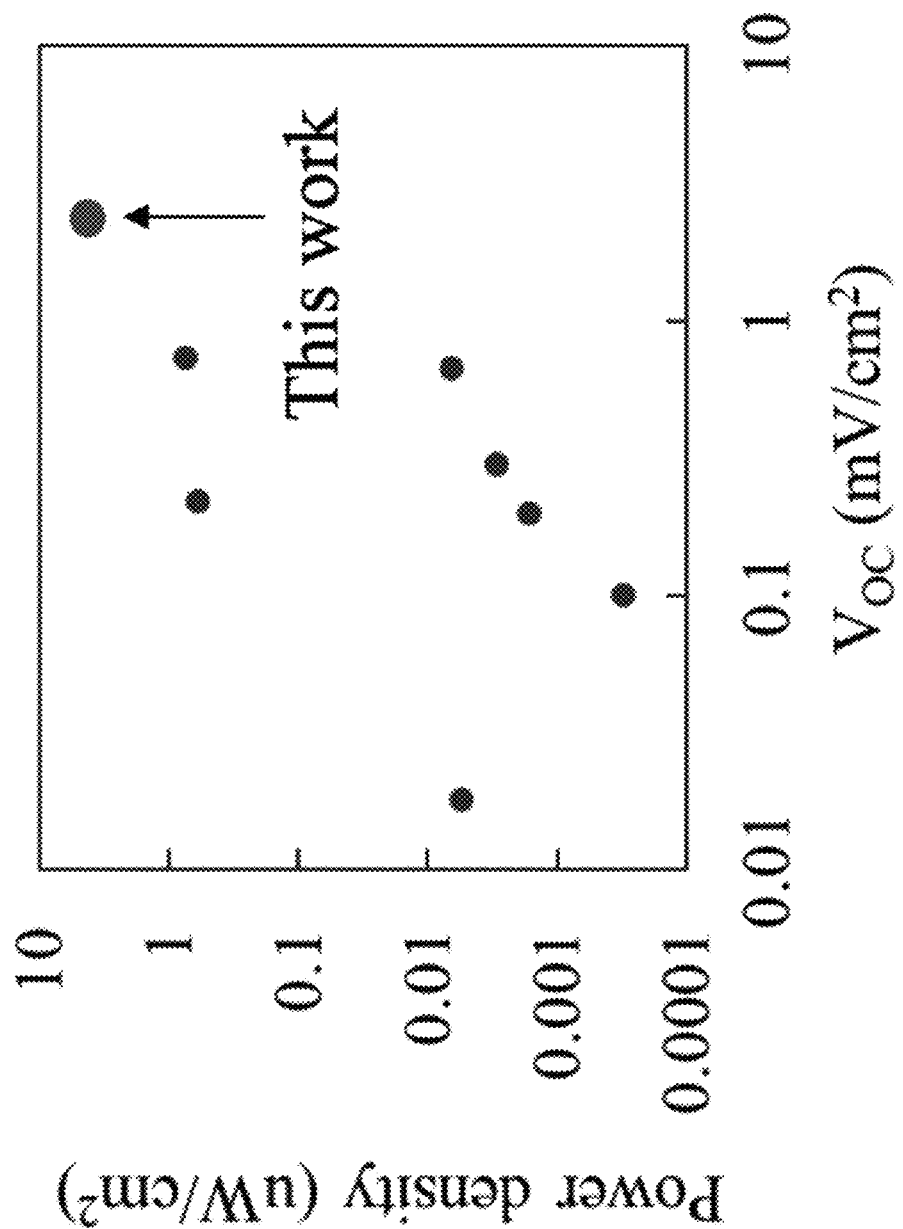
FIG. 32 depicts an example plot of output power density vs. open circuit voltage for a thermoelectric power generation device, in comparison to output power density vs. open circuit voltage for various thermoelectric power generation devices, in accordance with some example embodiments.

FIG. 32 depicts an example of generated output power density vs. open circuit of various TE energy harvesting devices. Black dots show the result from earlier work. Red dots show the result from the TE device disclosed herein.

Figure 33:
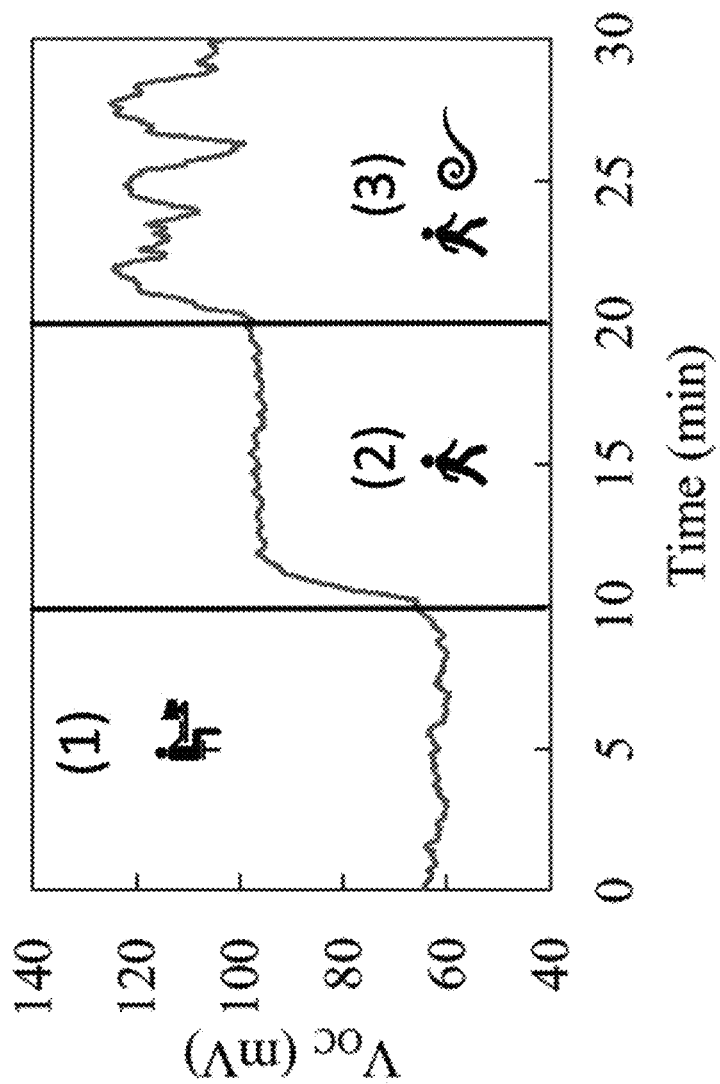
FIG. 33 depicts an example of open circuit voltage of a flexible thermoelectric power generation device worn on the arm as a function of various motions, in accordance with some example embodiments.

FIG. 33 depicts an example of open circuit voltage of a TE device worn on the arm, with different motions of the wearer in an outdoor environment: (1) sitting, (2) walking, (3) jogging.

Figure 34:
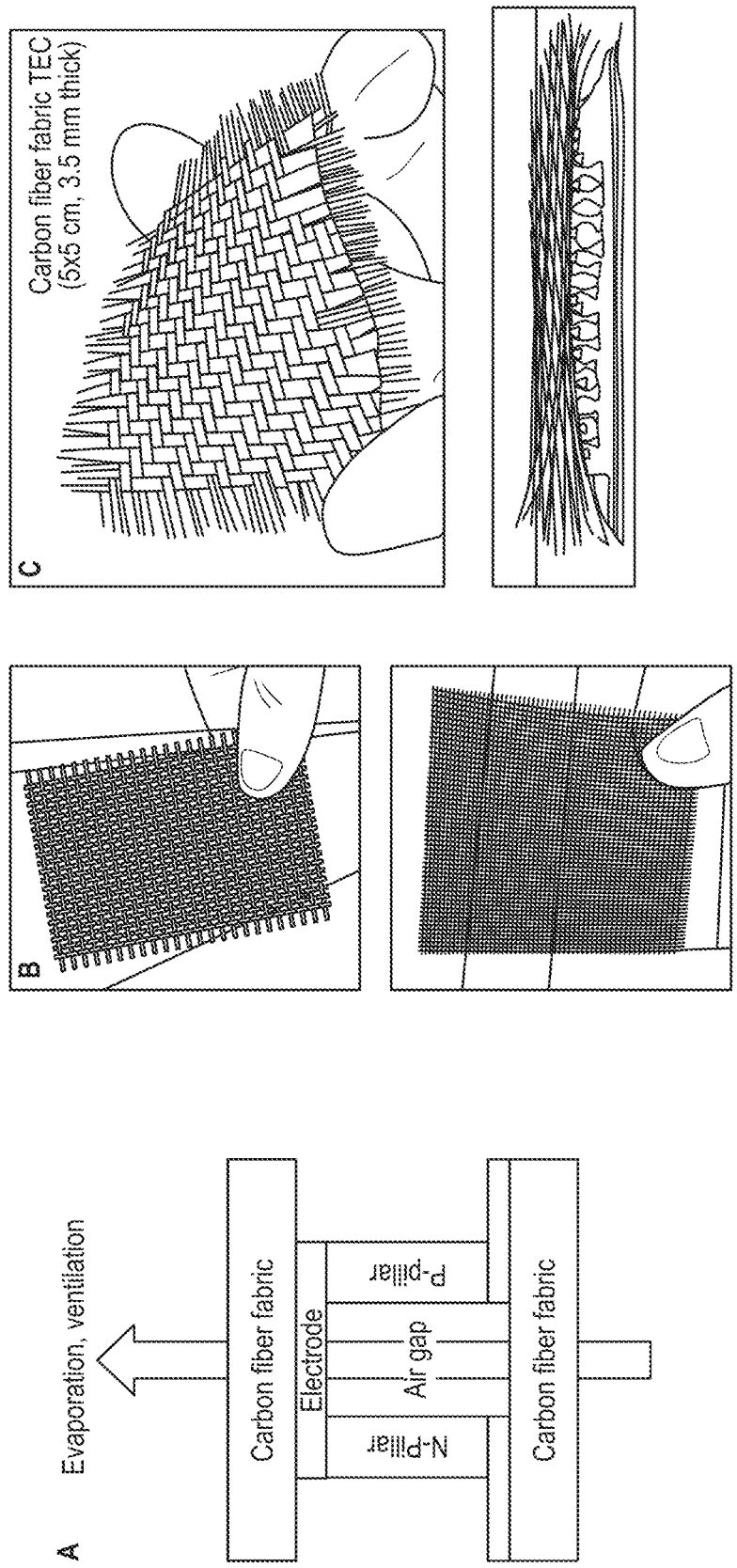
FIGS. 34A-C depict an example of a flexible thermoelectric device using carbon fiber fabric as the flexible sheets, in accordance with some example embodiments.

FIG. 34A-C depicts example aspects of the design and demonstration of flexible TEC using carbon fiber fabric. Carbon fiber fabric may be permeable by vapor thereby enhancing thermal comfort of the wearer. Carbon fibers may have high thermal conductivity for lateral heat spreading. Other fabric materials can also be used for the same effects. FIG. 34A depicts a schematic of the design. FIG. 34B depicts examples of carbon fiber fabric materials with lower porosity (top) and higher porosity (bottom). FIG. 34C shows photographs of a fabricated example TE device in carbon fiber fabrics.

Figure 35:
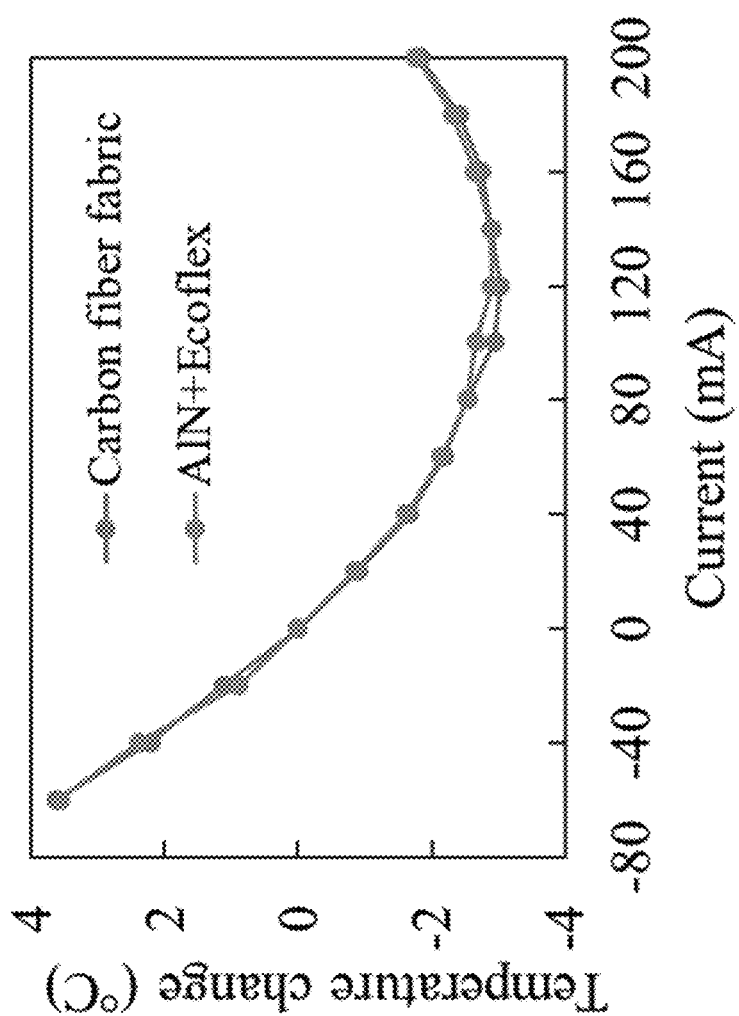
FIG. 35 depicts cooling performance of a flexible thermoelectric device with carbon fiber fabrics as the flexible sheets, in accordance with some example embodiments.

FIG. 35 depicts an example of cooling performance of a flexible TE device with carbon fiber fabrics. FIG. 35 compares the performance of an example device made from Ecoflex with AlN powder as the thermal conductivity filler to a carbon fiber fabric.

Figure 36:
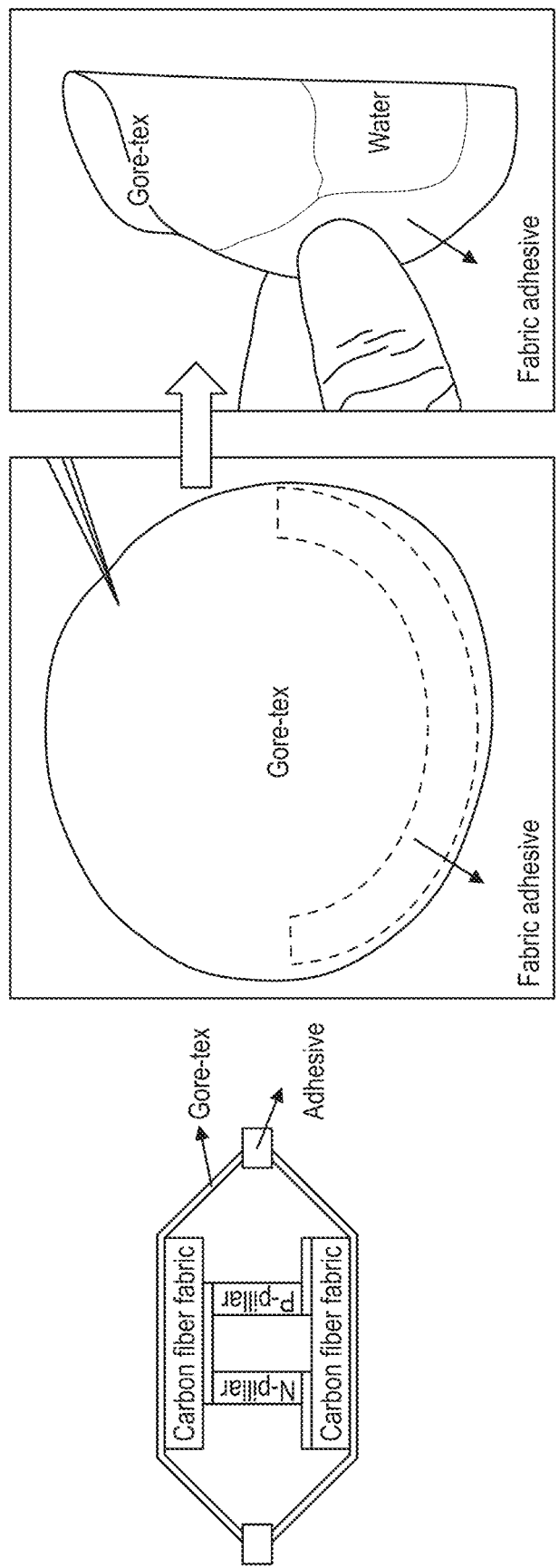
FIG. 36 depicts a process for making a waterproof and flexible thermoelectric device, in accordance with some example embodiments.

FIG. 36 depicts an example of a process for producing a waterproof TE device. The devices may be encapsulated with waterproof material, such as Goretex.

Figure 37:
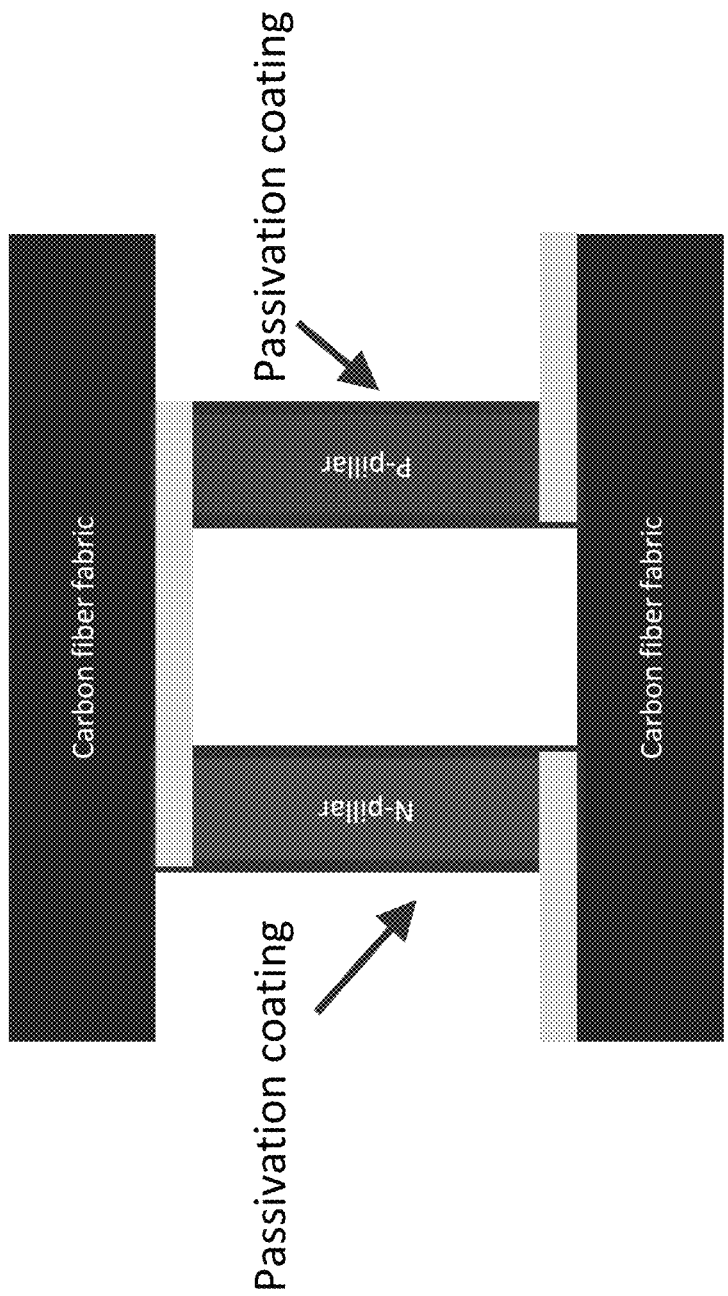
FIG. 37 depicts waterproofing a flexible thermoelectric device using a passivation coating layer, in accordance with some example embodiments.

FIG. 37 depicts another example of a waterproof device in which the TE pillars may be passivated by a waterproof coating made from dielectric inorganic materials (e.g., $SiO_2$, $Al_2O_3$, $ZrO_2$) or polymers.

Figure 38:
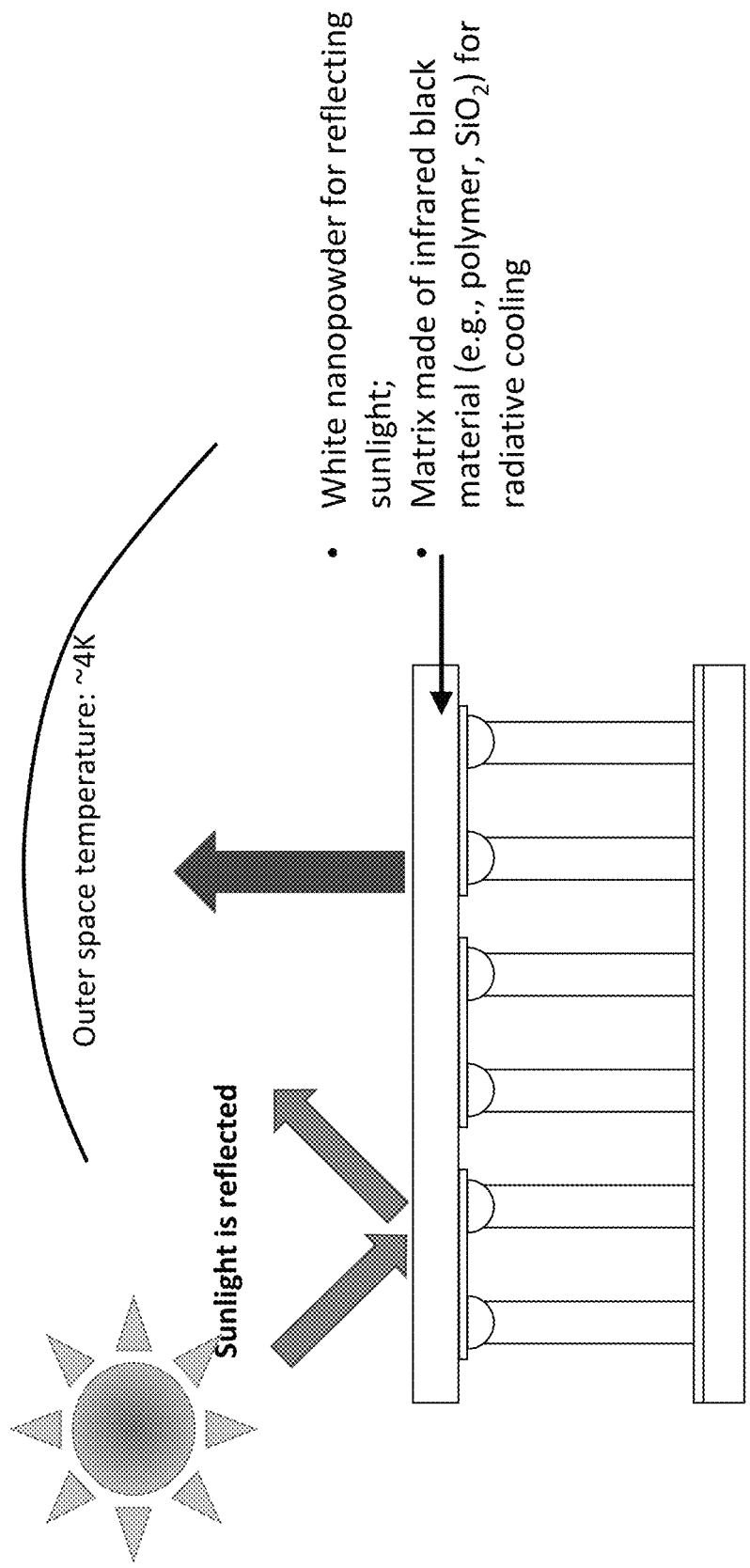
FIG. 38 depicts an example of a flexible thermoelectric device that reflects sunlight and emits infrared for radiative cooling, in accordance with some example embodiments.

FIG. 38 depicts yet another example embodiment in which the top polymer or fabric layer of the TE device is designed with a sunlight reflecting and infrared emitting feature for radiative cooling for use in a sunny outdoor environment. For example, a white nanopowder of dielectric material (with diameters less than 1 µm) is be embedded in a polymer or fabric matrix. The white powder may reflect the sunlight that has shorter wavelength photons, while the polymer or fabric matrix may be nearly black in the infrared spectrum to radiatively emit the heat to the space which has a very low temperature of ~4 Kelvin.

FIGS. 39A-B shows examples of measurements of a flexible radiative cooling plate made of polymer (Ecoflex) embedded with Boron Nitride (BN) nanopowder. FIG. 39A depicts reflectance in the UV-Vis-NIR regime, showing high reflectance in the solar spectrum. FIG. 39B depicts emissivity from 1 to 16 um, showing high emissivity from the radiative spectrum of a ~300 K object, from 3 to 16 µm.

Personalized Thermoregulation

Thermoregulation has significant implications for energy consumption and human comfort and health. However, cooling technology has remained largely unchanged for more than a century and still relies on cooling the entire space regardless of the number of occupants. Personalized thermoregulation by thermoelectric devices (TEDs) can drastically reduce the cooling volume and meet individual cooling needs but has yet to be realized because of the lack of flexible TEDs with high cooling performance. Disclosed is a wearable TED that can deliver over 10° C. cooling to the skin with a high coefficient of performance (COP>1.5). The disclosed TED exhibits over one order of magnitude higher power density compared to the existing flexible TEDs when used to harvest body heat and, more importantly, is the first to achieve long-term active cooling, thanks to the architecture including sandwiching high-performance inorganic TE pillars between stretchable elastomer sheets. Thermoregulation based on such devices may enable a shift from centralized cooling toward personalized cooling with the benefits of substantially lower energy consumption and improved human comfort.

Thermoregulation plays a role in human comfort and heath but also contributes significantly to energy consumption. The heating and cooling of buildings alone currently accounts for more than 10% of the total energy consumed globally, and this high level of energy consumption and the accompanying environmental impact, i.e., the emission of potent global warming gases, are expected to increase dramatically with the rapid growth of economies. Climate control systems are also used to achieve thermal comfort in electric vehicles; however, these systems can drain up to 40% of battery power in adverse weather conditions, presenting a major roadblock to achieving long driving ranges.

The ongoing effort to reduce the energy consumption of climate control systems has mainly focused on the development of more efficient thermoregulation technologies. However, a substantial amount of energy is being wasted by traditional climate control systems, as they heat/cool entire buildings or vehicles even though the occupants only occupy a small space. The large amount of wasted energy is evident when considering the great disparity between the human metabolic rate (100-150 W) and the per capita heating, ventilation, and air conditioning (HVAC) energy consumption rate in the United States (~1.5 kW). Moreover, it is difficult to set the temperature of an entire building or vehicle to ensure the thermal comfort of all the occupants or passengers as thermal comfort conditions can vary significantly from person to person. In addition to the implications for the energy efficiency of buildings and vehicular thermal envelops, there is also tremendous interest in achieving optimal thermal comfort for various outdoor application scenarios, such as those encountered in sports, military, special occupations, and health care.

Recently, there has been growing interest in personal thermoregulation devices, which can deliver a precise thermal dose to target spots on individuals and consequently reduce the heating or cooling volume by orders of magnitude compared with building/vehicular-level thermal envelops. These devices are also useful for outdoor heating or cooling, where centralized heater or AC are not available. Heating garments that exploit Joule heating, such as metallic nanowire meshes, are an example of such devices. However, the development of active cooling garments is far more challenging and largely unexplored as most current cooling devices are bulky and difficult to integrate into a garment. For instance, commercially available cooling vests contain bulky fluidic channels for coolant circulation or water/ice packs, and their cooling power is not adjustable. Given these inherent drawbacks of fluidic-based personal cooling garments, current studies are primarily focused on solid-state technologies such as electrocaloric, magnetocaloric, and thermoelectric cooling systems. Nevertheless, despite extensive material-level studies, wearable devices with high cooling performance have yet to be demonstrated. Active cooling was recently demonstrated in miniaturized electrocaloric devices with a high voltage (~10 kV); however, the temperature drop remained small (1.4° C.).

Thermoelectric devices (TEDs) are especially attractive for personalized cooling application as they are solid state with small form factors and the cooling power is readily adjustable. Although there has been substantial work on flexible TEDs for wearable applications, the majority of these devices have only achieved power generation by harnessing body heat or have shown limited cooling effect with the assistance of bulky heat sinks (such as water gels or fans). None of these wearable TEDs have shown long-term (e.g., >1 h) active cooling without the use of bulky heat sinks. The requirement of achieving active cooling, that is, pumping the heat from the cold to hot side, is stringent. A wearable TED capable of power generation is not necessarily suitable for active cooling: the Peltier cooling power on the cold side must overcome the parasitic heating effects of both the heat conduction from the hot side and Joule heating; in addition, the heat pumped to the hot side must be efficiently dissipated into the environment (hence the need for bulky heat sinks). The devices should possess high performance (measured by the TE figure of merit, ZT) with a suitable thermal design. Some previously reported TEDs have only shown power generation capability; however, none have exhibited sustainable active cooling performance without the aid of a water heat sink, due at least in part to the low performance of previous flexible TE materials (e.g., polymers or organic/inorganic hybrids with ZT<0.42) or inferior thermal design even with high-performance Bi—Te-based TE materials.

Disclosed herein and demonstrated in practice is a flexible and wearable TED with long-term (>8 h) and large (>10° C.) active cooling by addressing at least the aforementioned challenges. The disclosed TED design utilizes a fabrication scheme of sandwiching rigid inorganic high-ZT TE pillars between stretchable elastomer sheets and, by virtue of the thermal design, demonstrates a large cooling effect of more than 10° C. to the skin without the use of any heat sinks. The disclosed flexible TED exhibit significantly higher power output when used as a power generator from body heat than previous TEDs (up to 4.5-25.1 $\mu W\,cm^{-2}$ in our TED vs. $10^{-4}$ to 1 $cm^{-2}$ in previous TEDs). The TEDs are integrated into a wearable garment with long-term, energy-efficient cooling and heating effects on human skin: the garment kept the skin at the thermal comfort temperature of 32° C. while the ambient temperature varied within the large range of 22° C. to 36° C. Finally, a personalized thermoregulation package was demonstrated by integrating a battery pack into the TED garment.

Design, Fabrication, and Characterization of Flexible TEDs

In some implementations, flexible TEDs are fabricated based on rigid, inorganic TE pillars that possess much higher ZT values than those of prevailing flexible TE materials. Bi—Te-based TE pillars have ZT values of approximately 0.7-0.8 for both n- and p-types, whereas flexible organic TE materials have ZT values of less than 0.42. A schematic illustration of a TED design is presented in FIGS. 40A and 40C. To achieve mechanical flexibility and high cooling performance, rigid TE pillars (1×1 $mm^2$ in cross section and 5 mm in height, with a 3-mm gap between pillars) may be sandwiched between two 1-mm-thick stretchable Ecoflex sheets separated by a 4-mm air gap. The top and bottom 0.5-mm-long segments of the TE pillars may be embedded in the Ecoflex sheets. This design provides sufficient flexibility despite the rigidity of the pillars and greatly enhances the cooling effect. As shown in FIG. 40D, when the TED is bent, the top stretchable sheet expands while the bottom sheet contracts, thus providing flexibility to the device despite the use of rigid TE pillars. The fabricated TED is shown in FIG. 40B, and the fabrication process is presented in FIG. 40E and described in detail below. Photographs of the devices during the intermediate fabrication steps are shown in FIGS. 45A-C. Including all the components, the TED remains sufficiently thin (6 mm) and light (0.56 g $cm^{-2}$) (see FIGS. 45D-F). Our thin and lightweight flexible TED represents a major advantage for the wearable personalized cooling application compared to the previous flexible TEDs that need bulky and often wet heat sinks.

In some implementations, the TEDs include the high aspect ratio (height:width=5:1) of the pillars with low spatial density (6.25%) and the large air gap between the stretchable sheets (4 mm), which result in small thermal conductance between the cold and hot sides of the TED. The conductance of the device ($G_{TED}$) was designed to be ~30 W $m^{-2}$ $K^{-1}$, which is comparable to the heat transfer coefficient between the TED and air ($h_{air}$~10-20 W $m^{-2}$ $K^{-1}$) resulting from natural convection and radiation. This thermal resistance matching ensures that the heat pumped from the cold (skin) side as well as the Joule heating will dissipate into the air rather than flowing back to the skin (FIG. 40C and derivation shown below). If $G_{TED}$ were substantially higher, an efficient heat sink would be needed to match $h_{air}$ with $G_{TED}$, such as that used in prior wearable TEDs. However, there is also a limit to the continuous reduction of $G_{TED}$ by applying taller and smaller pillars, as excessively taller and smaller pillars would result in larger electrical resistance and Joule heating and compromise the device flexibility and mechanical strength (FIG. 46). In addition, the large distance between adjacent TE pillars requires efficient lateral heat spreading to ensure that a uniform temperature is maintained within each of the Ecoflex layers; this heat spreading was achieved by embedding AlN microparticles into the Ecoflex to increase its lateral thermal conductivity.

The basic thermoelectric and mechanical characteristics of the fabricated flexible TED are shown in FIG. 41. As discussed, reducing $G_{TED}$ is imperative to achieve active cooling without resorting to the use of bulky heat sinks. The measured $G_{TED}$ was 32 W $m^{-2}$ $K^{-1}$ (FIG. 2A), which falls within the optimal range for the cooling of human skin at a typical metabolic rate (50-100 W $m^{-2}$). The corresponding average thermal conductivity of the TE pillars was determined to be 1.52 W $m^{-1}$ $K^{-1}$. The average Seebeck coefficient (S) of the TED at the device level was measured to be 196 $\mu V\,K^{-1}$ (FIG. 41B). Finally, the overall electrical resistance of the TED was measured to be 7.9Ω, yielding an average electrical conductivity (σ) of 932 S $cm^{-1}$. The corresponding device-level ZT was determined to be 0.71 at room temperature. This ZT value is consistent with that of the constituent n- and p-type materials indicating the minimal influence of the device fabrication process on the material properties as well as the high-quality interfaces for thermal and electrical transport. The lateral thermal conductivity ($k_p$) of the stretchable sheet with embedded AlN particles (26 vol. %) was measured to be 0.77 W $m^{-1}$ $K^{-1}$, which represents an approximately four-fold enhancement over that of pristine Ecoflex (0.20 W $m^{-1}$ $K^{-1}$), as shown in FIG. 41Cc. Incorporating all of these material properties, our finite element simulation indicated that the flexible TED is expected to provide ~7° C. of maximum cooling with only natural convection and radiation (FIG. 41D and FIG. 47 for details). A simulation also showed that the higher $k_p$ achieved with the addition of the AlN microparticles reduced the peak-to-peak temperature variation on the stretchable sheets from 3.4° C. to 1.4° C. at the maximum cooling and, eventually, improved the maximum temperature decrease by more than 15% (FIGS. 47B and 47E).

The flexibility and mechanical robustness of the TED were demonstrated by monitoring the electrical resistance in real time under bending conditions using various bending radii (r). The resistance of the TED was stable when r was reduced to 20 mm (FIG. 41E), which represents the largest curvature of a human body. The resistance of the device was also stable during 1,000 bending cycles for r=30 mm (FIG. 41F). These results demonstrate the excellent flexibility of the TED enabled by our strategy of embedding rigid TE pillars between two thin stretchable Ecoflex sheets. The flexibility of the double-layer Ecoflex design was simulated and compared to that of the traditional single-layer design (that is, embedding TE pillars into a single elastomer sheet) for the fabrication of flexible TEDs. A double-layer design with an airgap between the layers reduces the bending stiffness to half of that of the single-layer design, as shown in FIG. 41G.

Power Generation Performance of Flexible TED

With the use of high-performance inorganic TE pillars and the optimal thermal design, the disclosed TED surpasses the performance of all previously reported flexible or wearable TEDs, which contributes to the disclosed device being capable of delivering the long-term active cooling effect. As no previous devices achieved active cooling effect without the use of heat sinks, the disclosed devices demonstrate power generation from human body heat using our TED and directly compare it to that of previously reported flexible TEDs. During the measurement, the flexible TED was attached to the wearer's arm; the voltage, current, and temperature difference between the cold and hot sides ($\Delta T$) were measured under various load resistances and thermal conditions. A schematic illustration of the measurement setup and the results are presented in FIGS. 42A and 42B, respectively. When the wearer was sitting stationary in an indoor environment at 22° C., the maximum open-circuit voltage ($V_{OC}$) was 74.5 mV and the maximum power density of our flexible TED on 32° C. human skin was 4.5 µW cm$^{-2}$. This is the highest generated power density ever reported for wearable TE generators on human skin without heat sinks. Previous wearable TE generators based on a wide variety of materials and designs (e.g., printing, yarn, and bulk pillars) without heat sinks have only exhibited maximum power densities of up to 0.75 cm$^{-2}$ on human skin, as summarized in FIG. 42D. Furthermore, the power density increased to 10.7 µW cm$^{-2}$ when the wearer was walking at a speed of 5 km h$^{-1}$ because of the increase in $h_{air}$ (19.6 W m$^{-2}$ K$^{-1}$) and to 25.1 µW cm$^{-2}$ in a cold indoor environment (10° C.). The maximum power generation vs. $\Delta T$ on the skin followed the same trend as that on the heater setup (see FIG. 42C).

The high performance in power generation of our flexible TED originated from the novel use of high-ZT inorganic TE materials in a flexible form and our optimal thermal design, namely, a low $G_{TED}$ that matches human metabolic heat and natural convection conditions, which are also the two prerequisites to achieve active cooling on human skin without a heat sink, as discussed earlier. To further illustrate this point, the relationship between the power generation (Seebeck effect) and the cooling effect (Peltier effect) as a function of $G_{TED}$ and ZT was explored through simulation (FIG. 42E). The human metabolic heat was set to ($Q_{skin}$) to 87 W m$^{-2}$ and $h_{air}$ to 10 W m$^{-2}$K$^{-1}$ with natural convection and radiation. As shown in FIG. 42F, the power generation and cooling effect clearly followed the same increasing trend with decreasing $G_{TED}$. When the ZT of the TED was 0.7, the device only provided an appreciable (>3° C.) cooling effect when $G_{TED}$ was less than 120 W m$^{-2}$ K$^{-1}$, which corresponds to a power generation density higher than 4 µW cm$^{-2}$. The required $G_{TED}$ would be even lower if the device had a lower ZT. Because of the low power generation of most previous flexible TE generators without heat sinks (<1 cm$^{-2}$), it was challenging to achieve an appreciable cooling effect on human skin.

Cooling and Heating Performance of Flexible TED on Simulated Heater

The cooling and heating effect of the TED was characterized using a laboratory setup (FIG. 43A). The thin-film heater in the setup generated a heat flux of 87 W m$^{-2}$ to simulate the typical metabolic rate from a human in an indoor environment. The cooling and heating performance were evaluated by monitoring the temperature at the bottom of the TED ($T_c$) while a current (I) ranging from −60 to 140 mA was applied to the TED. The negative and positive current resulted in heating and cooling effects, respectively, as expected from the TED configuration. At each applied current, $T_c$ began changing instantaneously and reached a plateau within a few minutes (left graph in FIG. 43B). When I=140 mA, a large steady-state temperature reduction of 7.3° C. was achieved with only natural convection and radiation. This cooling effect could be maintained for an extended period (~8 h) (right graph of FIG. 43B).

The stabilized temperature change as a function of the applied current is displayed in FIG. 43C. As expected from our finite element model (FIG. 41D), $T_c$ could be deterministically decreased or increased by applying positive or negative current, respectively, because of the Peltier and Joule heating effects. The cooling effect ($T_c$ reduction) was eventually saturated and then diminished with increasing positive current because of the excessive Joule heating. Because of the flexibility of the TED, the cooling and heating effects did not change on a curved substrate with bending radii of 40 and 30 mm (FIG. 43E). We also determined the coefficient of performance (COP) of the devices (right axis in FIG. 43C), which is the ratio between the heat removed from the skin (87 W m$^{-2}$) and the applied electric power. The COP values were measured to be 1.7 and 7.6 for 7° C. cooling and heating, respectively. The high COP values indicate a low power consumption of ~90 W for cooling and ~20 W for heating per person assuming total metabolic heat of ~150 W for a human body area of 1.8 m$^2$.

The operation of the TED was also tested under a mild convection condition with a wind speed of 5 km h$^{-1}$. This wind speed can be expected in certain indoor and outdoor environments (e.g., walking) and will lead to a moderate increase of $h_{air}$. As shown in FIG. 43D, the maximum cooling was greater than 13° C., approximately twice that under the natural convection condition because of the more efficient heat dissipation to the air. Using COMSOL modeling, we determined that this temperature reduction corresponds to $h_{air}$ of ~20 W m$^{-2}$ K$^{-1}$ (FIG. 47D), which is expected for the 5 km h$^{-1}$ wind speed.

As previously discussed, the high performance of the TED can be attributed to the unique thermal design: thermal insulation between the cold and hot sides and lateral heat spreading within the Ecoflex/AlN layers. The TE pillars with a small height-to-width ratio in traditional TEDs result in large thermal leakage (large $G_{TED}$), which diminishes the cooling performance. To verify the thermal design concept, the cooling/heating performance of a commercial TED (430857-500, Laird Technologies) and three flexible TEDs with various pillar designs were characterized for comparison (FIG. 49A). A clear trend of enhanced cooling/heating effect was observed with increasing height-to-width ratios of the TE pillars, as shown in FIG. 49B. Similar trends were also observed with increasing gap between pillars and increasing lateral thermal conductivity of the elastomer sheets.

Thermoregulation on Human Skin Using Flexible TED

The flexibility of the disclosed TED makes it well suited for personalized thermoregulation as a wearable device. The TED is also safe to wear on bare skin, as all the electrical components (e.g., electrodes and TE pillars) are encapsulated within biocompatible Ecoflex. The TED also operates within the safe voltage range of 1-2 V with currents of up to 200 mA. To demonstrate personalized thermoregulation on human skin under realistic conditions, we integrated the flexible TED into a garment and attached it onto the arm of a human subject. As shown in FIG. 44A, a thin porous mesh fabric was used to cover the TED without impeding the heat dissipation while an elastic nylon fabric was used to wrap the TED around the arm. A thermocouple was used to monitor the temperature of the skin covered by the TED ($T_{skin}$) while the subject was exposed to a controlled thermal environment within a wide temperature span of 22° C. to 36° C. A PID controller was used to adjust the current applied to the TED to maintain $T_{skin}$ at the comfort temperature (32° C.) regardless of the ambient temperature. At each ambient temperature set point (namely, 22° C., 26° C., 29° C., 31° C., 34° C., and 36° C.), the current to the TED was initially turned off (TED OFF) during the first 5 min, and the corresponding $T_{skin}$ was monitored, as shown in FIG. 44B. As expected, the $T_{skin}$ largely followed the ambient temperature: $T_{skin}$ varied from 28.5° C. to 34.3° C. as $T_{air}$ was changed from 22° C. to 36° C. After the first 5 min, the TED was turned on with its applied current automatically adjusted by the PID controller with a temperature set point of 32° C. As shown in FIG. 44B, the measured skin temperature reached the set point within 2 min and then remained at the set temperature thereafter regardless of whether the ambient temperature was lower (heating from TED) or higher (cooling from TED). This fast thermal response from the TED followed the same behavior as the laboratory setup (FIG. 43B). The precise and adjustable skin temperature control offered by the TED highlights the unique advantages of TE thermoregulation compared with other approaches, such as water or ice packs, which are not controllable.

An infrared camera was used (E60, FLIR) to image the skin and TED to visualize the active heat pumping effect. FIG. 44C shows the TED hot-side temperature of approximately 42° C. for the maximum cooling condition, which illustrates the active heat pumping from the cold (skin) side to the hot side. The hot-side temperature is also consistent with $h_{air}$ (~11 W m$^{-2}$ K$^{-1}$) and the heat dissipation to the environment (skin metabolic heat plus TED power consumption, see below). FIG. 44D presents an IR image of the residual cooling effect on the skin immediately after removing the TED. The IR image clearly shows ~2.5° C. cooling on the skin under the area originally covered by the TED compared with the rest of the skin.

The achievement of precisely controllable thermoregulation using the flexible TED has significant implications, which can be best illustrated by the distinctly different skin temperature responses to ambient temperature variation with and without TED operation (FIG. 44E). The typical comfort temperature range of human skin is 31.5° C. to 32.5° C., which corresponds to an ambient temperature range of 28° C. to 30° C. without the TED (FIG. 44E). When the TED is operating, however, the skin temperature can be maintained at a constant comfort temperature of 32° C. even within the wider ambient temperature range of 22° C.-36° C., thus simultaneously broadening the comfortable ambient temperature zone from 2° C. ($T_{air}$=28° C.-30° C.) to 14° C. ($T_{air}$=22° C.-36° C.) and enhancing the wearer's thermal comfort. The broadening of the ambient temperature set points could lead to substantial energy savings for indoor centralized HVAC systems, by as much as ~0.8 kW per person or 20% for a typical building, according to energy analysis. Notably, this building-level energy savings is achieved with negligible energy consumption by the TED, as expected from the measured high COP of our TEDs (FIGS. 43C and 43D). We also directly measured the power consumption of the TED when cooling the skin, which was determined to be only about tens of watts per person, depending on the ambient temperature (see FIG. 50). Therefore, our results directly point to the tremendous energy savings potential offered by individualized thermoregulation using the flexible TEDs.

Integration of TED with Batteries for Mobile Thermoregulation

Also demonstrated was the mobility of the wearable TED by integrating it with a battery pack to produce an all-flexible personalized thermoregulation device. The power pack was fabricated by embedding ten coin-cell batteries into an Ecoflex matrix and connecting them to each other with serpentine copper electrodes such that their flexibility matched that of the TED (see Methods for details). FIG. 44F shows an integrated cooling armband with the battery pack. The device was tested under three realistic conditions to investigate the effect of various convection and metabolic conditions, as shown in FIG. 44G and FIG. 51: 1) sitting in an indoor environment without wind to represent typical office conditions; 2) walking indoors at a speed of ~5 km h$^{-1}$ to test the cooling effect under enhanced metabolic rate and convection conditions; and 3) walking outdoors at a speed of ~5 km h$^{-1}$ under mild wind conditions to verify the feasibility of the TED for outdoor usage (see Methods for details).

When the TED was initially turned on with the battery pack (I=120 mA), the skin temperature decreased rapidly by up to 2.5° C., which matches well with the temperature drop shown in FIGS. 44B and 44E. This temperature drop was stable as long as the wearer was sitting still (condition 1). When the wearer started walking under the second condition, the temperature drop doubled, up to ~5° C., because of the forced convection effect during walking, which is consistent with the trend observed in the laboratory heater setup under a mild forced convection condition (FIG. 43D). The last condition additionally increased the temperature drop to up to 6° C. because of the even higher convection effect from the synergy of walking and the wind outside. This 6° C. skin cooling effect of the 5×5 cm$^2$ TED consumed only ~180 mW of power, or 1.8 Wh of energy for 10-h operation, which can be supplied by ~9 g of batteries (assuming an energy density of ~200 Wh kg$^{-1}$). Considering a cooling vest made of 144 of such TEDs to cover the hotspots of on the skin (e.g., back, chest, and abdomen) with an area of ~3600 cm$^2$ (~20% of the total body area), the power consumption is calculated to be ~26 W. Moreover, under the mild forced convection, the power consumption of the cooling vest is expected to be reduced by ~45%, to ~14.3 W, based on the results from the heater setup (FIG. 43). This energy consumption can be readily supplied by a battery pack with a weight of ~430 grams for approximately 6 hours of operation.

Summary

In summary, we developed, for the first time, a flexible and wearable TED with large, sustainable, controllable cooling and heating effect with a high COP for personalized thermoregulation. The TED is sufficiently thin, flexible, light, and readily embeddable into a garment. The wearability of the TED is achieved at least in part by eliminating the need for the large heat sinks (e.g., fin or fan) typically employed in traditional devices and by exploiting high-aspect-ratio TE pillars with an air gap to achieve low thermal conductance in the TED. A large cooling effect of up to 13° C. in the TED was achieved without the use of a heat sink, which will provide sufficient thermoregulation for human thermal comfort. We also integrated the thermoelectric devices into a wearable garment and demonstrated the long-term, energy-efficient cooling and heating effects on human skin: the garment maintained the skin at the comfort temperature of 32° C. while the ambient temperature varied from 22° C. to 36° C. The high COP of the TED and the localized cooling capability offer tremendous energy savings potential for personalized cooling compared with traditional centralized space cooling approaches. Thus, wearable garments based on the TED developed in this work may revolutionize the century-old cooling technology for climate control in buildings and vehicles.

Fabrication of Flexible TED

The processes used to fabricate the flexible TED are schematically illustrated in FIG. 40E. First, commercial TE alloys were cut into pillars that were 1×1 mm$^2$ in area and 5 mm in height. The TE pillars were aligned into a 12×12 array with 3-mm spacing between adjacent pillars. The array was attached to a carrier substrate using a thermal responsive adhesive as the first step. A Cu film (35 µm in thickness)

with a solvent-soluble adhesive was attached to another carrier substrate for the fabrication of the top electrodes. The Cu film on the carrier substrate was cut into individual electrodes (1.5 mm in width and 5.5 mm in length) for each pair of TE pillars, and the residual Cu film was removed from the carrier substrate (FIG. 45A). A polyimide tape was attached to the electrodes as a solder mask opening only the parts that contact with the TE pillars. The Cu electrodes on the carrier substrate were soldered to the TE pillar array using a soldering paste (FIG. 45Cc). After detaching the carrier substrate and solder mask from the Cu electrodes by soaking the device in acetone, a $SiO_2$ layer (200 nm) was deposited onto the electrodes to improve the adhesion with the stretchable polymer sheet. Next, 1-mm-thick Ecoflex 00-30A/B (Smooth-on) containing 26 vol. % of AlN powder (10 μm in diameter, Sigma-Aldrich) was cured, embedding the electrodes and the small segment (0.5 mm) of TE pillars. The Ecoflex and AlN powder mixture film with the electrodes and TE pillars was cut to dimensions of 5×5 $cm^2$, and the carrier substrate for the TE pillars was detached by applying heat to melt the heat-responsive adhesive (FIG. 45B). The aforementioned process was repeated for the bottom layer fabrication.

Thermoelectric Characterization of TED

The thermal conductance of the TED ($G_{TED}$) was measured by applying heating power (Q) to the TED and measuring the temperature difference between the hot and cold sides ($\Delta T = T_h - T_c$, where $T_h$ is the hot-side temperature and $T_c$ is the cold-side temperature.). $G_{TED}$ was calculated using $G_{TED} = d(Q)/d(\Delta T)$. The Seebeck coefficient (S) was also measured using the same setup by additionally measuring $V_{OC}$ of the TED for various temperature differences. The device-level average Seebeck coefficient was calculated from the slope of $V_{OC}$ vs. $\Delta T$, namely, $S = d(V_{OC})/d(\Delta T)$. The thermal conductivity of the stretchable Ecoflex sheets ($k_p$) was measured using the same method as that used for the $G_{TED}$ measurement, and the measurement was calibrated with standard polymer samples, including pristine Ecoflex ($k_p = 0.20$ W $m^{-1}$ $K^{-1}$).

Measurement of Cooling/Heating Performance of TED

For the laboratory heater setup shown in FIG. 43A, a thin film heater and a heat flux sensor (PHFS-01, FluxTeq) were used to simulate metabolic heat from a human body. During the measurement, the heater power was PID controlled to maintain a constant heat flux (FIG. 48). A polystyrene foam insulation layer was placed underneath the heater to prevent parasitic heat loss. A thermocouple was placed under the TED to measure $T_c$, and the other thermocouple was located ~20-cm away from the TED to monitor the ambient temperature ($T_{air}$). The cooling and heating effect at each electrical current was measured for 60 min: 20 min for pre-stabilization of the temperature without an electrical current, 20 min of TED operation with the current ranging from −80 mA to 160 mA (−80 mA to 200 mA for the forced convection condition), and 20 min of post-stabilization of temperature after switching off the electrical current. The temperature change in the summary results (e.g., FIG. 43C) was defined by the temperature difference of $T_c$ shortly before switching on and off the TED. The cooling/heating measurements were repeated three times (FIGS. 47C and 47D), and the root mean square error was less than 0.3° C. The temperature increased when a negative current was applied to the TED and decreased when a positive current was applied. For cooling, with increasing current, the temperature decreased almost linearly because of the Peltier effect and then began to saturate and eventually increased because of the excessive Joule heating. However, when a negative current was applied for heating, the temperature continued rising without saturation as the electrical current decreased because of the combined Peltier and Joule heating effects.

The COP may be determined using:

$$COP = \frac{Q_{skin}}{W} = \frac{Q_{skin}}{SI\Delta T + I^2 R},$$
Equation 3 where $Q_{skin}$ is the metabolic heat from a human body ($Q_{skin} = 87$ W $m^{-2} \times A$), A is the area of the TED, W is the supplied power, I is the applied electrical current, and R is the internal electrical resistance of the TED.

Measurement of TED Performance on Human Subject

The armband was fabricated by attaching a piece of mesh fabric (90% nylon and 10% spandex) onto a square hole (~6×6 $cm^2$) of a nylon elastic fabric strip with fabric adhesive. The TED was sandwiched between the mesh fabric and skin during the measurement. A healthy male subject with normal body mass index was recruited, and the cooling/heating effect of the TED armband was measured on the wearer's arm, as shown in FIG. 44A. A temperature-controlled chamber was designed to locally regulate the ambient temperature ($T_{air}$) near the arm considering the small areal density of the TED relative to the surface of a human body. $T_{air}$ in the chamber was controlled by a heater with thermally insulating fabric covering the chamber to prevent heat loss. A small hole in the chamber was prepared to place the subject's arm. Before the measurement, the subject sat and relaxed under a thermal comfort condition while placing an arm in the chamber and waited for more than 1 h for stabilization of the metabolic condition and $T_{air}$ in the chamber. There were no sources of forced airflow such as movement of the subject or ventilation during the measurement. The current applied to the TED was PID controlled to maintain $T_{skin}$ at the comfort temperature of 32° C. (FIG. 44B). After $T_{skin}$ reached steady state, $T_{skin}$ and $T_{air}$ were recorded for 10 min, and the TED was switched after 5 min.

Demonstration of Mobile Application of TED with a Battery Pack

Two identical TED armbands were prepared for this demonstration. The TED armbands were attached to both of the subject's arms; one of the TEDs was operated using a battery pack during the demonstration while the other was not operated (FIG. 51A). Along with the skin temperature under the TED with operation ($T_{skin}$), the skin temperature under the TED without operation ($T_{skin,ref}$) was monitored as a reference to compensate for the passive cooling/heating effects by thermal condition changes (e.g., wind, ambient temperature, or metabolic heat generation). The relative temperature change ($\Delta T_{rel}$) from the active TED cooling was calculated using $\Delta T_{rel} = (T_{skin,ref} - T_{skin}) - (T_{skin,ref} - T_{skin})_{t=0}$. The similar $T_{skin}$ and $T_{skin,ref}$ values before and after measurement (FIG. 51B) indicate that both arms and TEDs were exposed to identical thermal conditions (e.g., thermal insulation and metabolic heat generation).

Theoretical Analysis of Thermal Design Parameters to Achieve Active Cooling of TED on Human Skin The main strategy is to match thermal impedance between the TED and the environment. This is illustrated by the thermal balance of the TED for active cooling, which requires $T_{bare} > T_c$, where $T_{bare}$ is the bare skin temperature without a TED or garment and $T_c$ is the skin (cold side) temperature with TED cooling (FIG. 40C).

On the bare skin without the TED or garment:

$$Q_{skin}=h_{air}(T_{bare}-T_{air}) \quad \text{Equation 4}$$

where $Q_{skin}$ is the metabolic heat from the skin, $h_{air}$ is the heat transfer coefficient to the air, and $T_{air}$ is the temperature of the air.

On the cold (skin) and hot sides of the TED:

$$Q_{skin}=Q_{P,c}-Q_{cond}-Q_J \quad \text{Equation 5}$$

$$Q_{air}=Q_{P,h}-Q_{cond}+Q_J \quad \text{Equation 6}$$

where $Q_{P,c}$ is the Peltier cooling effect ($Q_{P,c}=S \cdot I \cdot T_c$, where S is the Seebeck coefficient, I is the current, and $T_c$ is the temperature of the cold side, i.e., the skin, $Q_{cond}$ is the conductive heat from the hot to the cold sides of the TED ($Q_{cond}=G_{TED}(T_h-T_c)$, where $G_{TED}$ is the thermal conductance of the TED and $T_h$ is the temperature of the hot side), $Q_J$ is the joule heating of the TED ($Q_J=0.5I^2R$, where R is the resistance), $Q_{air}$ is the heat dissipation to the air ($Q_{air}=h_{air}(T_h-T_{air})$), and $Q_{P,h}$ is the Peltier heating effect on the hot side ($Q_{P,h}=S \cdot I \cdot T_h$).

By combining Eqs. 4 and 5, $$h_{air}(T_{bare}-T_{air})=Q_{P,c}-G_{TED}(T_h-T_c)-Q_J \quad \text{Equation 7}$$

We know $T_h>T_{air}$ since $Q_{air}>0$, and $T_{bare}>T_c$ for the any active cooling, which results in $T_{bare}-T_{air}>T_c-T_h$. Then, $$G_{TED}(T_h-T_c)<h_{air}(T_h-T_c)+Q_{P,c}-Q_J \quad \text{Equation 8}$$

Eq. 8 can be summarized as:

$$G_{TED}<h_{air}+\alpha \quad \text{Equation 9}$$

where $\alpha$ is a function of $Q_{P,c}$, $Q_J$, $T_h$, and $T_c$. Eq. 9 shows that a small $G_{TED}$ is required relative to $h_{air}$ for the active cooling. However, the thermal impedance mismatch between $G_{TED}$ and $h_{air}$ of commercial TEDs is large: commercial TEDs has $G_{TED}$ greater than 1000 W m$^{-2}$ K$^{-1}$, and $h_{air}$ on the TED without heat sink under a typical indoor condition is 10-20 W m$^{-2}$ K$^{-1}$. Therefore, these devices only work when there is an efficient heat sink (e.g., fin or fan), but the bulky heat sinks render the TEDs non-wearable.

Theoretical Verification of the Hot Side Temperature and Heat Flux During TED Cooling on Human Skin Based on the IR image on the hot side of the TED ($T_h$=42° C., FIG. 44C) and the measured air temperature ($T_{air}$=24° C.), the heat flux from the hot side of the TED to the ambient ($Q_{air}$) is $$Q_{air}=h_{air}(T_h-T_{air}) \quad \text{Equation 10}$$

For $h_{air}$=11 W m$^{-2}$ K$^{-1}$, $Q_{air}$ is estimated to be 198 W m$^{-2}$. The heat flux dissipated to the hot side of the TED ($G_{TED}$) has three components: metabolic heat from the skin ($Q_{skin}$), Peltier effect, and Joule heating of the TED.

$$Q_{TED}=Q_{skin}+(N \cdot S \cdot I(T_h-T_{skin}) \pm I^2R)/A \quad \text{Equation 11}$$

where $Q_{skin}$=87 W m$^{-2}$, N is the number of TE pillars (N=142), S is the average Seebeck coefficient to the n and p type TE pillars, R is the total resistance of a TE device, I is the applied current (0.16 A during the experiment shown in FIG. 44C), $T_{skin}$ is the measured skin temperature (30° C.), and A is the area of the TED (5×5 cm$^2$). According to the characterization results of the TED shown in FIG. 41 in the main manuscript, S=196 µV K$^{-1}$, R=7.9Ω. Therefore, $Q_{TED}$ is calculated to be 200 W m$^{-2}$. This heat flux is very close to the one estimated based on the heat dissipation from the hot side of the TED to the air ($Q_{air}$ in Eq. 10). Therefore, we can conclude that our modeling and experiments are reliable.

Below is further description of FIGS. 40-51.

FIG. 40. TED design and fabrication process. FIG. 40A, Schematic illustration of cooling garments with wearable TEDs (left). The internal structure of the wearable TED with TE pillars connected by flexible copper electrodes and sandwiched between two stretchable sheets (right). FIG. 40B, Photograph of the fabricated 5×5 cm$^2$ flexible TED. FIG. 40C, Schematic illustration of TED design. The low thermal conduction inside the TED and high thermal conduction within the stretchable sheets are the key features of the design used to achieve the cooling effect. The high height (5 mm) to area (1×1 mm$^2$) aspect ratio of the TE pillars with low spatial density (6.25%) and large air gap (4 mm) between the stretchable sheets maximize the thermal insulation while the high thermal conductivity of the polymer (Ecoflex and AlN microparticles mixture, 0.77 W m$^{-1}$ K$^{-1}$) compared with that of regular Ecoflex (0.20 W m$^{-1}$ K$^{-1}$) improves the in-plane thermal conduction of the stretchable sheets. FIG. 40D, Schematic diagram and photographs showing the flexibility of the TED. The double layers of stretchable sheets enhance the flexibility. During bending, the top stretchable sheet expands while the bottom stretchable sheet contracts. FIG. 40E, Fabrication process of the TED (see Methods for details).

FIG. 41. Characterization of the TED. FIG. 41A, Measurement of the thermal conductance of the TED ($G_{TED}$). Various heating powers were applied to the bottom of the TED while the top temperature was kept constant by a heat sink. A $G_{TED}$ value of 32 W m$^{-2}$ K$^{-1}$ was determined from the slope of the temperature differences between the cold and hot sides (ΔT) vs. the applied powers. FIG. 41B, Measurement of device-level Seebeck coefficient (S=196 µV K$^{-1}$) by comparing ΔT and corresponding open-circuit voltages ($V_{OC}$). FIG. 41C, Thermal conductivity of the polymeric Ecoflex stretchable sheets ($k_p$) for various volume ratios of the Ecoflex and AlN microparticles. The mixture layer containing 26 vol. % of AlN microparticles exhibited $k_p$=0.77 W m$^{-1}$ K$^{-1}$, which is four times higher than that of pristine Ecoflex ($k_p$=0.20 W m$^{-1}$ K$^{-1}$). FIG. 41D, Finite element simulation of cooling/heating effect with the measured TED parameters. More than 7° C. maximum cooling was estimated with only natural convection and radiation. FIG. 41E, Electrical resistance (R) stability for various bending radii (r) from flat to 20 mm, where $R_0$ is R when the TED is flat, and ΔR is the difference between R and $R_0$. FIG. 41F, Electrical resistance stability over 1,000 bending cycles with r=30 mm. FIG. 41G, Finite element simulation comparison of the bending stiffness of double and single layers of Ecoflex with TE pillars of various heights. Double-layer 1-mm-thick Ecoflex sandwiching 5-mm-tall TE pillars with a 4-mm air gap between the layers reduced the bending stress by half compared with a single layer of 6-mm-thick Ecoflex embedding the TE pillars.

FIG. 42. Power generation of the TED and its impact on active cooling. FIG. 42A, Schematic diagram of the measurement setup used to monitor power generation on human skin. The voltage and current were measured with various load resistors while the TED was attached to the wearer's arm. FIG. 42B, Power generation as a function of output voltage under three thermal conditions: 1) sitting in a room at 22° C., 2) walking in a room at 22° C., and 3) sitting in a room at 10° C. FIG. 42C, Summary of the maximum power generation from our TED on a heater or human skin. The maximum power generation on human skin was 4.5 µW cm$^{-2}$ and the open-circuit voltage ($V_{OC}$) was 74.5 mV at room temperature ($T_{air}$=22° C.) with natural convection (sitting). The power generation increased up to 10.7 µW cm$^{-2}$ with mild forced convection (walking) and up to 25.1 µW cm$^{-2}$ under cold condition (sitting, $T_{air}$=10° C.). FIG. 42D, Summary of power generation and $V_{OC}$ of wearable TEDs from the literature. All the measurements were performed on human skin without heat sinks at room temperature. Our TED exhibited an order-of-magnitude higher power generation than the other TEDs. FIG. 42E, Schematic illustration of the geometry and thermal conditions used to simulate the relationship between cooling and power generation performance. FIG. 42F, Simulation result comparing cooling (Peltier effect, black) and power generation (Seebeck effect, blue) performance as functions of $G_{TED}$ and ZT. The Peltier and Seebeck effects had a close relationship, as expected, and both increased with decreasing $G_{TED}$. In addition, a lower $G_{TED}$ is required with decreasing ZT. To achieve over 3° C. cooling, $G_{TED}$ must be lower than 120 W m$^{-2}$ K$^{-1}$, which indicates that the power density must be greater than 4 µW cm$^{-2}$ when the device works in the power generation mode.

FIG. 43. Cooling and heating performance. FIG. 43A, Laboratory cooling/heating measurement setup. The heating power of a heater was fixed at 87 W m$^{-2}$ (measured by a heat flux sensor) to simulate the typical metabolic rate from a human in indoor conditions. FIG. 43B, Time-dependent cooling/heating effects from the TED with electrical currents of −60, −40, −20, 20, 60, and 140 mA (left). The cooling effect was sustainable for a long period (8 h) with an electrical current of 140 mA (right). FIG. 43C, Summary of temperature changes (black) and COP (blue) during TED operation with natural convection. The maximum temperature decrease was 7.3° C., and the COP at 7° C. cooling was 1.7. FIG. 43D, Summary of temperature changes (black) and COP (blue) during TED operation with mild forced convection (5 km h$^{-1}$ wind). The maximum temperature decrease was more than 13.6° C., and the COP at 7° C. cooling was 4.0. FIG. 43E, Cooling/heating effects for bending radii (r) of 30 and 40 mm, showing no change compared with those on the flat setup. The inset shows the measurement setup to test the cooling/heating effect of the TED under bending.

FIG. 44. Demonstration of thermoregulation on human skin. FIG. 44A, Photograph and schematic diagram of the TED armband. The wearer's arm was encompassed by a controlled thermal environment. FIG. 44B, Change in $T_{skin}$ under various $T_{air}$ conditions before and after TED operation. Without TED operation, $T_{skin}$ varied from 28.5° C. to 34.3° C. while $T_{air}$ changed from 22° C. to 36° C. With active thermoregulation of the TED, $T_{skin}$ converged to the preset comfort temperature (32° C.) under all the $T_{air}$ conditions. FIG. 44C, Infrared image of the TED armband (hot side) during cooling (I=160 mA) on the subject's arm. FIG. 44D, Infrared image of the skin after removing the TED armband, showing ~2.5° C. of residual cooling effect. FIG. 44E, Summary of $T_{skin}$ as a function of $T_{air}$ with and without TED operation. The cooling and heating of the TED broadened the comfortable ambient temperature zone from 2° C. ($T_{air}$=28° C.-30° C.) to 14° C. ($T_{air}$=22° C.-36° C.). FIG. F, Photograph of the TED armband for the mobile thermoregulation experiment. During the demonstration, the TED armband was operated by the flexible battery pack. g, Skin temperature change by TED cooling under three conditions: (1) sitting indoors, (2) walking indoors, and (3) walking outdoors under mild wind conditions. The maximum skin cooling effect was 6° C.

FIG. 45. Fabrication and characterization of TED. FIG. 45A, a carrier substrate with an array of copper electrodes. FIG. 45B, An array of 142 TE pillars with the fabricated bottom layer including copper electrodes and AlN particles embedded in an Ecoflex stretchable sheet. FIG. 45C, Soldered copper electrodes on the TE pillars. FIG. 45D, Fabricated flexible TED by curing and cutting the Ecoflex/AlN mixture sheet. FIG. 45E, Weight of the TED (14.1 g per device). FIG. 41F, Thickness of the TED (~6 mm).

FIG. 46. Optimization of the TED. FIG. 46A, Heat transfer model in COMSOL to optimize the TED design. The model used various geometric parameters for the optimization including the height of TE pillars (h=2, 3.5, 5, 7, and 10 mm) and the gap between TE pillars (g=2, 3. 4, 5 mm). FIG. 46B, Mechanical model in COMSOL to optimize the TED design. Bending stiffness was simulated by applying a force and monitoring the corresponding deformation. Devices with large pillar heights (h) are more rigid and less flexible, as expected. FIG. 46C, Maximum cooling effects with various TE pillar height (h) and TE gap (g) values. The cooling effect was enhanced with increasing h up to 10 mm while there was an optimum g to maximize the cooling effect. However, the h also has to be optimized since a large h resulted in poor wearability as shown in 46B. FIG. 46D, The thermal resistance of TED with various h and g values. Larger h and g values led to higher thermal resistance of the TED impeding heat dissipation and skin thermal comfort at hot environment when the TED is not operating. Our TED design with h=5 mm and g=3 mm showed a thermal resistance of 0.035 m$^2$ K W$^{-1}$, which is only ~20% of the resistance of regular clothes (0.155 m$^2$ K W$^{-1}$). FIG. 46E, Bending stiffnesses of TEDs with single- and double-layer of AlN:Ecoflex sheets. The single thick layer of AlN:Ecoflex sheet showed high bending stiffness compared to that of the double-layer. Our double-layer design reduced the bending stiffness by 60% relative to the single-layer one.

FIG. 47. COMSOL modeling of the cooling effect with constant heat flux. FIG. 47A, A unit cell of the TED with 1-mm thick top and bottom stretchable sheets, a TE pillar (1×1×5 mm), Cu electrodes (35 µm in thickness), and a 4-mm thick air gap. An empirical equation ($k_{conv}$=1.32($\Delta T$/L)$^{0.25}$) was applied to model the natural convection heat transfer to the air, where $T_{air}$ is the ambient temperature, $\Delta T=T_h-T_{air}$, and L is the characteristic length. A heat flux of 87 W m$^{-2}$ from the bottom of TED was used as the metabolic heat from a human body. Radiation between the cold and hot sides was also considered in addition to the conduction through the air gap since the radiation accounts for ~40% of the total heat transfer in the air gap. FIG. 47B, Simulation results of temperature distribution in the heat spreading layers, made of either pristine Ecoflex (left) or an Ecoflex/AlN mixture (right). The pristine Ecoflex showed up to 3.4° C. temperature variations within the sheet, whereas the Ecoflex/AlN mixture had ~1.4° C. maximum temperature difference. FIG. 47C, Comparison of experimental results and the simulation result under a natural convection condition. FIG. 47D, Comparison of experimental results and the simulation result under a mild forced convection condition with ~5 km h$^{-1}$ wind. Three experimental data points at each applied electric current were plot together in c and d. and showed excellent match with the simulation result. The root mean square error of the experimental data points was less than 0.3° C. FIG. E, Simulation results of cooling effect with Ecoflex and Ecoflex/AlN mixture heat spreading layers. The temperature uniformity in the pristine Ecoflex layer hinders the effective heat dissipation and degrades the cooling performance; the addition of high thermal conductivity AlN enhanced the heat spreading and improved the cooling performance.

FIG. 48. PID control of the heat flux from the heater. FIG. 48A, Measured heat flux applied to the heater during cooling/heating measurement. The heating power was maintained at a constant 87 W m$^{-2}$ value using a PID controller, with the feedback from the heat flux sensor. FIG. 48B, An example of heat flux recovery graph with the PID controller after switching on/off the TED. When the TED was switched on at the electrical current of 140 mA, the cooling of the $T_{skin}$ increased the heat flux from the insulation layer to the TED bottom. On the contrary, switching off the TED decreased the heat flux. The PID controller recovered the heat flux within two minutes.

FIG. 49. Comparison of TEDs. FIG. 49A, Four TEDs with various TE pillar designs and thermal conductivity values of the stretchable polymer sheets ($k_p$). The four devices included three flexible TEDs and a commercial TED made of the same TE materials. The geometric and thermal parameters of the TEDs are summarized in the schematics. FIG. 49B, Summary of cooling/heating effects. The flexible TEDs showed the maximum cooling of 4.6° C. (blue), 6.3° C. (red), and 7.3° C. (black) while the commercial TED (yellow) did not show any cooling effect. The significantly improved cooling in the flexible TEDs is attributed to our optimal thermal design featured with low $G_{TED}$.

FIG. 50. Power consumption during the thermo-regulation of human skin. FIG. 50A, Power consumption of the TED during operation at various air temperatures $T_{air}$. FIG. 50B, Summary of the power consumption as a function of $T_{air}$.

FIG. 51. Temperature change during the mobile thermo-regulation demonstration. FIG. 51A, Schematics of the demonstration setup with two identical TED armband worn on both arms, but the TED on the left armband was operating (i.e., applied with current from the flexible battery) and the other TED on the right armband was not operating and used as a reference. The relative temperature change was determined by subtracting $T_{skin}$ from $T_{skin,ref}$ to exclude possible skin temperature changes caused by changes in air temperature, convection heat transfer coefficients, and metabolic rates. The inset shows the integrated TED arm band with the flexible battery pack shown in FIG. 44f in the main text. FIG. 51B, Measured temperature during the demonstration. $T_{skin}$ and $T_{skin,ref}$ were almost the same before and after demonstration because the TED armbands and heat generation from both arms are identical. $T_{skin,ref}$ drifted as changing thermal conditions, and compensate the change to extract the active cooling effect from the TED.

Thermal Camouflage Devices

Thermal cloaking and camouflage have attracted growing attention with the progress of infrared (IR) surveillance technology. Earlier work has been mainly focused on emissivity manipulation or using sophisticated thermal metamaterials. However, emissivity control is only applicable for objects that are warmer than the environment and lower emissivity is usually accompanied with high reflectivity that inevitably reflect the surrounding thermal signal. Metamaterial based thermal camouflage hold great promise but their applications on human subjects has been limited. Direct temperature control represents a more desirable strategy to realize dynamically adjustable camouflage within a wide ambient temperature range, but it has been difficult to develop wearable, portable, and adjustable thermo-regulation system suitable for human subjects. Disclosed below is a wearable and active IR camouflage device responding to background temperature change based on the thermoelectric cooling and heating effect. The device can deliver precise and sufficient IR camouflage effect to effectively shield the metabolic heat from a human body within a large background temperature range: 7° C. below or 15° C. above the ambient temperature, thus providing the thermal camouflage that is attractive for a broad range of applications.

Camouflage is an essential phenomenon commonly seen in nature and technological applications, matching the intensity and patterns of a certain spectral range (e.g., visible, IR, radar radiation) with surroundings. While visual camouflage has been exploited by man for a few million years in human history, thermal camouflage is now of interest due to the development of IR surveillance technology. Approaches can be broadly categorized into two types. The first is based on engineering the surface emissivity of an object. Based on the Stefan-Boltzmann law, a surface with a lower emissivity has the same emissive power as a black background at lower temperature. Therefore, low-emissivity coatings (pre-controlled) can be used to shield the thermal signature from an object whose temperature is higher than that of the background. This approach is further extended to tunable surface emissivity so the thermal signature can be possibly matched in real-time to a dynamic thermal background—the so called adaptive IR camouflage (adjustable infrared emissivity or reflectivity coatings). Infrared emissivity or reflectivity control has been realized by mechanical actuation of photonic crystal structures and graphene, heat and moisture induced nanostructure array, electrostatic gating on semiconducting materials such as graphene, phase change materials $VO_2$ and GST, light-excited infrared metamaterial. The second approach is based on thermal metamaterials or thermotics, which uses structural design to guide heat conduction and thermal radiation in materials with inhomogeneous distribution of thermal conductivity or refractive index to shield the thermal signatures or create the thermal "cloaks."

In earlier work, thermal camouflage using the emissivity manipulation approach has been prone to influence from the surrounding environment. For example, the high reflectance associated with the low emissivity nature of the materials can lead to reflection of hot/cold thermal signatures presented in the surrounding area such as from the sun or sky. Low-emissivity may also be compromised by contamination such as dust or moisture. Further, the temperature range for thermal camouflage with the emissivity manipulation method is limited: the temperature of the object has to be higher than that of the background temperature as the emissivity cannot be higher than unity. There are scenarios where the object temperature is lower than the environment.

Recently, non-reflective and active IR camouflage by direct manipulation of the surface temperature of the objects such as injecting hot or cold liquid through microfluidic channels on the skin of a soft robot has been shown or utilizing rigid thermoelectric devices (TEDs) on vehicles or other rigid objects. Although these techniques may be used on small objects (e.g., soft robot) and rigid machines (e.g., vehicles), active IR camouflage on the human body remains a challenge because of the need for a lightweight, portable, soft, and wearable device, along with a suitable thermal management scheme to maintain thermal comfort of the wearer. A microfluidic system, while efficient and straightforward in altering surface temperature, requires potentially bulky hot and cold fluid reservoirs and a manifold system. Rigid TEDs may work in tandem with large heat sinks but are not suitable for wearable application on the human body which would require flexible and stretchable TEDs. To address the foregoing challenges, disclosed herein are flexible and wearable TED for active and wearable thermal camouflage applications. Made from rigid inorganic TE materials (with TE figure of merit, ZT, close to the unity) but incorporated into a soft elastomeric architecture, the flexible TEDs are soft and yet have high TE performance with over 10° C. heating and cooling capability. Using an optimized thermal design, the flexible TEDs can effectively dissipate the heat to the environment without a bulky active heat sink, such as a water heat sink or a fan. To demonstrate a compact thermal camouflage scheme, further integrated with the flexible TED is a phase change heat absorbing layer for efficient thermal management. These features are developed for the disclosed wearable thermal camouflage device that is adaptive to the background temperature changes. The TED is sufficiently thin, portable, and flexible to be embedded in a garment due to the optimized thermal and mechanical designs. The TED provides active and precise thermal camouflage hiding heat from a heater under various background temperatures. Unlike traditional low-emissivity material, the camouflage effect was not interrupted by the reflection of the surroundings since the TED has low IR reflectance. The thermal camouflage effect on human skin has been demonstrated using the disclosed devices which show an invisibility to an infrared camera of the metabolic heat from human skin within a wide background temperature range of −7 to +15° C. relative to the ambient temperature. The disclosed wearable thermal camouflage scheme can be readily scaled up and may pave the way for personalized and adaptable thermal camouflage.

Camouflage Device Design

The disclosed active thermal camouflage strategy utilizes a flexible TED to change and match the surface temperature of the object to the background temperature. This strategy is used for a variety of background temperature, regardless of whether it is a lower or higher than the object temperature. The surface temperature of the TED ($T_{TED}$) is controlled to match the background temperature ($T_{back}$) to hide the heat from an object. This was demonstrated using an individual TED with a size of 25 cm². These flexible devices can be integrated into cloth to shield metabolic heat from human body, as illustrated in FIG. 52A. The design of the flexible TED can be optimized to eliminate the need for bulk heat sinks by matching the thermal conductance of the device ($G_{TED}$) with the natural convection and radiation. FIG. 52C shows a photograph of a TED with TE pillars (5 mm in height, 1×1 mm² in cross-section, and 3 mm spacing) which possesses a low $G_{TED}$ of about 30 W/m²-K. Both ends (about a 0.5 mm portion) of the TE pillars can be embedded into stretchable elastomer sheets made of Ecoflex, or another flexible material, with the middle ~4 mm segments exposed to air. This ensures high durability under bending stress (see, for example, FIG. 52B). During expansion and contraction, the top and bottom elastomer sheets absorb most of the bending stress and protect the embedded TE pillars from mechanical stress. Aluminum nitride (AlN) particles can be embedded into Ecoflex, or another flexible material, to improve the lateral heat spreading and thus the temperature uniformity within the top and bottom sheets.

The TED reduces the surface temperature of skin by up to 10° C. and increases the temperature by more than 20° C. relative to the ambient air temperature. This effect cannot be achieved by common commercial TEDs that are not adequately designed for wearable applications, namely metabolic heat rates (for example, 50-100 Wm⁻²), natural convection and radiation heat transfer coefficient (for example, $h_{air}$~10-20 Wm⁻² K⁻¹. Considering the typical skin temperature of about 33° C., the cooling and heating temperature range of a TED means that the thermal camouflage function is expected to work within an environmental background temperature ($T_{back}$) from about 13° C. to about 43° C.

Active Thermal Camouflage

The active thermal camouflage performance of the disclosed TED can be compared to the low emissivity (low-e) film. As shown in FIG. 53A, both the disclosed TED and the low-e film were placed on a heater generating 58 Wm⁻² heat flux to mimic the metabolic heat generation from a human body at rest. The object that was camouflaged was simulated by a heater (20×20 cm² in size). The object was suspended on a background plate, whose temperature ($T_{back}$) was controlled by a temperature controller. The plate was covered with a high emissivity polymer tape to simulate change in the background temperature. The heater was suspended over the background plate with four small pillars, so as to minimize the heat conduction between the object and the background plate. Therefore, the only important heat transfer pathway between the object and the environment is through convection and radiation to the air. An IR camera (FLIR Model E40) was used to record the temperatures while $T_{back}$ was changed in the range of 14-34° C. at a constant ambient temperature ($T_{air}$=20° C.). The details of the test structures and the associated temperature profile for the TED and low-e film are shown in FIGS. 53E and 53F, respectively. While the TED interacted with ambient environment with the heat transfer coefficient of $h_{air}$≈10 Wm⁻² K⁻¹ with convection (mild ventilation in the laboratory) and radiation, the low-e film had only convection heat transfer ($h_{conv}$) without radiation due to its low emissivity, which results in the surface temperature of 31° C. ($T_{low-e}$).

As displayed in FIG. 53B, when the background temperature was the same as the air temperature ($T_{back}$=$T_{air}$), the object covered with the low-e film was camouflaged despite its surface temperature ($T_{low-e}$) being higher than $T_{back}$, because the film reflected the thermal radiation from surroundings ($T_{air}$) and the objected was perceived (by the IR camera) as being at the same temperature as $T_{air}$ or $T_{back}$ (FIG. 53F), which is the mechanism of the common low-e camouflaging. The TED also showed the same camouflage effect by controlling $T_{TED}$ to the same as $T_{back}$, thus radiating the same thermal spectrum as that of the background (FIG. 53E). However, when $T_{back}$ was changed to be either much below or above $T_{air}$ (from 14 to 34° C.) the camouflage effect was not maintained for the low-e film while the TED still retained the camouflage effect (FIGS. 53C and 53D). FIG. 53G shows the comparison of $T_{TED}$, $T_{back}$, and $T_{air}$ as a function of time. As increasing $T_{back}$ from 14° C. to 34° C. for 5 min, $T_{TED}$ closely followed $T_{back}$ by controlling the input power to the TED. In particular, TED could still show an effective camouflage effect when the object temperature was lower than $T_{back}$ (FIG. 53D), which was impossible to achieve with the emissivity control approach because it would require an unphysical condition of the emissivity being greater than one. Also worth noting is the temperature uniformity on the TED surface, was showed a small distribution of ±0.4° C. in root mean square (RMS), as displayed with the temperature histogram in the inset graph of FIG. 53Cc. Relatively large temperature deviations (but still <0.4° C.) occurred only the edge of the TED, due to the convective heat transfer from the side of the TED. This effect is expected to disappear on larger TEDs.

Anti-IR Reflection Property

Another issue with the low emissivity coating to shield the thermal signature is its IR reflectance. Since the camouflage coating obviously cannot have IR transparency, low emissivity inevitably leads to high reflectance. This would cause the reflection of the surrounding thermal signature to the IR detector and result in a noticeably different thermal pattern compared to the background when there are hot or cold spots in the environment such as the Sun (6000 K) or the sky (4 K). This reflection could be easily captured by IR detector when the subject moves due to the change of the reflected thermal radiation. This issue is shown in FIG. 54. The low-e film, which has $\varepsilon_{low-e}$=0.04, clearly showed the reflected IR radiation from the hand (FIG. 54D), which was easily detectable by an IR camera. The reflected thermal radiation of the hand showed the exact hand skin temperature (34° C.), suggesting the imperfection of the emissivity manipulation camouflage technique. On the other hand, the camouflage with TED did not reflect the thermal radiation from the warm hand that was placed above the TED (FIG. 54C). This was achieved by the high emissivity (low reflectance) of the elastomeric polymer covering the TED ($\varepsilon_{polymer}$=0.93).

Thermal Camouflage on Human Skin

A heater setup demonstrated the active camouflage effect using the TED. When applying it on the human skin, the backside of the TED will be in thermal contact with the skin. When operated as a camouflage device, the frontside of the TED would have the same temperature as the background, which means the backside temperature would vary significantly and could fall outside of the thermal comfort temperature range for the skin. To solve this problem, an active thermal management strategy is needed and can be placed in between the TED and the skin. This can be achieved by a number of methods, such as fluidic or air circulation, or using a phase change material. This effect was demonstrated by integrating a phase change layer (PCL) between the TED and the fabric that is in direct contact with the skin (FIG. 55B). The device fabrication process is described below.

The TED with PCL was further integrated into an armband to be worn on an arm (FIG. 55A). We used a regular fabric to wrap the TED around the wrist of the wearer and applied a mesh fabric to cover and attach the TED to the skin without impeding the heat dissipation or camouflage effect (FIGS. 55A and 55B). We also wrapped the same low-e film (made of an Al sheet) on the wrist as a comparison (FIG. 55A). The TED armband possesses sufficient flexibility to accommodate the curvature of the wrist (with a bending radius of around 2 cm) to ensure a conformal coverage on the skin. During the test, the thermal conditions (i.e., $T_{air}$ and $h_{air}$) was controlled to be similar to those experienced in the heater setup shown in FIGS. 53 and 54. FIG. 55B shows the thermal resistance circuit and the schematic temperature distribution in each layer. In this demonstration, we fixed the air temperature ($T_{air}$) at about 23° C. and varied the background temperature ($T_{back}$) from 16 to 38° C. During this process, temperature of the skin ($T_{skin}$), fabric ($T_{fabric}$), outer surface of the TED ($T_{TED}$) as well as the $T_{air}$ and $T_{back}$ were recorded in real time and shown in FIG. 55C. A PID control circuit was used regulate the applied current to the TED such that $T_{TED}$ always matched with the $T_{back}$ (FIG. 55C). The camouflage effect was then examined using the IR camera under the various background temperatures, as shown in FIG. 55G. As shown in FIG. 55D, where there was no TED, $T_{skin}$ was 34° C. when the wearer was in the thermally comfortable condition, while the background temperature ($T_{back}$) was 23° C. Therefore, the arm could be easily detected by the IR camera. At the same $T_{back}$, both the areas of the arm covered by the TED armband and the low-e Al film were indistinguishable from the background in the IR image (FIG. 55E), showing the same thermal camouflage effect between the TED and Al layer at this $T_{back}$. However, the low-e Al sheet would not be effective when the $T_{back}$ was lower (e.g., 16° C., FIG. 55F) or higher (e.g., 38° C., FIG. 55G), whereas the TED armband could still effectively adjust its surface temperature to be matched with the $T_{back}$, thus successfully achieving the thermal camouflage effect under this wide temperature range (FIGS. 55F and 55G).

During the thermal camouflage on skin, $T_{skin}$ was maintained at its thermal comfort temperature of 34° C. despite the Peltier cooling or heating of the TED to accommodate the temperature change on the TED surface(FIG. 55C). This temperature stability underneath the TED was mainly realized by the latent heat of the flexible PCL between the TED and the fabric, which absorbed or released the heat to compensate for a temperature due to the TED. The PCL was fabricated by embedding 2 g of phase change particles (MPCM28D, Microtek) in 3 g of Ecoflex. Based on the latent heat of the PCK, it can absorb ~400 J of energy and maintain the skin temperature for more than 20 min. Additionally, the PCL could also be replaced by any heat absorbing layers or heat sinks.

Camouflage Summary

In summary, we developed a wearable and temperature adaptable thermal camouflage strategy based on thermoelectric devices. Our flexible TED showed great temperature-regulation properties with the optimization of the thermal design: minimization of $G_{TED}$ and maximization of lateral heat spreading within cold and hot sides. Compared to the traditional camouflage strategy using low or tunable emissivity, the TED showed the facile active thermal camouflage effect, namely, it is capable of matching the human skin surface temperature with a wide background temperature range of 16-38° C. (~7–+15° C. relative to air temperature of 23° C.), along with a uniform temperature distribution on the TED (temperature variation less than 0.4° C.). In addition, the TED camouflage coupled with a phase change heat absorbing layer had minimal impact on human thermal comfort condition, as demonstrated by negligible skin temperature change. The camouflage effect was not ruined by reflection due to its anti-reflection property (high emissivity) while the camouflage with the emissivity manipulated film (low emissivity) was easily interrupted by surroundings.

Fabrication of Flexible Thermoelectric Device (TED)

Fabrication of IR Camouflage Setup

An aluminum tape was used as the low-e film. The temperature controller to simulate $T_{BG}$ change was composed of an aluminum plate covered by a polymer tape, a flexible thermoelectric device attached to the bottom of the aluminum plate, and a heat sink underneath the thermoelectric device. The heater setup was suspended on the temperature controller by narrow plastic tips to minimize the conduction heat loss to the substrate. A thin film heat flux sensor (PHFS-01, FluxTeq) was used to monitor the heat flux from the heater to ensure a controlled amount of heat generation. The thermocouples to measure $T_{TED}$ and $T_{low-e}$ were embedded inside the top polymer layer of the TED and underneath the low-e film, to avoid the interruption of the camouflage effect. Additional thermocouples were placed on the background plate to measure $T_{BG}$ and also in the ambient air near the setup to measure $T_{air}$.

Camouflage Test on Human Skin

In the case of human test, $T_{fabric}$ underneath the TED and $T_{skin}$ on to the skin were also measured by thermocouples. The test was performed above the temperature controller; the wearer's did not touch the temperature controller. The wearer sat with minimal movement during the measurement. The phase change particles has the phase change temperature of ~28° C.

Additional description of FIGS. 52-55 is detailed below.

FIG. 52. The concept of Peltier effect camouflage by flexible TEDs and the design of the TED. FIG. 52A, An example of thermal camouflage cloth made of flexible TEDs. While a human body with the regular cloth can be detected by IR camera due to the metabolic heat from human skin, the flexible TED cloth can block the metabolic heat and hide the human body from the IR camera by Peltier cooling or heating. FIG. 52B, Photograph of the flexible TED. FIG. 52C, The TED design. High performance (ZT=0.7) and large height (5 mm) to area (1×1 mm$^2$) ratio TE pillars and the airgap between them (4 mm in height) improves the cooling and heating effects. Ecoflex and AlN particles mixture heat spreading layers enable the TED flexible.

FIG. 53. Active thermal camouflage with the flexible TED. FIG. 53A, Photographs of the TED (top) and low-e film (bottom) on the measurement setup. FIG. 53B, IR images of the TED and low-e film with the same background ($T_{back}$) and ambient temperature ($T_{air}$) of 20° C. Both devices showed the camouflage effect. FIG. 53C-D, IR images of the TED and low-e film at $T_{back}$=14° C. (FIG. 53C) and 34° C. (FIG. 53D). The TED displayed the camouflage effect while the low-e film did not. FIG. 53E, Schematic of the measurement setup with the TED. A heater applied a power density of 58 Wm$^{-2}$ to the TED to simulate metabolic heat, and a temperature controller with high emissivity coating changes $T_{back}$. The TED matched its surface temperature ($T_{TED}$) with $T_{back}$ by Peltier cooling or heating. FIG. 53F, Schematic of the measurement setup with the low-e film. While the surface temperature of the low-e film ($T_{low-e}$) was 31° C., the IR camera detected the ambient temperature ($T_{air}$) instead of $T_{low-e}$ due to its high reflectance. FIG. 53G, Temperature changes and the thermal camouflage effect during the measurement. $T_{TED}$ matched well with $T_{back}$ within the background temperature of 14-34° C.

FIG. 54. Anti-reflection property of the TED. FIG. 54A-B, Schematics of IR reflection of hot or cold spots in nature that possibly ruins thermal camouflage effect. FIG. 54C, IR image of the TED with high-emissivity polymer for anti-reflection. When a hand was placed above the TED to verify the reflection, the temperature reading of IR camera did not change. FIG. 54D, IR image of the low-e film. Obvious IR reflection of the hand was observed.

FIG. 55. Thermal camouflage on human skin. FIG. 55A, Photograph of the TED armband and low-e film on a wrist. FIG. 55B, Schematic of the armband. A regular fabric wrapped around the wrist and the TED was attached on the armband with a mesh fabric. A phase change layer (PCL) absorbed or emitted heat to maintain the skin temperature ($T_{skin}$). FIG. 55C, Temperature changes during the measurement. $T_{TED}$ and $T_{back}$ matched well in $T_{back}$ range of 16-38° C. (−7° C. and +15° C. compared to $T_{air}$) while PCL prevented $T_{skin}$ change. FIG. D, IR image of the wrist of a wearer. e-g, IR images of the TED on human skin at $T_{back}$=23, 16, and 38° C. respectively. Thermal camouflage effect was maintained in all the range of $T_{back}$.

FIG. 56 depicts a process 5600 used for thermoregulating biological skin, in accordance with some example embodiments. For example, the process of FIG. 56 may be used to heat or cool human skin. At 5610, the process includes placing a flexible top sheet in thermal contact with top surfaces of thermoelectric pillars. The flexible top sheet is exposed to a natural environment. For example, the flexible top sheet may be exposed to air surrounding a subject's arm or leg. At 5620, the process includes placing a flexible bottom sheet in thermal contact with bottom surfaces of the thermoelectric pillars, wherein the flexible bottom sheet is in contact with the biological skin. For example, the bottom sheet may be in thermal contact with the subject's arm or leg. The process may be used to heat or cool the subject's skin and dissipates or absorbs heat from the environment. For example, the process may be used to heat or cool the subject's arm or leg while dissipating heat or absorbing heat from the air in the natural environment. Each of the thermoelectric pillars exhibits a thermoelectric property. Flexible electrodes electrically interconnect adjacent thermoelectric pillars.

FIG. 57 depicts a process 5700 for producing a flexible thermoelectric material, in accordance with some example embodiments. At 5710, the process includes attaching an array of regularly spaced thermoelectric pillars to a substrate. The thermoelectric pillars are arranged as alternating N-type semiconductor and P-type semiconductor. At 5720, the process incudes arranging flexible electrodes on another substrate, wherein each electrode includes solder. At 5730, the process includes heating the other substrate to cause the solder to melt on each electrode to provide permanent electrical connections between pairs of adjacent thermoelectric pillars. At 5740, the process includes depositing an adhesion layer onto the flexible electrodes after attachment to the thermoelectric pillars and cooling of the substrate. At 5750, the process includes attaching a flexible sheet to the flexible electrodes with attached thermoelectric pillars via the deposited adhesion layer.

Some embodiments may preferably implement one or more of the following solutions, listed in clause-format. The following clauses are supported and further described in the examples above and throughout this document.

Clause 1. A flexible thermoelectric material comprising: thermoelectric pillars each exhibiting a thermoelectric property; flexible electrodes electrically interconnecting adjacent ones of the thermoelectric pillars; a flexible top sheet in thermal contact with top surfaces of the thermoelectric pillars; and a flexible bottom sheet in thermal contact with bottom surfaces of the thermoelectric pillars.

Clause 2. The flexible thermoelectric material of clause 1, wherein the thermoelectric pillars comprise alternating N-type semiconductor devices and P-type semiconductor devices.

Clause 3. The flexible thermoelectric material of clause 1, wherein a height of the thermoelectric pillars and an areal density of the thermoelectric pillars is selected to produce a thermal conductance with a value within 20% of a thermal conductance for air.

Clause 4. The flexible thermoelectric material of clause 1, wherein the flexible thermoelectric material is structured to dissipate heat via natural convection.

Clause 5. The flexible thermoelectric material of clause 1, wherein the flexible thermoelectric material is configured to supply heat to an area of skin.

Clause 6. The flexible thermoelectric material of clause 1, wherein the flexible thermoelectric material is configured to cool an area of skin.

Clause 7. The flexible thermoelectric material of clause 1, wherein the flexible thermoelectric material is configured to generate electrical power from body heat at skin.

Clause 8. The flexible thermoelectric material of clause 1, wherein the flexible thermoelectric material is incorporated into cloth or clothing including a shirt, a hat, a vest, a jacket, gloves, shoes, and/or insoles.

Clause 9. The flexible thermoelectric material of clause 1, wherein the thermoelectric pillars have an aspect ratio with a high value, wherein the aspect ratio is a ratio of a height of each pillar to a width of each pillar.

Clause 10. A method of thermoregulating biological skin, the method comprising: structuring a flexible top sheet to be in thermal contact with top surfaces of thermoelectric pillars, wherein each of the thermoelectric pillars exhibits a thermoelectric property, and wherein the flexible top sheet is exposed to a natural environment; and structuring a flexible bottom sheet to be in thermal contact with bottom surfaces of the thermoelectric pillars, wherein flexible electrodes electrically interconnect adjacent thermoelectric pillars, and wherein the flexible bottom sheet is in contact with the biological skin.

Clause 11. The method of thermoregulating biological skin of clause 10, wherein the thermoelectric pillars comprise alternating N-type semiconductor devices and P-type semiconductor devices.

Clause 12. The method of thermoregulating biological skin of clause 10, wherein the method causes heat dissipation via natural convection.

Clause 13. The method of thermoregulating biological skin of clause 10, wherein method causes heating of the biological skin.

Clause 14. The method of thermoregulating biological skin of clause 10, wherein method causes cooling of the biological skin.

Clause 15. The method of thermoregulating biological skin of clause 10, wherein the method is performed by clothing including a shirt, a hat, a vest, a jacket, gloves, shoes, and/or insoles.

Clause 16. A process for producing a flexible thermoelectric material, the process comprising: attaching an array of thermoelectric pillars to a substrate, wherein the thermoelectric pillars are arranged as alternating N-type semiconductor and P-type semiconductor; arranging flexible electrodes on another substrate, wherein each electrode includes solder; heating the other substrate to cause the solder to melt on each electrode to provide permanent electrical connections between pairs of adjacent thermoelectric pillars; depositing an adhesion layer onto the flexible electrodes after attachment to the thermoelectric pillars and cooling of the substrate; and attaching a flexible sheet to the flexible electrodes with attached thermoelectric pillars via the deposited adhesion layer.

Clause 17. The process for producing a flexible thermoelectric material of clause 16, wherein a height of the thermoelectric pillars and an areal density of the thermoelectric pillars is selected to produce a target thermal conductance Clause 18. The process for producing a flexible thermoelectric material of clause 16, wherein the flexible thermoelectric material dissipates heat via natural convection.

Clause 19. The process for producing a flexible thermoelectric material of clause 16, wherein the thermoelectric pillars have an aspect ratio with a high value, wherein the aspect ratio is a ratio of a height of each pillar to a width of each pillar.

Clause 20. A thermoelectric device, comprising: a first flexible layer to face the air; a second flexible layer to contact a body part of a person; thermoelectric pillars formed between the first and second flexible layers, each thermoelectric pillar configured to exhibit a thermoelectric property and has an aspect ratio greater than one with a length along each pillar to be greater than a dimension cross each pillar to produce an effective thermal conductance that is close to or matches a thermal conductance of the air; flexible electrodes electrically interconnecting adjacent thermoelectric pillars.

Clause 21. The thermoelectric device of clause 20, wherein the thermoelectric pillars comprise alternating N-type semiconductor devices and P-type semiconductor devices.

Clause 22. The thermoelectric device of clause 20, wherein a height of the thermoelectric pillars and an areal density of the thermoelectric pillars is selected to produce a thermal conductance that is close to a thermal conductance of air.

Clause 23. The thermoelectric device of clause 20, wherein the first flexible layer is structured to dissipate heat via natural convection.

Clause 24. A thermal camouflage device, comprising: a first fabric layer with a first side exposed to air and a second side; a thermoelectric layer with a third side in contact with the second side of the first fabric layer and a fourth side; a phase change layer with a fifth side in contact with the fourth side and a sixth side; and a second fabric layer with a seventh side in contact with the sixth side and an eighth side in contact with an object to thermally camouflage.

Clause 25. The thermal camouflage device of clause 24, wherein the object is human skin.

Clause 26. The thermal camouflage device of clause 24, wherein the phase change material comprises a mixture of phase change particles and a silicone rubber.

Clause 27. The thermal camouflage device of clause 26, wherein the silicone rubber is EcoFlex.

Clause 28. The thermal camouflage device of clause 24, wherein the thermoelectric layer comprises: thermoelectric pillars each exhibiting a thermoelectric property; flexible electrodes electrically interconnecting adjacent thermoelectric pillars; a flexible top sheet in thermal contact with top surfaces of the thermoelectric pillars; and a flexible bottom sheet in thermal contact with bottom surfaces of the thermoelectric pillars.

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Terms that are used to describe the disclosure are discussed below, or elsewhere in the specification, to provide additional guidance to the practitioner regarding the description of the disclosure. For convenience, some terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. One will recognize that "memory" is one form of a "storage" and that the terms may on occasion be used interchangeably.

Consequently, alternative language and synonyms may be used for any one or more of the terms discussed herein, nor is any special significance to be placed upon whether or not a term is elaborated or discussed herein. Synonyms for some terms are provided. A recital of one or more synonyms does not exclude the use of other synonyms. The use of examples anywhere in this specification including examples of any term discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

While this patent document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A flexible thermoelectric material comprising:
thermoelectric segments each exhibiting a thermoelectric property;
a first flexible sheet having a normal direction; and
a second flexible sheet spaced apart from the first flexible sheet along the normal direction, wherein:
the thermoelectric segments form first pillar stacks and second pillar stacks to provide a thermal communication path between the first flexible sheet and the second flexible sheet,
each of the first pillar stacks comprising multiple first thermoelectric segments that are spaced from each other along the normal direction and electrically connected in series via first electrodes oriented in the normal direction and located on sidewalls of the first pillar stack, wherein both ends of at least one of the first thermoelectric segments are in contact with respective first electrodes, and
each of the second pillar stacks comprising multiple second thermoelectric segments that are spaced from each other along the normal direction and electrically connected in series via second electrodes oriented in the normal direction and located on sidewalls of the second pillar stack, wherein both ends of at least one of the second thermoelectric segments are in contact with respective second electrodes.

2. The flexible thermoelectric material of claim 1, wherein a height of the thermoelectric segments and a density of the thermoelectric segments is selected to produce a thermal conductance of the flexible thermoelectric material with a value within 20% of a thermal conductance for air.

3. The flexible thermoelectric material of claim 1, wherein the flexible thermoelectric material is structured to dissipate heat via natural convection.

4. The flexible thermoelectric material of claim 1, wherein the flexible thermoelectric material is configured to supply heat to an area of skin or cool the area of the skin.

5. The flexible thermoelectric material of claim 1, wherein the flexible thermoelectric material is configured to generate electrical power from body heat at skin.

6. The flexible thermoelectric material of claim 1, wherein the flexible thermoelectric material is incorporated into one or more of a cloth or an item of clothing, wherein the clothing comprises: a shirt, a hat, a vest, a jacket, gloves, shoes, or insoles.

7. A method comprising:
structuring a flexible top sheet, wherein the flexible top sheet is configured to be exposed to an environment;
structuring a flexible bottom sheet, wherein the flexible bottom sheet is configured to be in contact with biological skin; and
forming first pillar stacks and second pillar stacks to provide a thermal communication path between the flexible top sheet and the flexible bottom sheet, wherein:
the flexible top sheet has a normal direction,
the flexible bottom sheet is spaced apart from the flexible top sheet along the normal direction,
each of the first pillar stacks comprises multiple first thermoelectric segments that are spaced from each other along the normal direction and electrically connected in series via first electrodes oriented in the normal direction and located on sidewalls of the first pillar stack, wherein both ends of at least one of the first thermoelectric segments are in contact with respective first electrodes, and
each of the second pillar stacks comprises multiple thermoelectric segments that are spaced from each other along the normal direction and electrically connected in series via second electrodes oriented in the normal direction and located on sidewalls of the second pillar stack, wherein both ends of at least one of the second thermoelectric segments are in contact with respective second electrodes, and
adjacent alternating first pillar stacks and second pillar stacks are electrically interconnected.

8. The method of claim 7, wherein the method causes heat dissipation via natural convection.

9. The method of claim 7, wherein the method causes heating of the biological skin or cooling of the biological skin.

10. The method of claim 7, further comprising:
incorporating the flexible top sheet, the flexible bottom sheet, the first thermoelectric segments, and the second thermoelectric segments into clothing, wherein the clothing includes a shirt, a hat, a vest, a jacket, gloves, shoes, and/or insoles.

11. A thermoelectric device, comprising:
a first flexible layer to face air;
a second flexible layer to contact a body part of a person;
multiple first thermoelectric segments and multiple second
thermoelectric segments formed between the first and second flexible layers, each of the multiple first thermoelectric segments and multiple second thermoelectric segments are configured to exhibit a thermoelectric property and having an effective thermal conductance that is close to or matches a thermal conductance of the air; and
wherein:
the first flexible layer has a normal direction,
the second flexible layer is spaced apart from the first flexible layer along the normal direction,
the thermoelectric segments form first pillar stacks and second pillar stacks to provide a thermal communication path between the first flexible layer and the second flexible layer,
each of the first pillar stacks comprising the multiple first thermoelectric segments that are spaced from each other along the normal direction and electrically connected in series via first electrodes oriented in the normal direction and located on sidewalls of the first pillar stack, wherein both ends of at least one of the multiple first thermoelectric segments are in contact with respective first electrodes, and
each of the second pillar stacks comprising the multiple second thermoelectric segments that are spaced from each other along the normal direction and electrically connected in series via second electrodes oriented in the normal direction and located on sidewalls of the second pillar stack, wherein both ends of at least one of the multiple second thermoelectric segments are in contact with respective second electrodes.

12. The thermoelectric device of claim 11, wherein a height of the multiple first thermoelectric segments and the multiple second thermoelectric segments and an areal density of the multiple first thermoelectric segments and the multiple second thermoelectric segments is selected to produce the effective thermal conductance that is close to the thermal conductance of the air.

13. A thermal camouflage device, comprising:
a first fabric layer with a first side exposed to air and a second side;
a thermoelectric layer with a third side in contact with the second side of the first fabric layer and a fourth side;
a phase change layer with a fifth side in contact with the fourth side and a sixth side; and
a second fabric layer with a seventh side in contact with the sixth side and an eighth side in contact with an object to thermally camouflage,
the thermoelectric layer comprising:
thermoelectric segments each exhibiting a thermoelectric property;
a flexible top sheet having a normal direction; and
a flexible bottom sheet spaced apart from the first flexible sheet along the normal direction, wherein:
the thermoelectric segments form first pillar stacks and second pillar stacks to provide a thermal communication path between the flexible top sheet and the flexible bottom sheet,
each of the first pillar stacks comprising multiple first thermoelectric segments that are spaced from each other along the normal direction and electrically connected in series via first electrodes oriented in the normal direction and located on sidewalls of the first pillar stack, wherein both ends of at least one of the first thermoelectric segments are in contact with respective first electrodes, and
each of the second pillar stacks comprising multiple second thermoelectric segments that are spaced from each other along the normal direction and electrically connected in series via second electrodes oriented in the normal direction and located on sidewalls of the second pillar stack, wherein both ends of at least one of the second thermoelectric segments are in contact with respective second electrodes.

14. The thermal camouflage device of claim 13, wherein the object is human skin.

15. The thermal camouflage device of claim 13, wherein the phase change layer comprises a mixture of phase change particles and a silicone rubber.

16. The flexible thermoelectric material of claim 1, wherein spaces between the thermoelectric segments are filled with air or a porous material.

17. The flexible thermoelectric material of claim 1, wherein:
the thermoelectric segments in each of the first pillar stacks are substantially parallel to each other, and
the thermoelectric segments in each of the second pillar stacks are substantially parallel to each other.

18. The flexible thermoelectric material of claim 1, wherein the first flexible sheet or the second flexible sheet comprises a dielectric material.

19. The flexible thermoelectric material of claim 1, wherein the first flexible sheet or the second flexible sheet is configured to reflect sunlight and/or emit infrared.

20. A clothing, comprising a thermoelectric device of claim 11.

21. The clothing of claim 20, comprising a shirt, a hat, a vest, a jacket, gloves, shoes, or insoles.

22. The flexible thermoelectric material of claim 1, wherein at least one of the sidewalls of the first pillar stacks is substantially perpendicular to the first flexible sheet or the second flexible sheet.

* * * * *